United States Patent
Lee et al.

(10) Patent No.: US 11,296,101 B2
(45) Date of Patent: Apr. 5, 2022

(54) THREE-DIMENSIONAL MEMORY DEVICE INCLUDING AN INTER-TIER ETCH STOP LAYER AND METHOD OF MAKING THE SAME

(71) Applicant: SANDISK TECHNOLOGIES LLC, Addison, TX (US)

(72) Inventors: Yao-Sheng Lee, Tampa, FL (US); Senaka Kanakamedala, San Jose, CA (US); Raghuveer S. Makala, Campbell, CA (US); Johann Alsmeier, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/833,378

(22) Filed: Mar. 27, 2020

(65) Prior Publication Data

US 2021/0305266 A1 Sep. 30, 2021

(51) Int. Cl.
*H01L 27/11556* (2017.01)
*H01L 27/11582* (2017.01)
(Continued)

(52) U.S. Cl.
CPC ........ *H01L 27/11556* (2013.01); *G11C 5/025* (2013.01); *H01L 21/76802* (2013.01); *H01L 21/76877* (2013.01); *H01L 27/11582* (2013.01)

(58) Field of Classification Search
None
See application file for complete search history.

(56) References Cited

U.S. PATENT DOCUMENTS 8,614,126 B1   12/2013   Lee et al.
8,828,884 B2   9/2014    Lee et al.
(Continued)

FOREIGN PATENT DOCUMENTS

CN   109496355 A   3/2019

OTHER PUBLICATIONS

Notification of Transmittal of the International Search Report and Written Opinion of the International Search Authority for International Patent Application No. PCT/US2020/038889, dated Dec. 24, 2020, 10 pages.

(Continued)

*Primary Examiner* — Hsien Ming Lee
(74) *Attorney, Agent, or Firm* — The Marbury Law Group PLLC

(57) ABSTRACT

A three-dimensional memory device includes a first-tier alternating stack of first insulating layers and first electrically conductive layers located over a substrate, an etch stop material layer located over the first-tier alternating stack, a second-tier alternating stack of second insulating layers and second electrically conductive layers located over the etch stop material layer, inter-tier memory openings vertically extending through the second-tier alternating stack, the etch stop material layer, and the first-tier alternating stack, and memory opening fill structures each including a memory film and a vertical semiconductor channel located in the inter-tier memory openings. The material of the etch stop material layer is different from materials of the first insulating layers, the second insulating layers, the first electrically conductive layers, and the second electrically conductive layers.

21 Claims, 55 Drawing Sheets

(51) Int. Cl.
*H01L 21/768* (2006.01)
*G11C 5/02* (2006.01)

(56) References Cited

U.S. PATENT DOCUMENTS

| | | | |
|---|---|---|---|
| 8,884,357 | B2 | 11/2014 | Wang et al. |
| 8,946,023 | B2 | 2/2015 | Makala et al. |
| 9,023,719 | B2 | 5/2015 | Pachamuthu et al. |
| 9,159,426 | B1 | 10/2015 | D'Abreu |
| 9,230,979 | B1 | 1/2016 | Pachamuthu et al. |
| 9,437,606 | B2 | 9/2016 | Makala et al. |
| 9,449,982 | B2 | 9/2016 | Lu et al. |
| 9,460,931 | B2 | 10/2016 | Pachamuthu et al. |
| 9,515,080 | B2 | 12/2016 | Takahashi et al. |
| 9,524,976 | B2 | 12/2016 | Pachamuthu et al. |
| 9,530,788 | B2 | 12/2016 | Oginoe et al. |
| 9,548,313 | B2 | 1/2017 | Yada et al. |
| 9,728,547 | B1 | 8/2017 | Ohsaki et al. |
| 9,754,956 | B2 | 9/2017 | Tsutsumi et al. |
| 9,768,192 | B1 | 9/2017 | Nakamura |
| 9,780,034 | B1 | 10/2017 | Tsutsumi et al. |
| 10,115,681 | B1 * | 10/2018 | Ariyoshi ........... H01L 27/11524 |
| 10,242,944 | B2 | 3/2019 | Inomata et al. |
| 10,290,650 | B1 | 5/2019 | Iwai |
| 10,355,012 | B2 | 7/2019 | Shimabukuro et al. |
| 2014/0264542 | A1 | 9/2014 | Simsek-Ege et al. |
| 2015/0155296 | A1 | 6/2015 | Yoon |
| 2015/0287734 | A1 | 10/2015 | Simsek-Ege et al. |
| 2016/0086973 | A1 | 3/2016 | Sasaki |
| 2016/0133640 | A1 | 5/2016 | Zhu et al. |
| 2016/0351580 | A1 | 12/2016 | Hopkins et al. |
| 2017/0122292 | A1 | 5/2017 | Michel |
| 2017/0140941 | A1 | 5/2017 | Zhu et al. |
| 2017/0200801 | A1 | 7/2017 | Hopkins et al. |
| 2018/0108669 | A1 | 4/2018 | Zhu et al. |
| 2018/0122904 | A1 | 5/2018 | Matsumoto et al. |
| 2018/0122905 | A1 | 5/2018 | Ogawa et al. |
| 2018/0261671 | A1 | 9/2018 | Matsumoto et al. |
| 2018/0315766 | A1 | 11/2018 | Zhu et al. |
| 2019/0214399 | A1 | 7/2019 | Simsek-Ege et al. |
| 2019/0280001 | A1 * | 9/2019 | Terasawa .......... H01L 27/11556 |
| 2019/0319039 | A1 | 10/2019 | Kim et al. |
| 2019/0326313 | A1 | 10/2019 | Cui et al. |

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
U.S. Appl. No. 16/503,884, filed Jul. 5, 2019, SanDisk Technologies LLC.
U.S. Appl. No. 16/224,367, filed Dec. 18, 2018, SanDisk Technologies LLC.

* cited by examiner

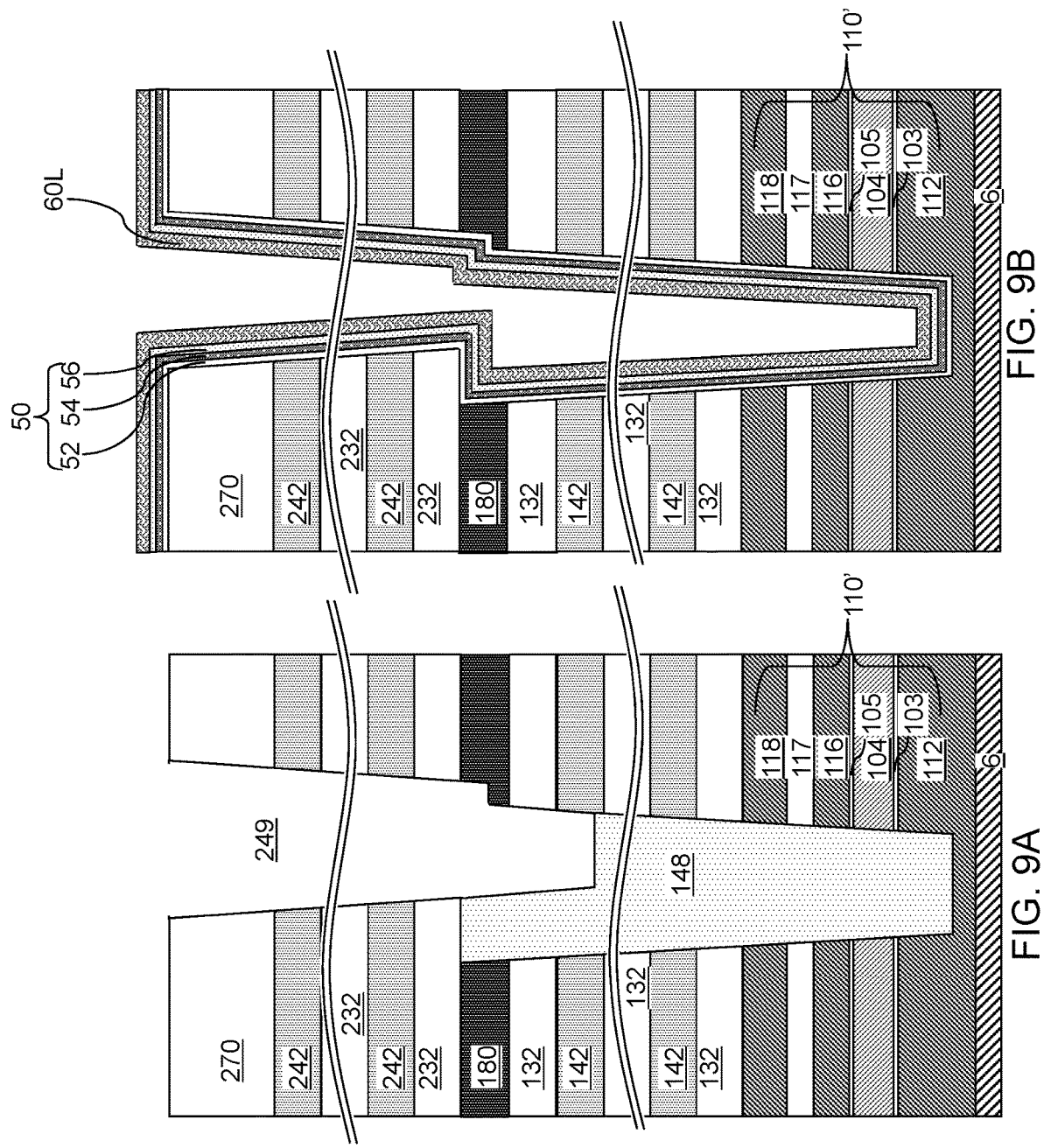

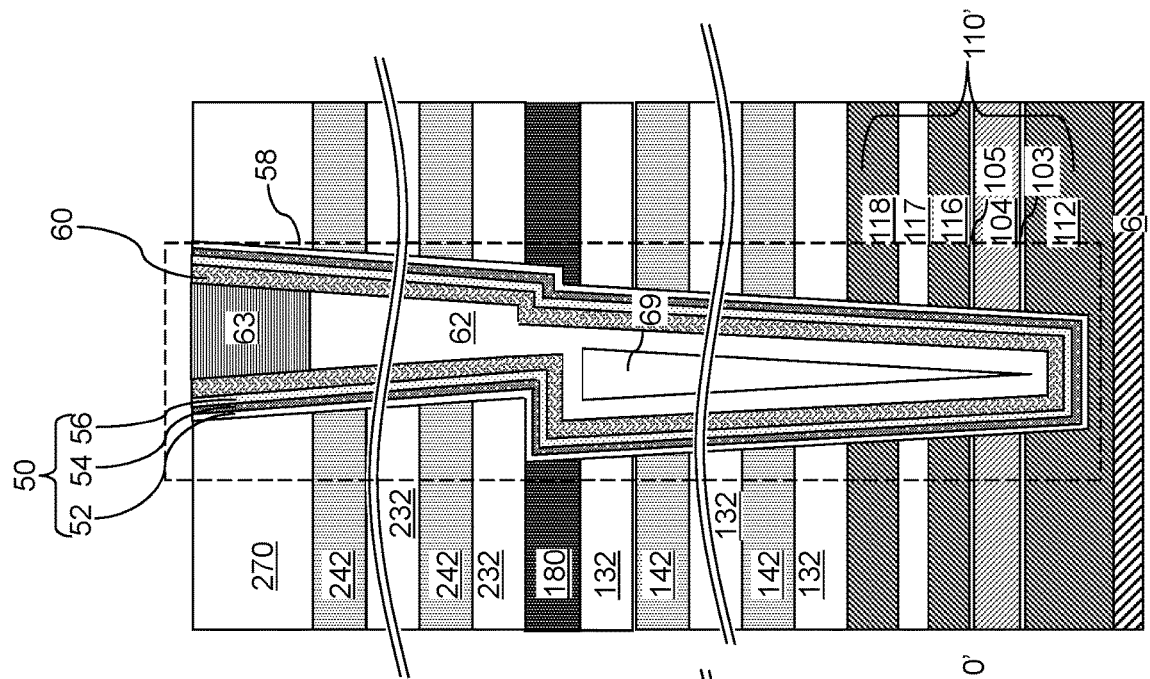
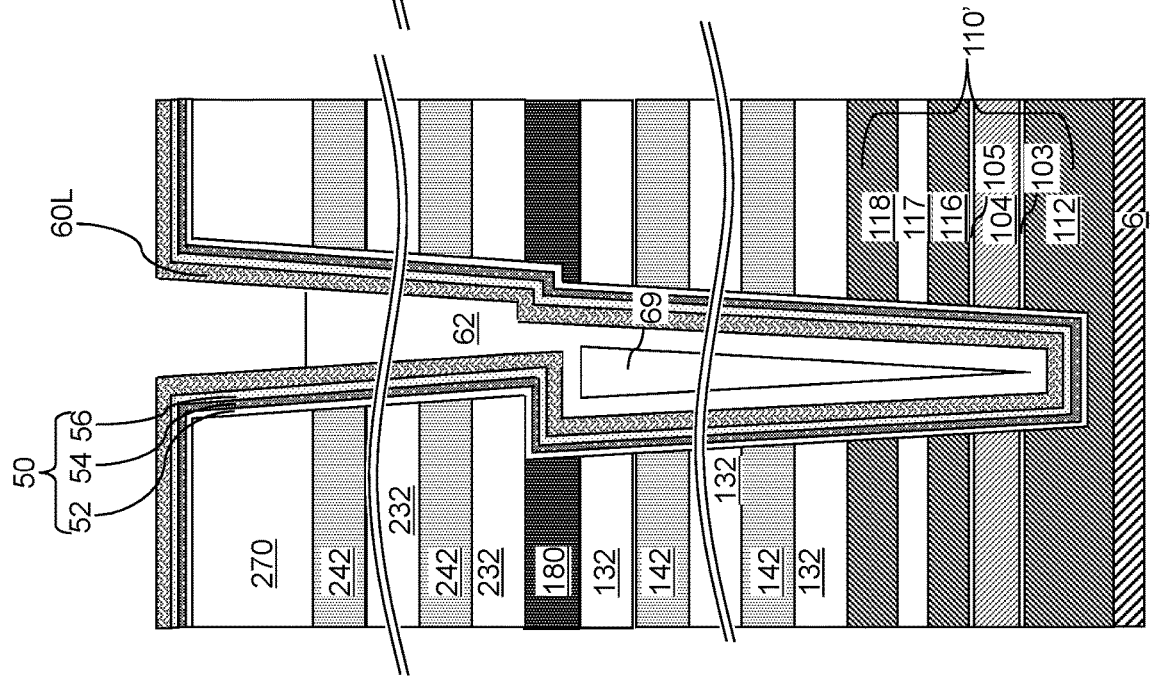

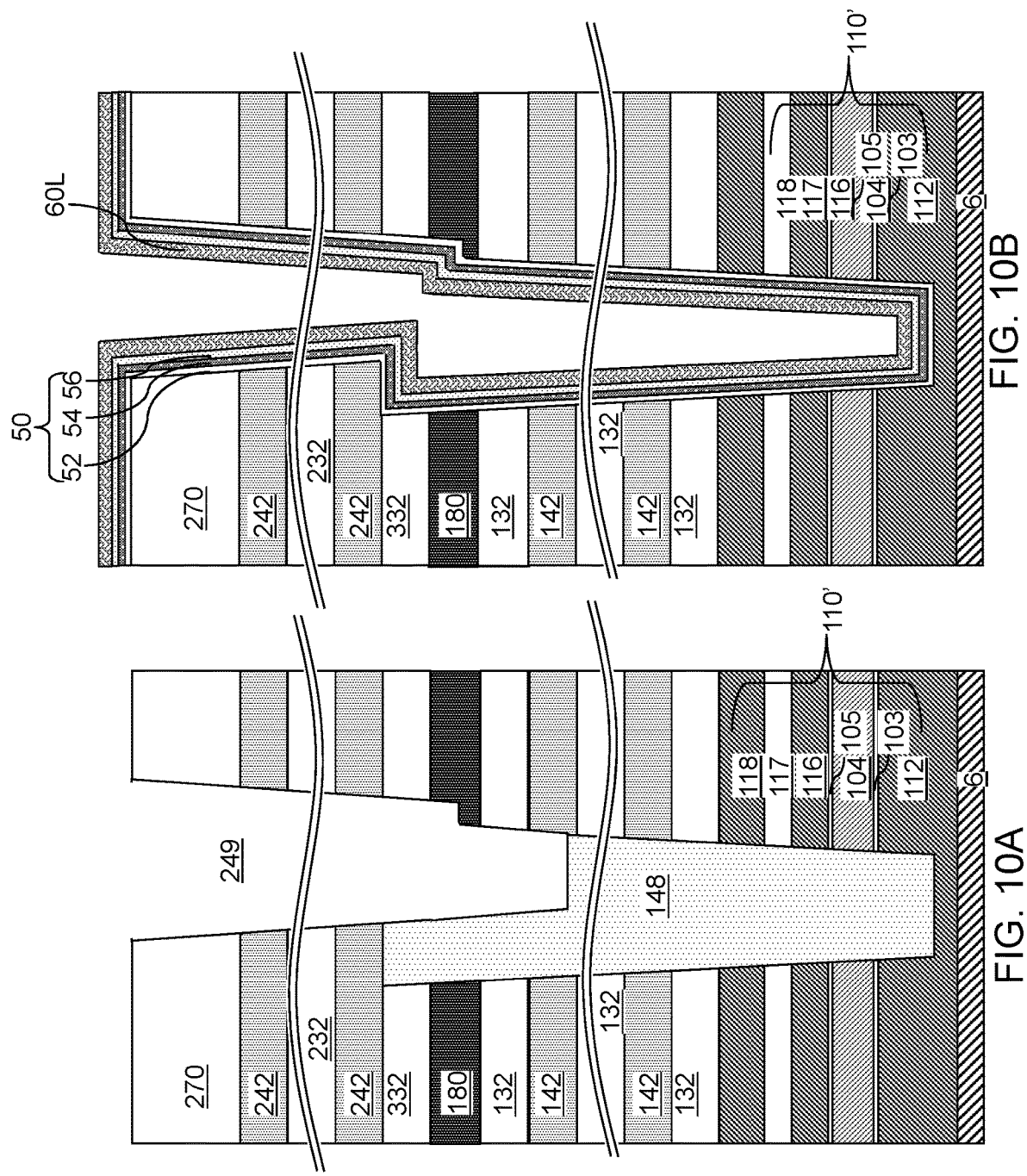

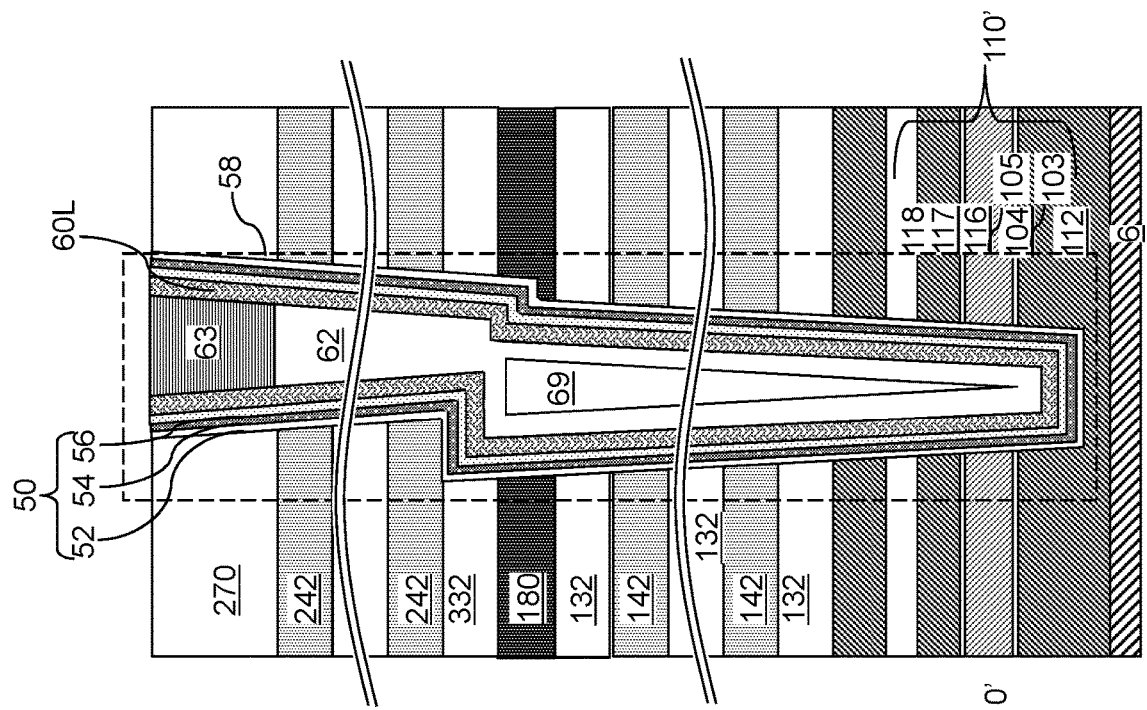
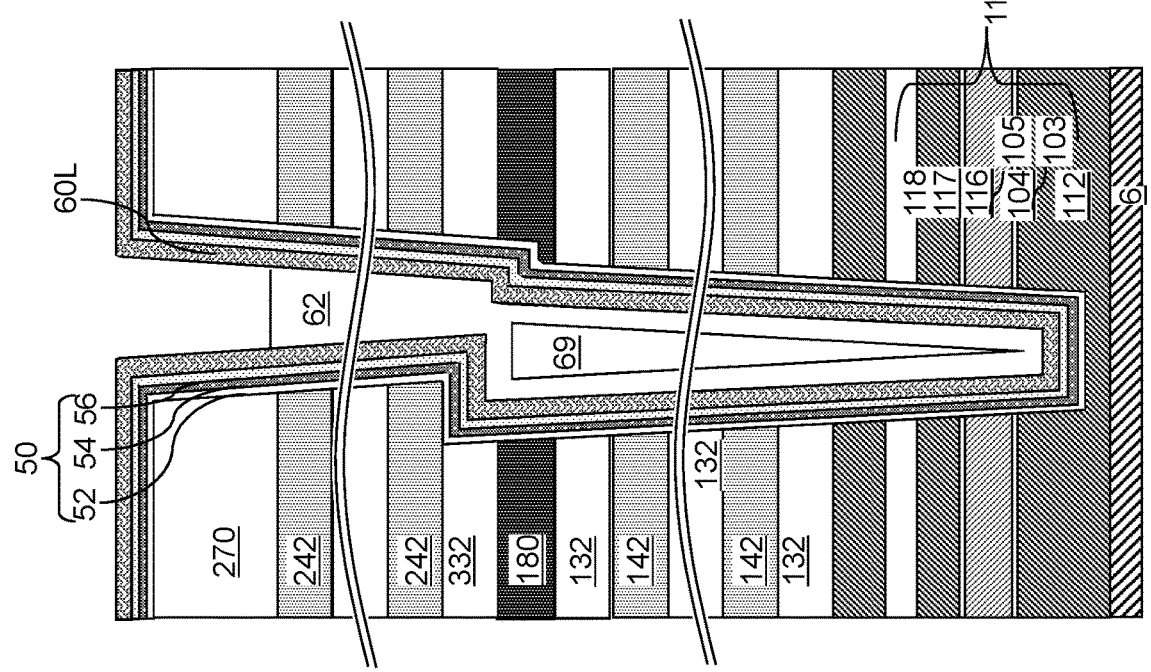

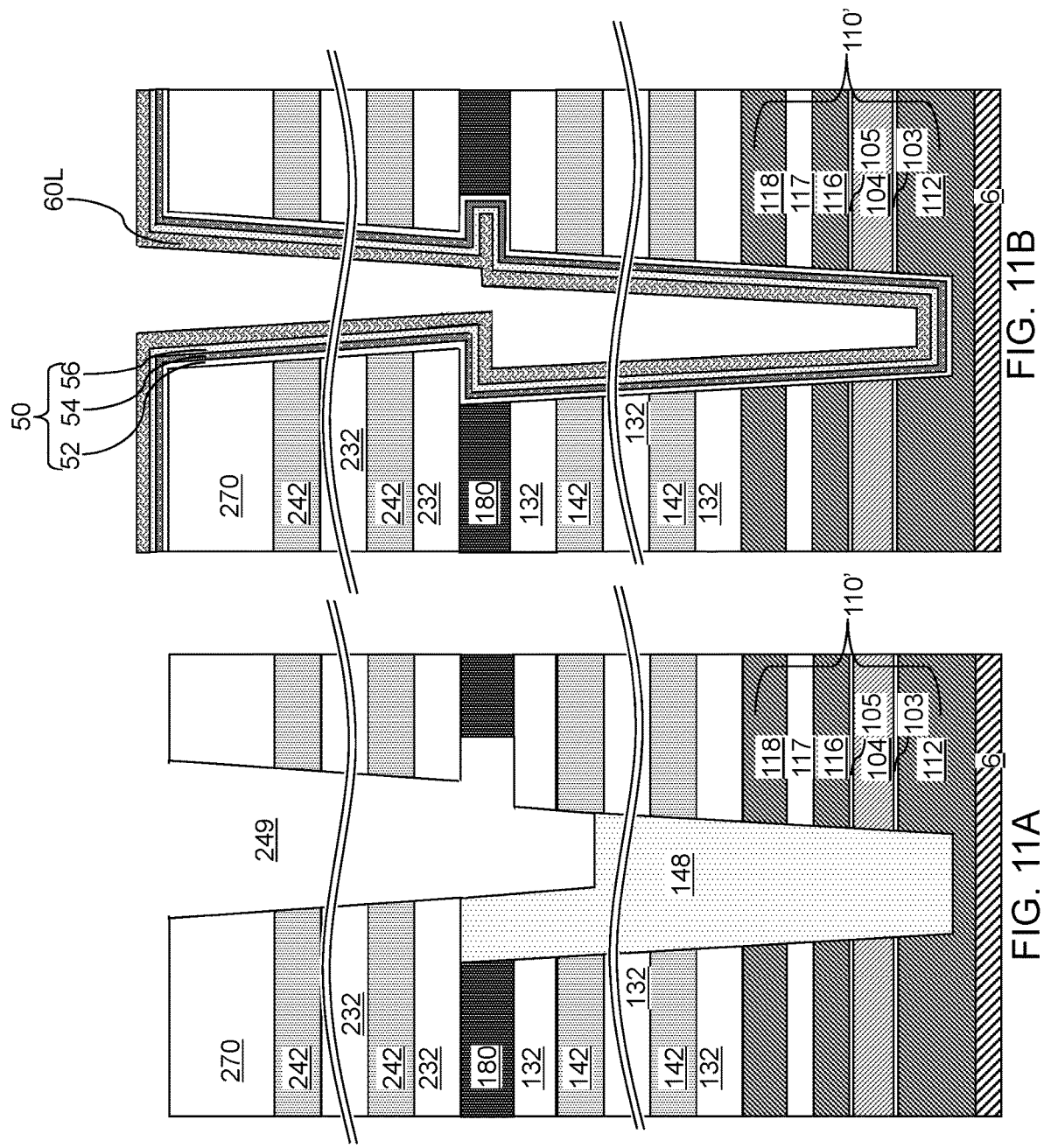

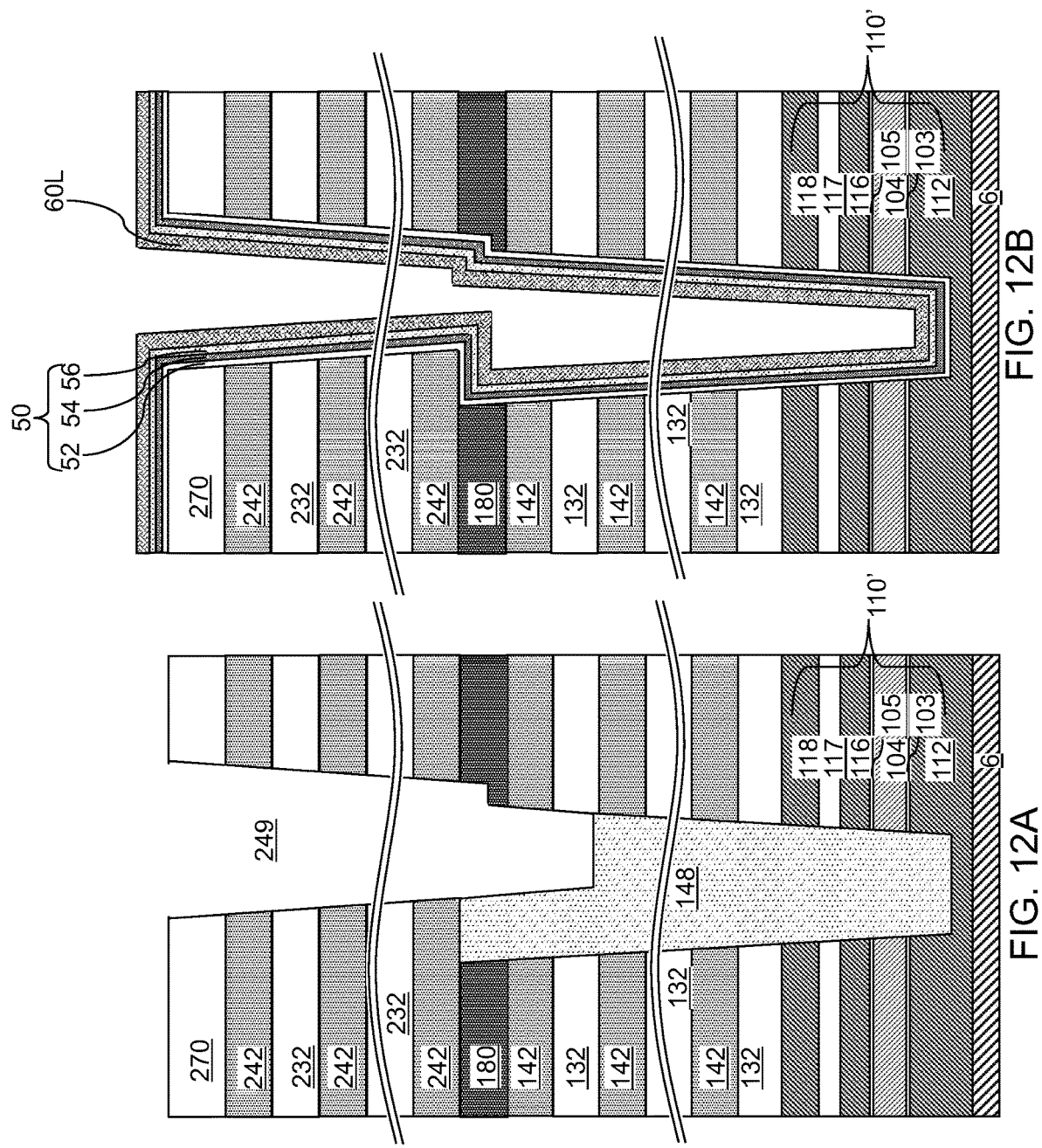

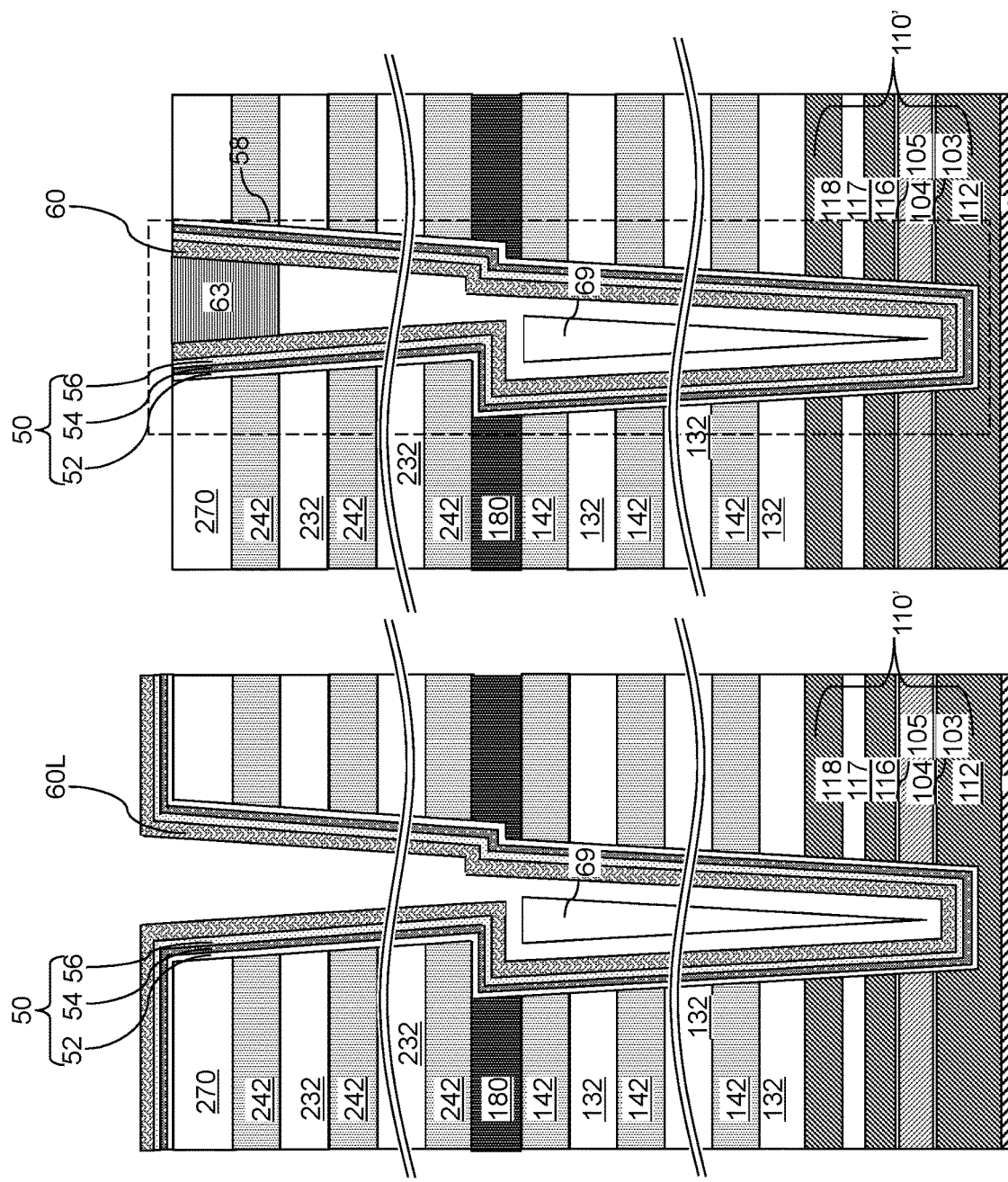

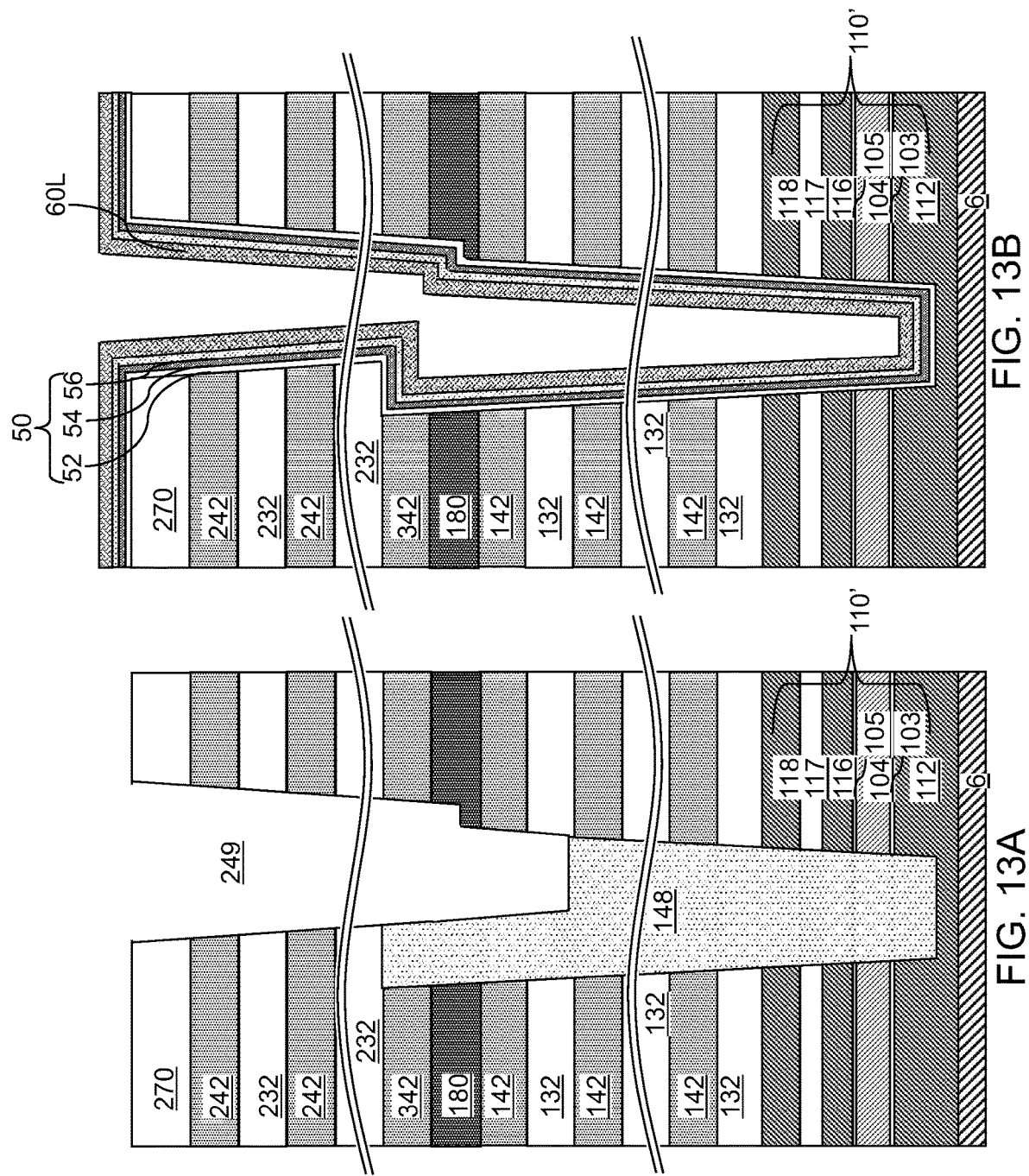

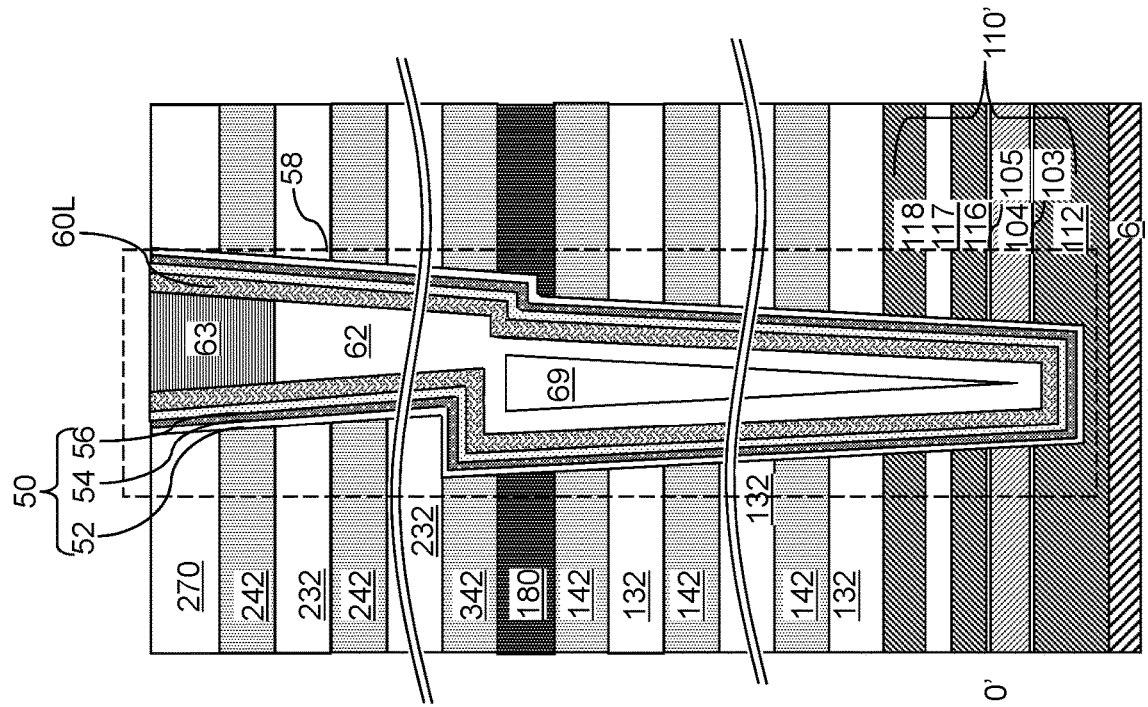
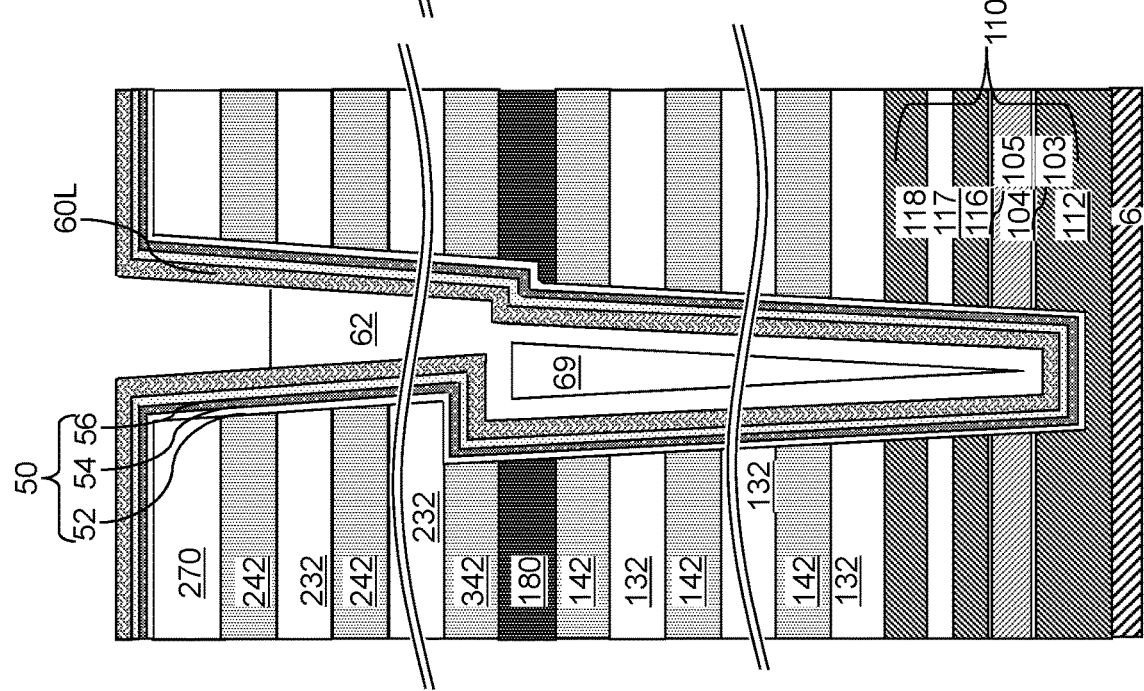

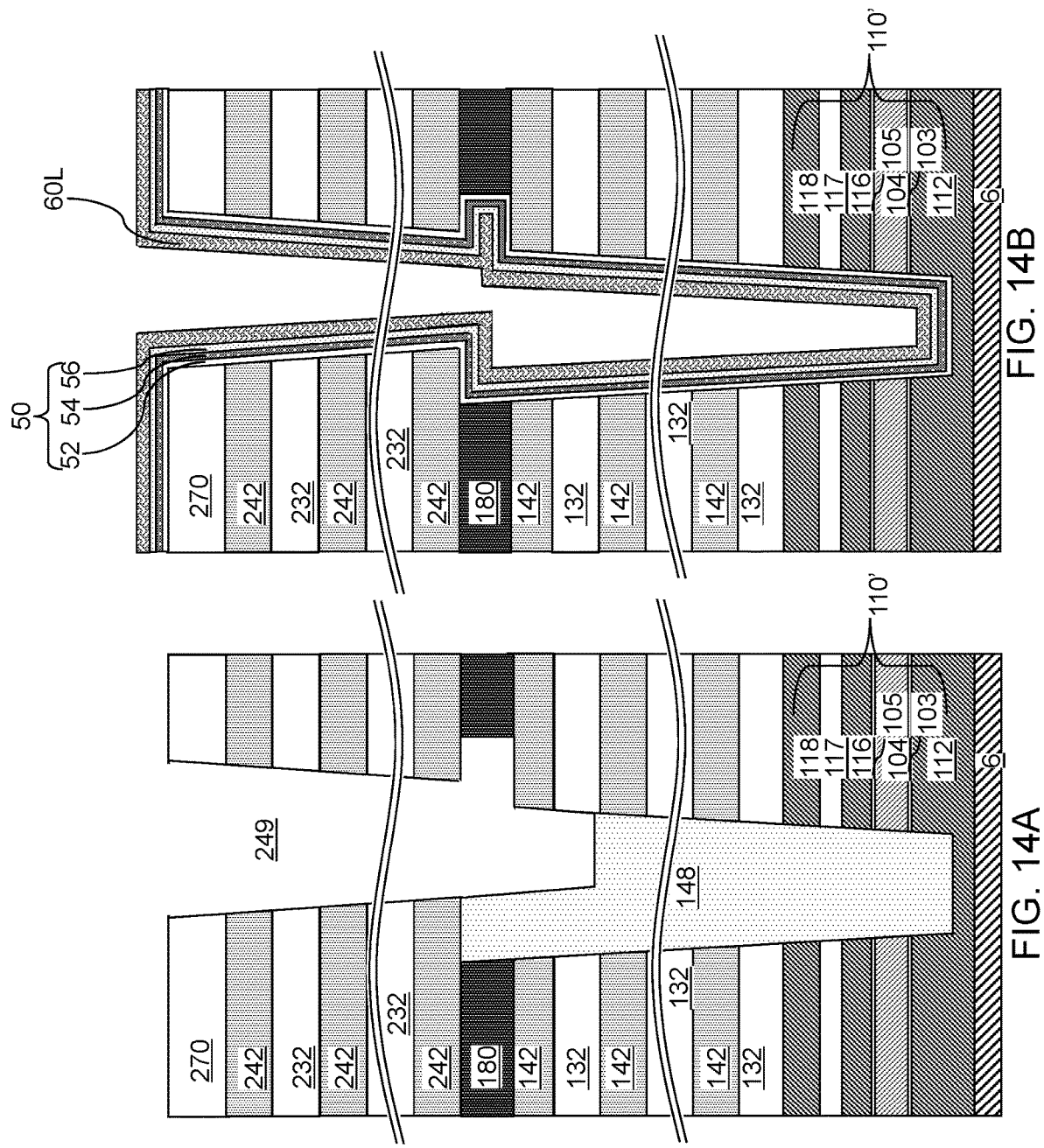

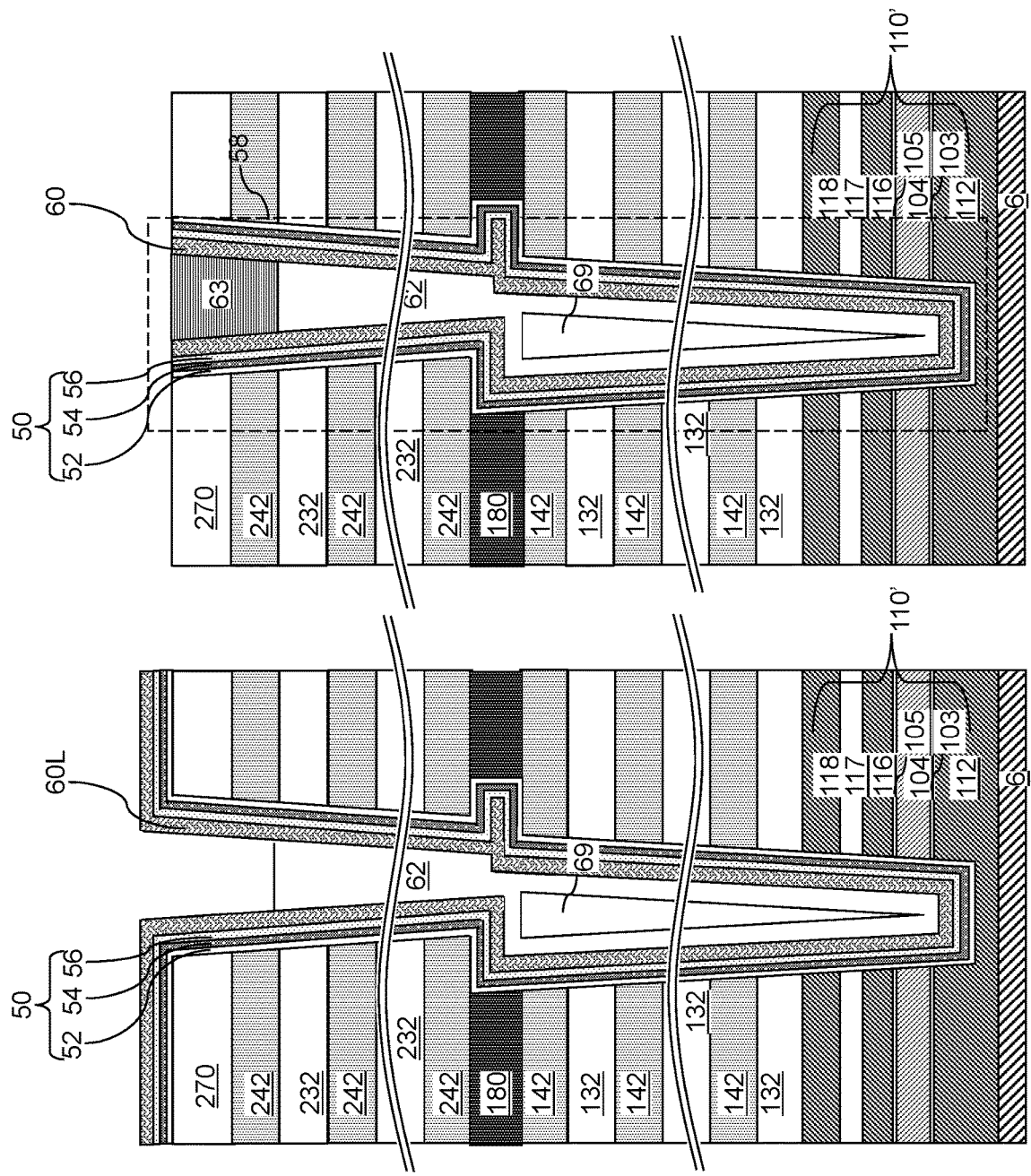

THREE-DIMENSIONAL MEMORY DEVICE INCLUDING AN INTER-TIER ETCH STOP LAYER AND METHOD OF MAKING THE SAME

FIELD

The present disclosure relates generally to the field of semiconductor devices, and particular to a three-dimensional memory device including an inter-tier etch stop layer and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a method of forming a three-dimensional memory device comprises forming a first-tier alternating stack of first insulating layers and first spacer layers over a substrate, forming a continuous etch stop material layer over the first-tier alternating stack, the etch stop material layer including an etch stop material that is different from materials of the first insulating layers and the first spacer layers, forming first-tier memory openings through the first-tier alternating stack by performing a first anisotropic etch process, forming sacrificial memory opening fill structures in the first-tier memory openings, forming a second-tier alternating stack of second insulating layers and second spacer layers over the etch stop material layer and the sacrificial memory opening fill structures, forming second-tier memory openings through the second-tier alternating stack down to at least one of the etch stop material layer and the sacrificial memory opening fill structures by performing a second anisotropic etch process that is selective to the etch stop material layer, forming inter-tier memory openings by removing the sacrificial memory opening fill structures, wherein the inter-tier memory openings comprise volumes of the first-tier memory openings and the second-tier memory openings, and forming memory stack structures each comprising a memory film and a vertical semiconductor channel in the inter-tier memory openings.

According to another embodiment of the present disclosure, a three-dimensional memory device includes a first-tier alternating stack of first insulating layers and first electrically conductive layers located over a substrate, an etch stop material layer located over the first-tier alternating stack, a second-tier alternating stack of second insulating layers and second electrically conductive layers located over the etch stop material layer, inter-tier memory openings vertically extending through the second-tier alternating stack, the etch stop material layer, and the first-tier alternating stack, and memory opening fill structures each including a memory film and a vertical semiconductor channel located in the inter-tier memory openings. The material of the etch stop material layer is different from materials of the first insulating layers, the second insulating layers, the first electrically conductive layers, and the second electrically conductive layers.

BRIEF DESCRIPTION OF THE DRAWINGS

FIGS. 9A-9D illustrate sequential vertical cross-sectional views of a first configuration of a memory opening during formation of a memory opening fill structure according to an embodiment of the present disclosure.

FIGS. 10A-10D illustrate sequential vertical cross-sectional views of a second configuration of a memory opening during formation of a memory opening fill structure according to an embodiment of the present disclosure.

FIGS. 11A-11D illustrate sequential vertical cross-sectional views of a third configuration of a memory opening during formation of a memory opening fill structure according to an embodiment of the present disclosure.

FIGS. 12A-12D illustrate sequential vertical cross-sectional views of a fourth configuration of a memory opening during formation of a memory opening fill structure according to an embodiment of the present disclosure.

FIGS. 13A-13D illustrate sequential vertical cross-sectional views of a fifth configuration of a memory opening during formation of a memory opening fill structure according to an embodiment of the present disclosure.

FIGS. 14A-14D illustrate sequential vertical cross-sectional views of a sixth configuration of a memory opening during formation of a memory opening fill structure according to an embodiment of the present disclosure.

DETAILED DESCRIPTION

Figure 1A:
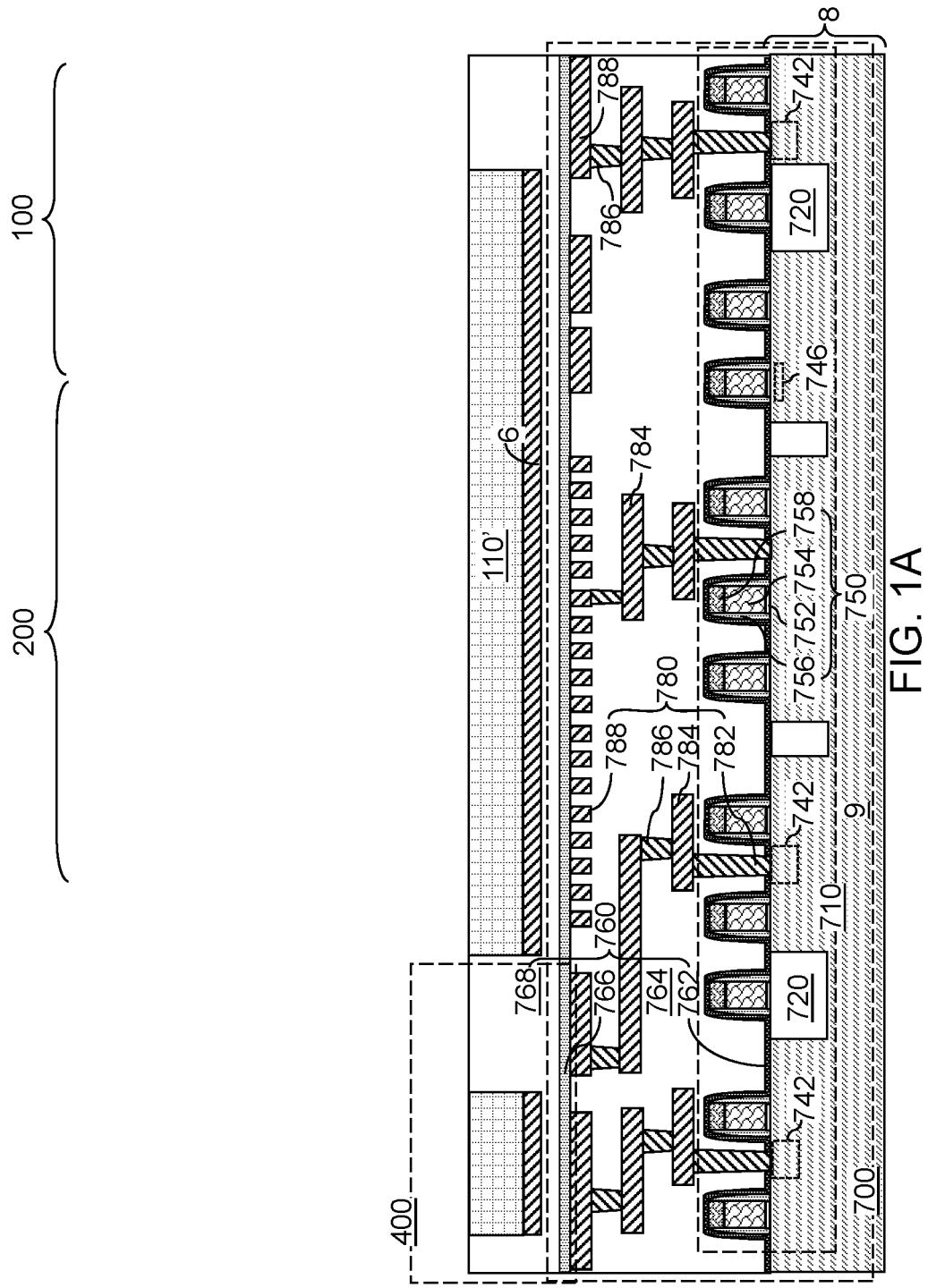
FIG. 1A is a vertical cross-sectional view of an exemplary structure after formation of semiconductor devices, lower level dielectric layers, lower metal interconnect structures, and in-process source level material layers on a semiconductor substrate according to an embodiment of the present disclosure.

As discussed above, the embodiments of the present disclosure provide a three-dimensional memory device including an inter-tier etch stop layer and methods of manufacturing the same, the various aspects of which are described herein in detail. The embodiments of the present disclosure may be used to form various semiconductor devices such as three-dimensional monolithic memory array devices comprising a plurality of NAND memory strings. The drawings are not drawn to scale.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
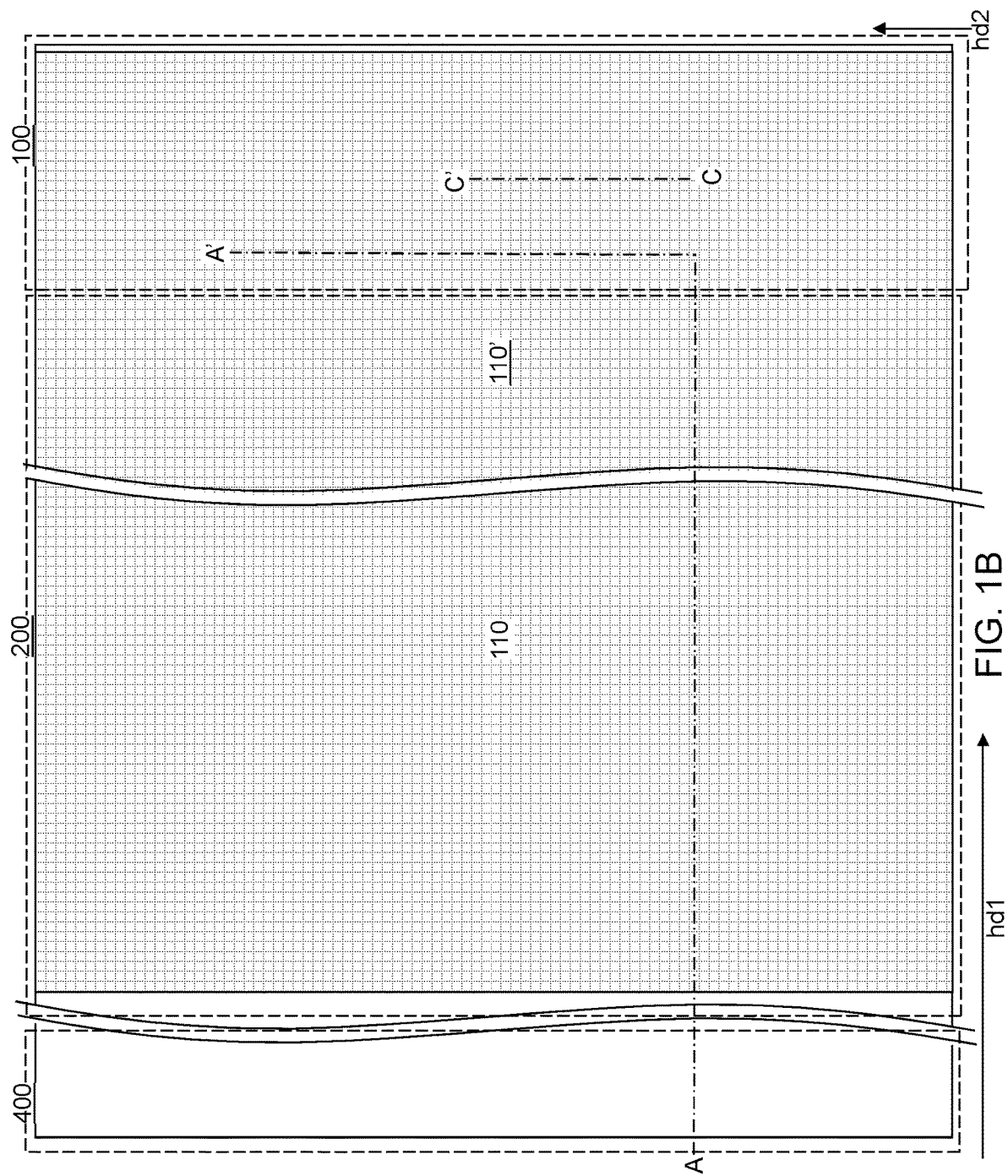
FIG. 1B is a top-down view of the exemplary structure of FIG. 1A. The hinged vertical plane A-A' is the plane of the vertical cross-sectional view of FIG. 1A.
Figure 1C:
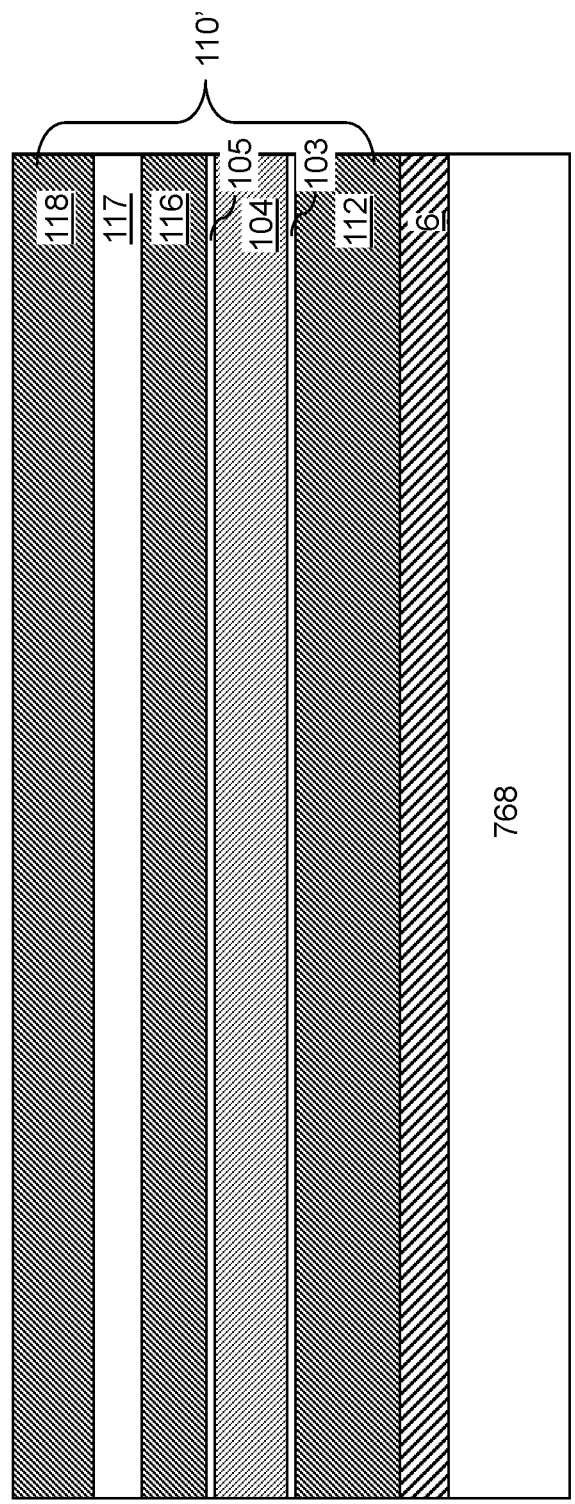
FIG. 1C is a magnified view of the in-process source level material layers along the vertical plane C-C' of FIG. 1B.

Referring to FIGS. 1A-1C, an exemplary structure according to an embodiment of the present disclosure is illustrated. FIG. 1C is a magnified view of an in-process source-level material layers 110' illustrated in FIGS. 1A and 1B. The exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
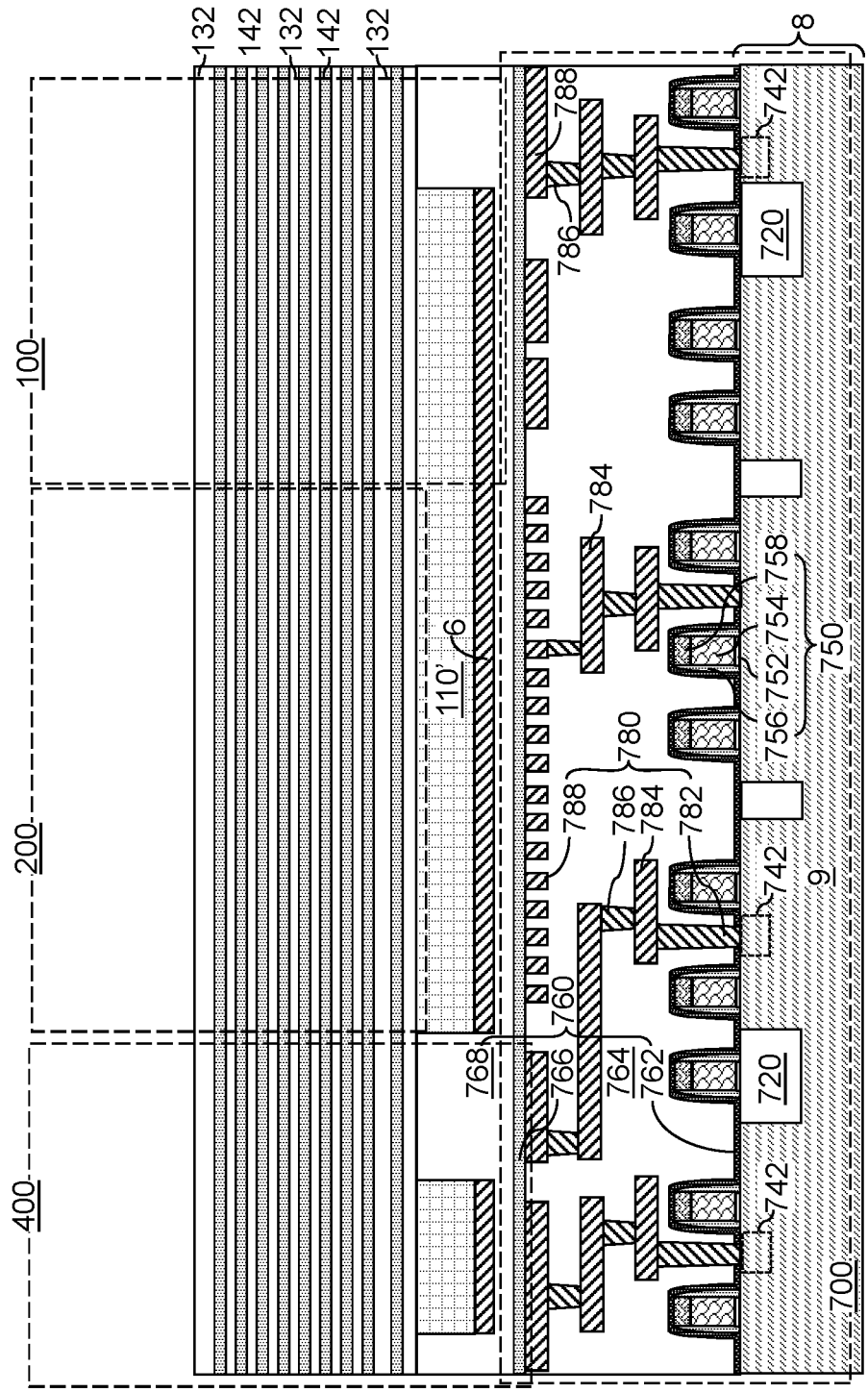
FIG. 2 is a vertical cross-sectional view of the exemplary structure after formation of a first-tier alternating stack of first insulting layers and first spacer material layers according to an embodiment of the present disclosure.

Referring to FIG. 2, an alternating stack of first material layers and second material layers is subsequently formed.

Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive (e.g., metal or heavily doped polysilicon) layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers 142 may include silicon nitride or polysilicon sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

In one embodiment, the topmost layer of the first-tier alternating stack (132, 242) can be a first insulating layer 132, which is herein referred to as a topmost first insulating layer. In another embodiment, the topmost layer of the first-tier alternating stack (132, 142) can be a first sacrificial material layers 142, which is herein referred to as a topmost first sacrificial material layer.

Figure 3:
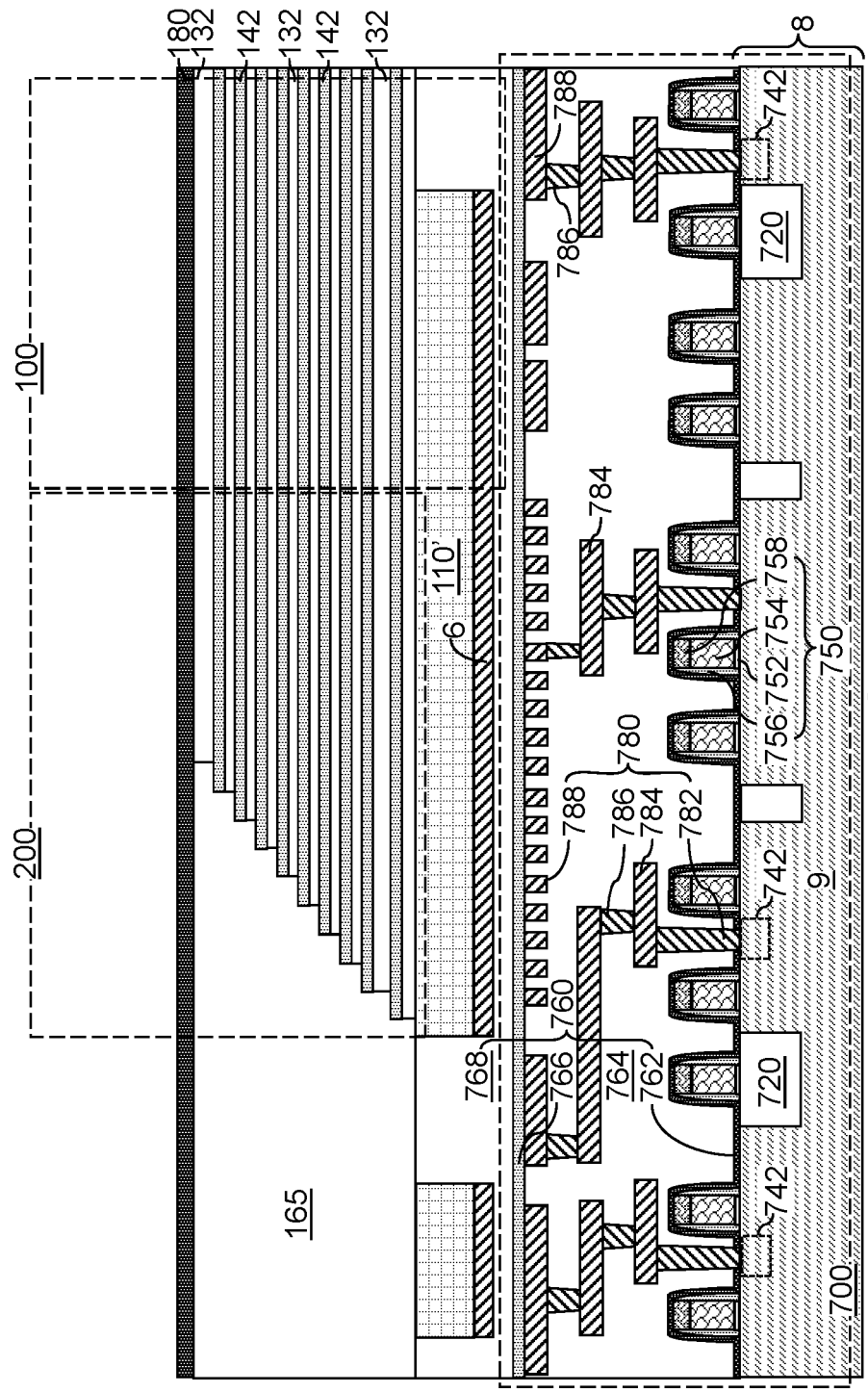
FIG. 3 is a vertical cross-sectional view of the exemplary structure after patterning a first-tier staircase region, a first retro-stepped dielectric material portion, and an etch stop material layer according to an embodiment of the present disclosure.

Referring to FIG. 3, the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the topmost layer or the levels of the topmost layer and an immediately underlying layer, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the topmost surface of the first-tier alternating stack (132, 142). A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An etch stop material layer 180 is deposited over the first-tier structure (132, 142, 165). The etch stop material layer 180 includes an etch stop material that can provide higher etch resistance than the materials of the first insulating layers 132 and the first sacrificial material layers 142 in an anisotropic etch process to be subsequently employed. In one embodiment, the etch stop material layer 180 may include a dielectric material such as silicon carbide nitride, a dielectric metal oxide such as aluminum oxide, hafnium oxide, or any other dielectric oxide of at least one transition metal, a dielectric metal nitride, or a dielectric metal oxynitride. In another embodiment, the etch stop material layer 180 may include a conductive material such as an elemental metal (such as tungsten, titanium, tantalum, molybdenum, cobalt, or ruthenium), an intermetallic alloy, a conductive metallic nitride material (such as TiN, TaN, or WN), or a conductive metallic carbide material (such as TiC, TaC, or WC). Alternatively, the etch stop material layer 180 may include a semiconductor material such as an elemental semiconductor material, such as polysilicon, or a compound semiconductor material. Alternatively, the etch stop material layer 180 may include carbon. The thickness of the etch stop material layer 180 may be in a range from 30 nm to 300 nm, although lesser and greater thicknesses may also be used. Alternatively, the etch stop material layer 180 may include several sublayers, such as a combination of a silicon nitride sublayer and a metal oxide sublayer, a combination of a silicon oxide sublayer and a metal oxide sublayer, or a combination comprising a tungsten layer located between two titanium nitride layers.

Figure 4A:
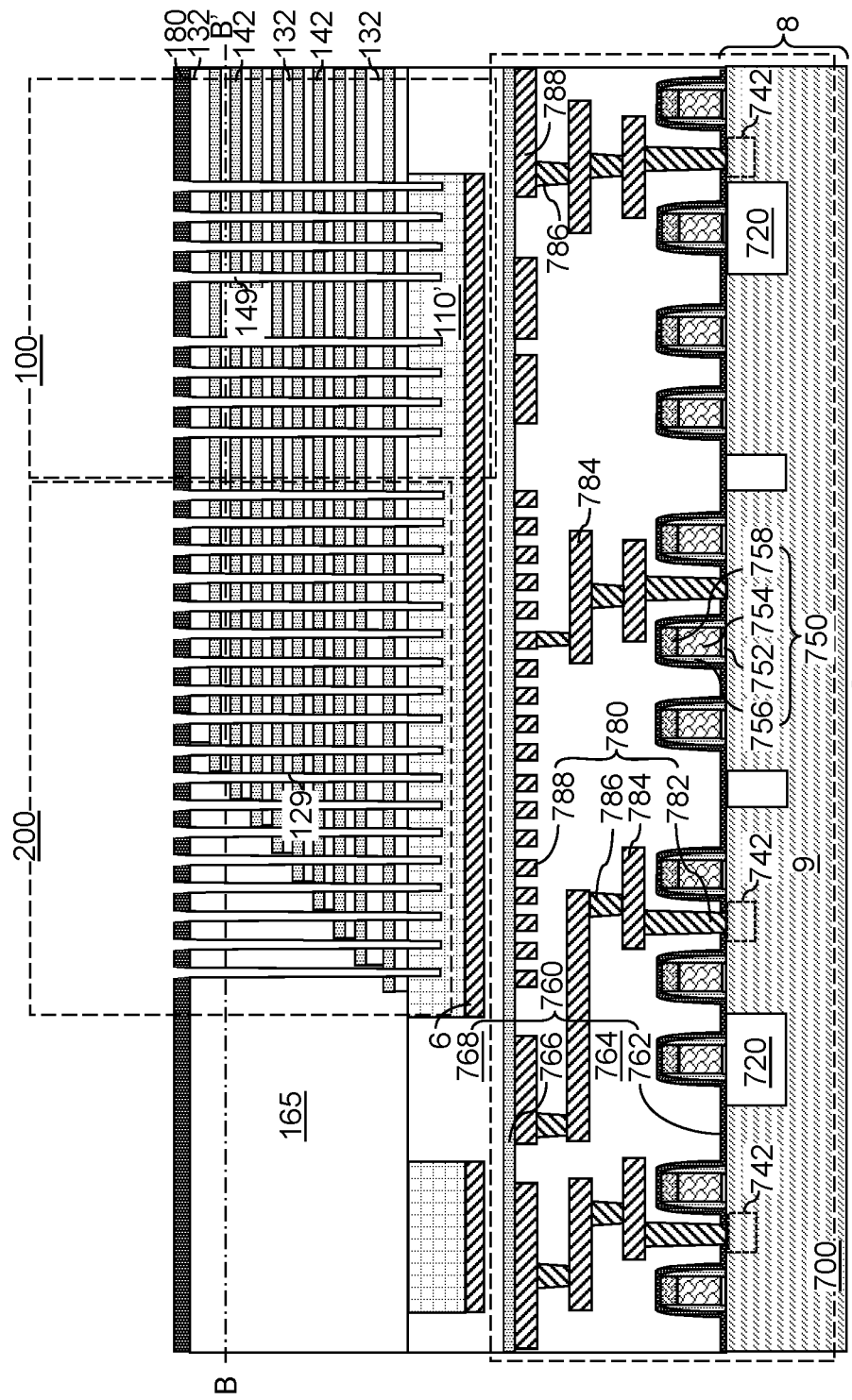
FIG. 4A is a vertical cross-sectional view of the exemplary structure after formation of first-tier memory openings and first-tier support openings according to an embodiment of the present disclosure.
Figure 4B:
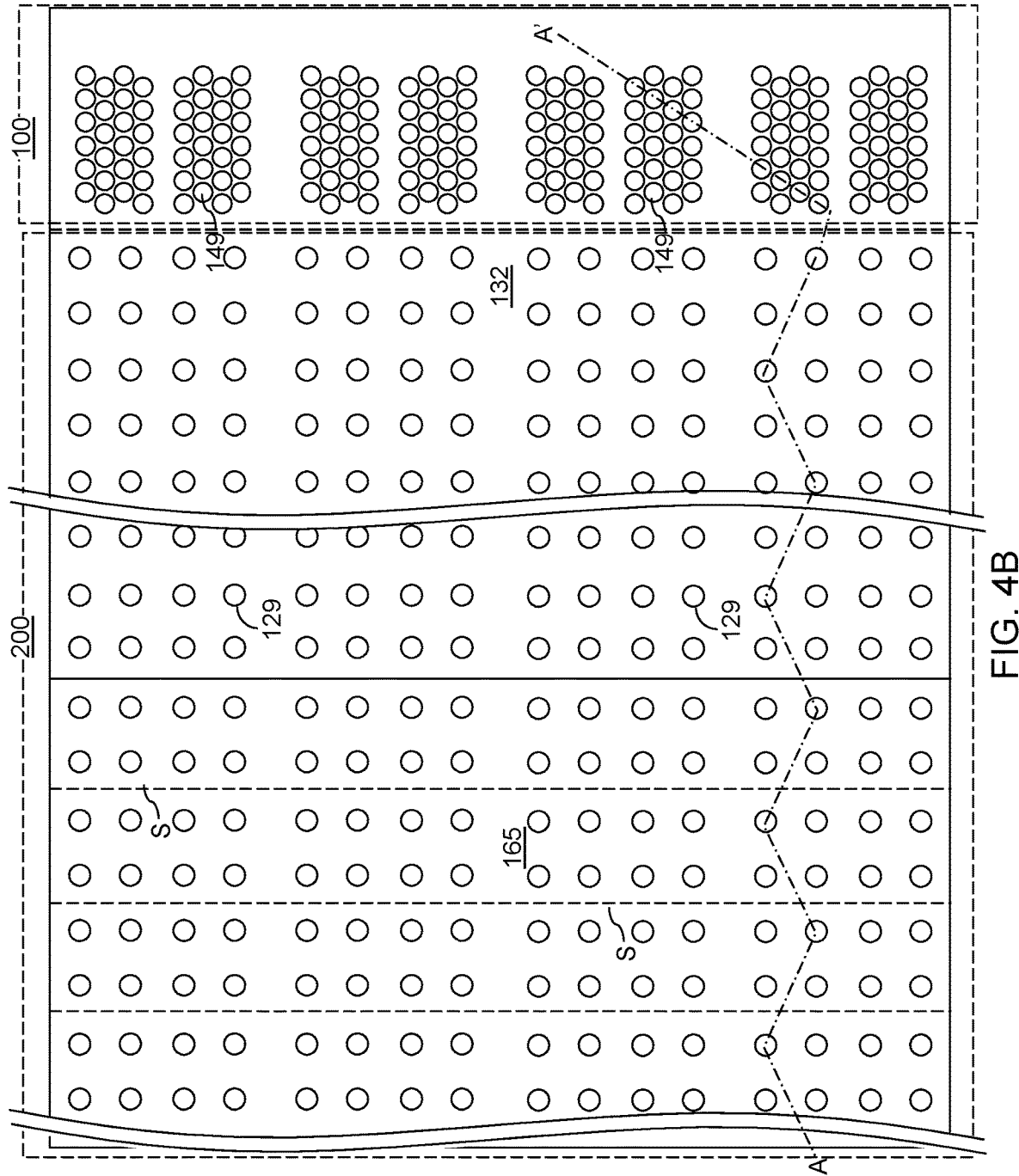
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the etch stop material layer 180 and the first-tier structure (132, 142, 165) and into the in-process source-level material layers 110'. A photoresist layer (not shown) may be applied over the etch stop material layer 180, and may be lithographically patterned to form various openings therethrough. The pattern of openings in the photoresist layer may be transferred through the etch stop material layer 180 and the first-tier structure (132, 142, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first-tier alternating stack (132, 142) are illustrated as dotted lines in FIG. 4B. In one embodiment, the first-tier memory openings 149 and the first-tier support openings 129 can be formed with a respective sidewall having a taper angle in a range from 0.1 degree to 5 degrees (as measured relative to the vertical direction).

The first-tier memory openings 149 are openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step that etches the etch stop material of the etch stop material layer 180, and a subsequent etch step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'.

In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Figure 5:
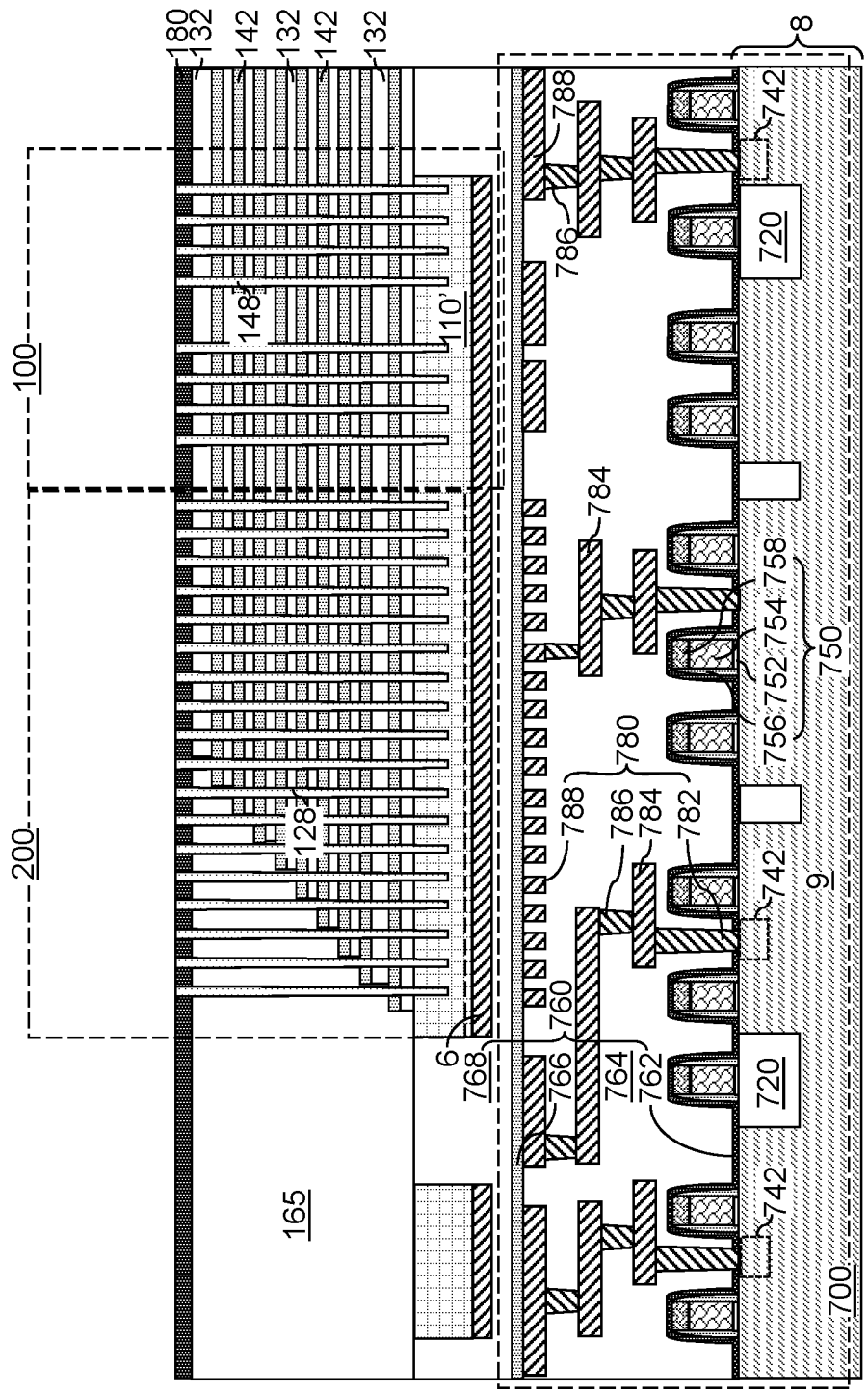
FIG. 5 is a vertical cross-sectional view of the exemplary structure after formation of various sacrificial fill structures according to an embodiment of the present disclosure.

Referring to FIG. 5, sacrificial first-tier opening fill structures (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142. Preferably, the sacrificial first-tier fill material is different from the material of the etch stop material layer 180.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first sacrificial material layers 142, and the etch stop material layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid.

In one embodiment, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the etch stop material layer 180. For example, the sacrificial first-tier fill material may be recessed to a top surface of the etch stop material layer 180 using a planarization process. The planarization process may include a recess etch, chemical mechanical planarization (CMP), or a combination thereof. The top surface of the etch stop material layer 180 may be used as an etch stop layer or a planarization stop layer.

Remaining portions of the sacrificial first-tier fill material comprise sacrificial first-tier opening fill structures (148, 128). Specifically, each remaining portion of the sacrificial material in a first-tier memory opening 149 constitutes a sacrificial memory opening fill structure 148. Each remaining portion of the sacrificial material in a first-tier support opening 129 constitutes a sacrificial support opening fill structure 128. The various sacrificial first-tier opening fill structures (148, 128) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the etch stop material layer 180). The top surfaces of the sacrificial first-tier opening fill structures (148, 128) may be coplanar with the top surface of the etch stop material layer 180. Each of the sacrificial first-tier opening fill structures (148, 128) may, or may not, include cavities therein.

Figure 6:
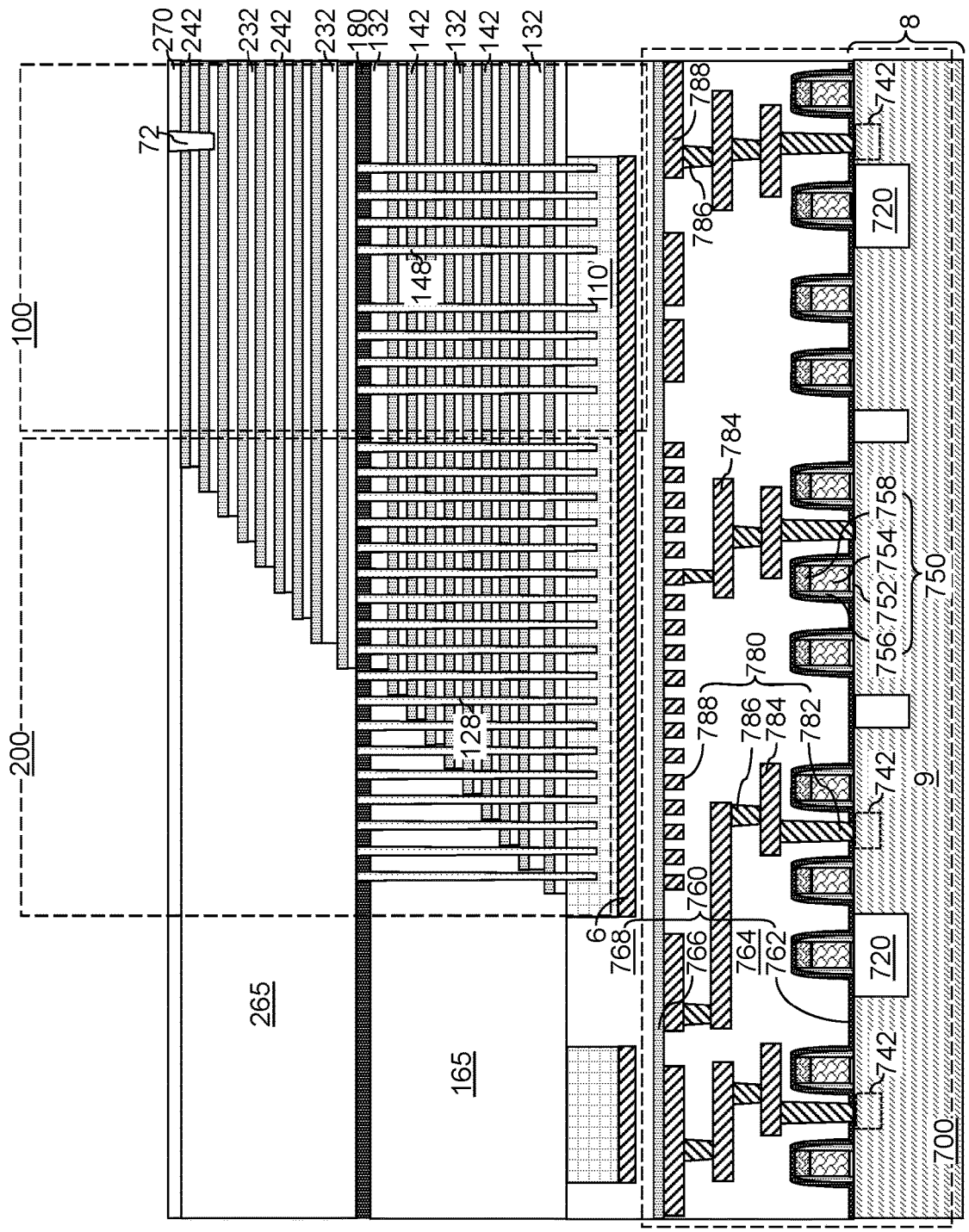
FIG. 6 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 6, a second-tier structure may be formed over the over the etch stop material layer 180 and the sacrificial first-tier opening fill structures (148, 128). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

An insulating cap layer 270 may be subsequently formed over the second-tier alternating stack (232, 242). The insulating cap layer 270 includes a dielectric material that is different from the material of the second sacrificial material layers 242. In one embodiment, the insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 110', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second-tier alternating stack (232, 242), the second retro-stepped dielectric material portion 265, the insulating cap layer 270, and the optional drain-select-level isolation structures 72 collectively constitute a second-tier structure (232, 242, 265, 270, 72).

Figure 7A:
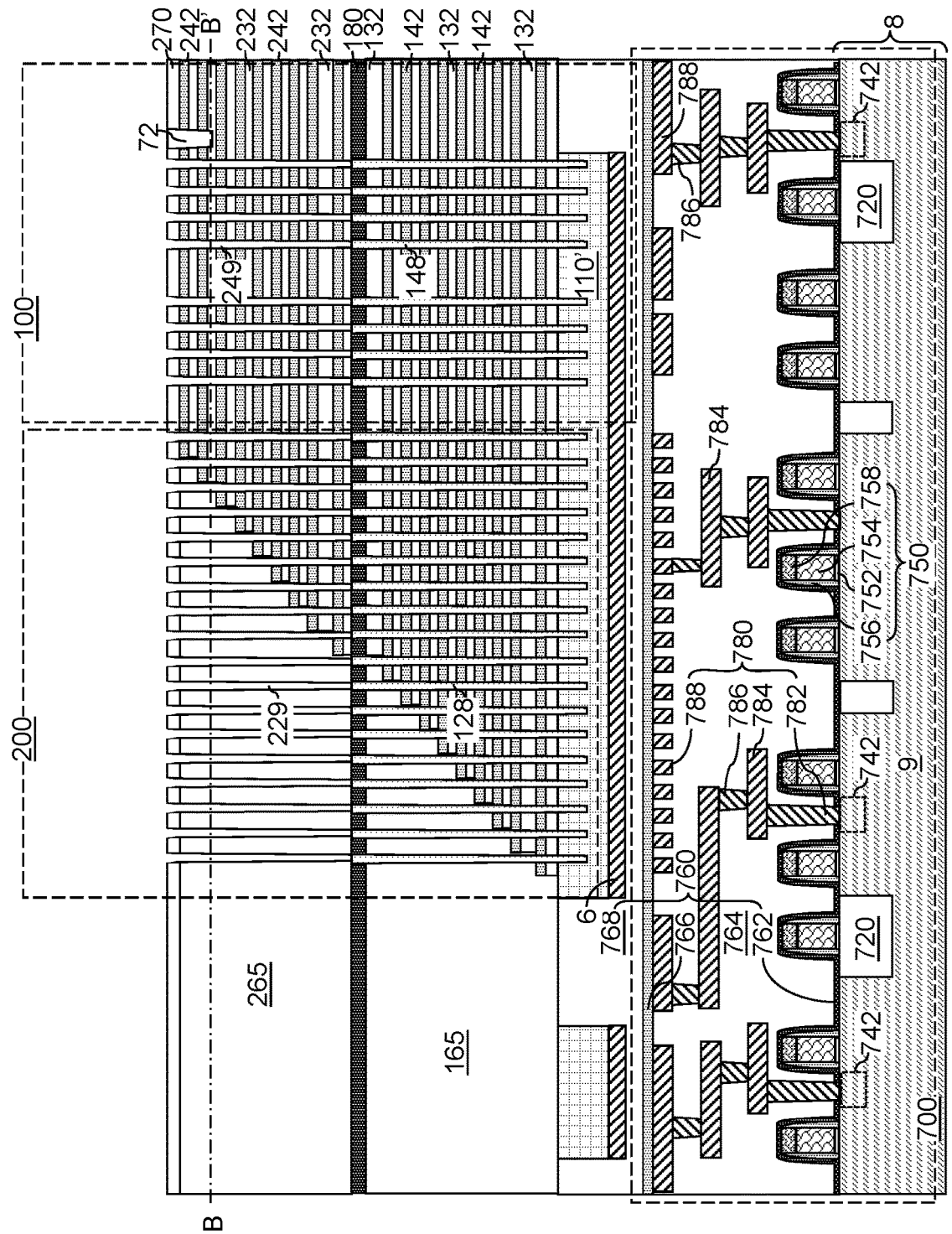
FIG. 7A is a vertical cross-sectional view of the exemplary structure after formation of second-tier memory openings and second-tier support openings according to an embodiment of the present disclosure.
Figure 7B:
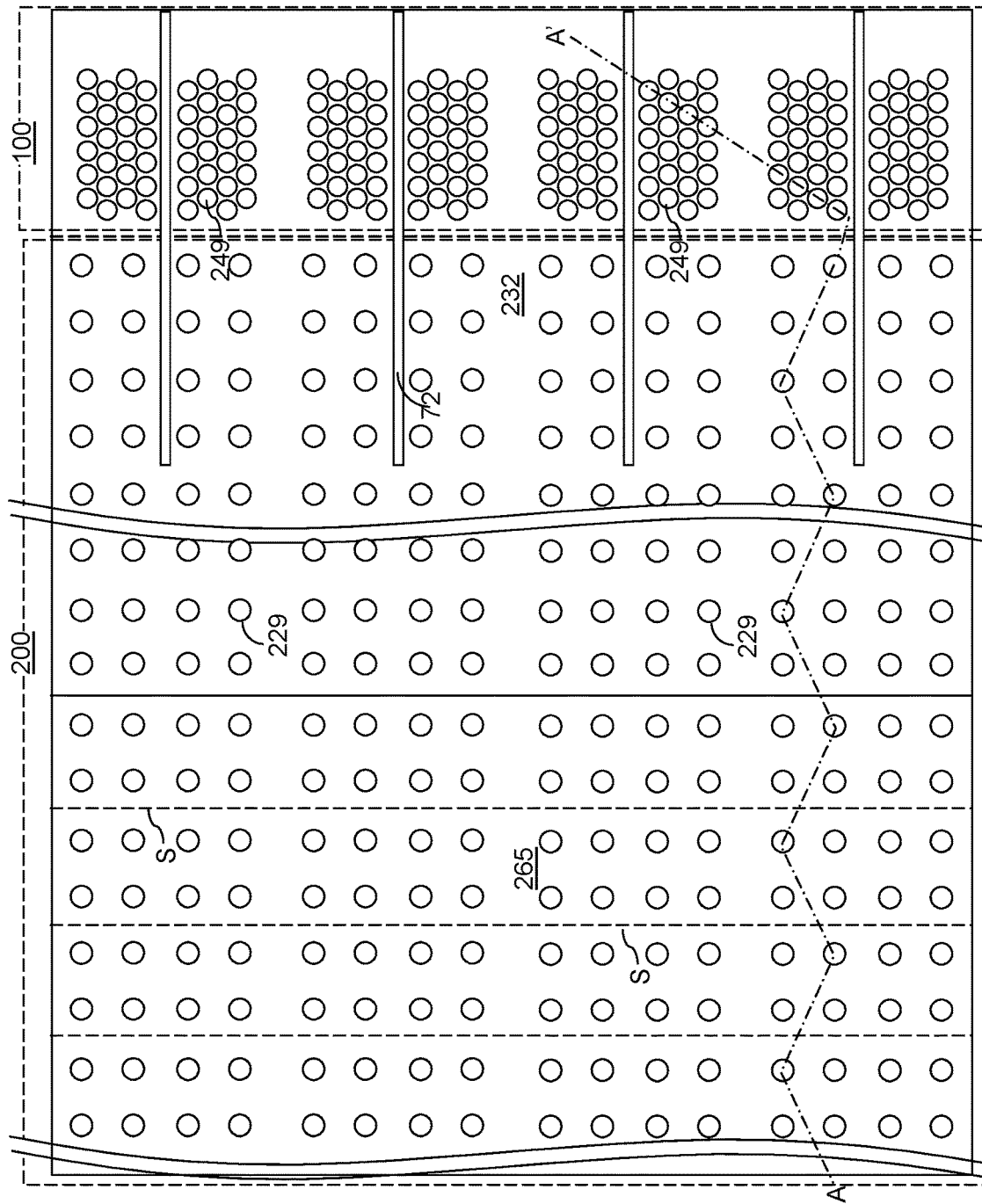
FIG. 7B is a horizontal cross-sectional view of the exemplary structure along the horizontal plane B-B' of FIG. 7A. The hinged vertical plane A-A' corresponds to the plane of the vertical cross-sectional view of FIG. 7A.

Referring to FIGS. 7A, 7B, and 9A, various second-tier openings (249, 229) may be formed through the second-tier structure (232, 242, 265, 270, 72). A photoresist layer (not shown) may be applied over the insulating cap layer 270, and may be lithographically patterned to form various openings therethrough. The pattern of the openings may be the same as the pattern of the various first-tier openings (149, 129), which is the same as the sacrificial first-tier opening fill structures (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The second anisotropic etch process etches the materials of the second-tier structure (232, 242, 265, 270, 72) selective to the etch stop material layer 180. The various second-tier openings (249, 229) may include second-tier memory openings 249 and second-tier support openings 229. Second-tier memory opening 249 are formed through the second-tier alternating stack (232, 242) down to the etch stop material layer 180 and to the sacrificial memory opening fill structures 148. Second-tier support openings 229 are formed through the second-tier alternating stack (232, 242) and/or the second retro-stepped dielectric material portion 265 down to the etch stop material layer 180 and to the sacrificial support opening fill structures 128. In one embodiment, the second-tier memory openings 249 and the second-tier support openings 229 can be formed with a respective sidewall having a taper angle in a range from 0.1 degree to 5 degrees (as measured relative to the vertical direction).

The second-tier memory openings 249 are formed directly on a top surface of a respective one of the sacrificial memory opening fill structures 148. The second-tier support openings 229 are formed directly on a top surface of a respective one of the sacrificial support opening fill structures 128. Further, each second-tier support openings 229 may be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset from, and/or may be located entirely within, a periphery of a top surface of an underlying sacrificial first-tier opening fill structure (148, 128). The photoresist layer may be subsequently removed, for example, by ashing.

FIG. 9A illustrates a configuration in which a bottom periphery of a second-tier memory opening 249 is laterally offset from a periphery of a top surface of an underlying sacrificial memory opening fill structure 148. In one embodiment, the first-tier memory opening 149 of a memory opening 49 can be formed with a respective sidewall having a taper angle in a range from 0.1 degree to 5 degrees, and the second-tier memory opening 249 of the memory opening 49 can be formed with a respective sidewall having a taper angle in a range from 0.1 degree to 5 degrees. A vertical axis passing through the geometrical center of the second-tier memory opening 249 can be laterally offset from a vertical axis passing through the geometrical center of the first-tier memory opening 149 by a non-zero lateral offset distance. A geometrical center of an element refers to the center of gravity of a hypothetical object occupying the same volumes as the element and having a uniform density throughout.

The sacrificial fill material of the sacrificial memory opening fill structures 148 may provide lower etch resistance to the chemistry of the second anisotropic etch process than the materials of the first insulating layers 132 and the first sacrificial material layers 142. The etch stop material of the etch stop material layer 180 provides higher etch resistance to the chemistry of the second anisotropic etch process than the materials of the first insulating layers 132 and the first sacrificial material layers 142. Thus, even if the bottom periphery of a second-tier memory opening 249 is laterally offset from a periphery of a top surface of an underlying sacrificial memory opening fill structure 148 due to overlay variations of a lithographic process that forms the pattern of the second-tier memory openings 249 and the second-tier support openings 229, the portion of each second-tier openings 249 located outside the periphery of the top surface of a respective underlying sacrificial memory opening fill structure 148 does not extend through the etch stop material layer 180, and the first-tier alternating stack (132, 142) is not etched by the second anisotropic etch process.

Figure 8:
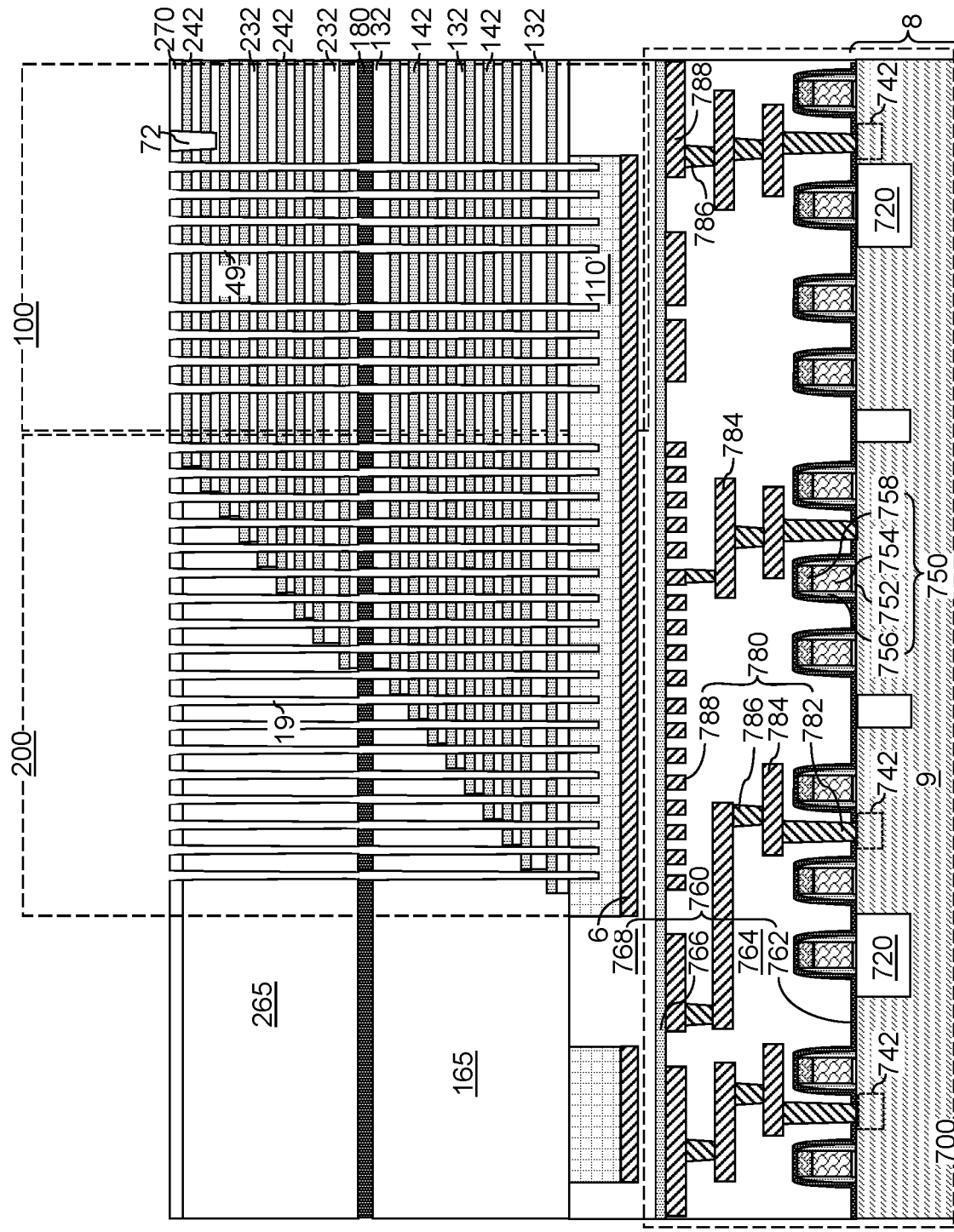
FIG. 8 is a vertical cross-sectional view of the exemplary structure after formation of inter-tier memory openings and inter-tier support openings according to an embodiment of the present disclosure.

Referring to FIG. 8, the sacrificial first-tier fill material of the sacrificial first-tier opening fill structures (148, 128) may be removed using an etch process that etches the sacrificial first-tier fill material of the sacrificial memory opening fill structures 148 and the sacrificial support opening fill structures 128 selective to the materials of the first-tier alternating stack (132, 142), the second-tier alternating stack (232, 242), and the etch stop material layer 180. A memory opening 49, which is also referred to as an inter-tier memory opening 49, is formed in each combination of a second-tier memory openings 249 and a volume from which a sacrificial memory opening fill structure 148 is removed. A support opening 19, which is also referred to as an inter-tier support opening 19, is formed in each combination of a second-tier support openings 229 and a volume from which a sacrificial support opening fill structure 128 is removed. Each first-tier memory opening 149 can vertically extend down to the in-process source-level material layers 110', and the top surface of the lower source-level semiconductor layer 112 can be physically exposed to each inter-tier memory opening 49. In one embodiment, each first-tier support opening 129 can vertically extend down to the in-process source-level material layers 110', and the top surface of the lower source-level semiconductor layer 112 can be physically exposed to each inter-tier support opening 29.

FIGS. 9A-9D provide sequential cross-sectional views of a first configuration of a memory opening 49 during formation of a memory opening fill structure. The same structural change occurs in each of the memory openings 49 and the support openings 19. The processing steps of FIG. 9A are the same as the processing steps of FIGS. 7A and 7B. Generally, inter-tier memory openings 49 are formed by removing the sacrificial memory opening fill structures 148 underneath the second-tier memory openings 249. Each inter-tier memory opening 49 comprises volumes of a first-tier memory opening 149 and a second-tier memory opening 249. The processing steps of FIG. 8 are performed after the processing steps of FIGS. 7A, 7B and 9A. Subsequently, a memory stack structure comprising a memory film and a vertical semiconductor channel is formed within each inter-tier memory opening 49.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 can be deposited on physically exposed surfaces of the first-tier alternating stack (132, 142), the second-tier alternating stack (232, 242), and the etch stop material layer 180 around each inter-tier memory opening 49 and around each inter-tier support opening 19. The charge storage layer 54 can include charge storage elements located at each level of the first sacrificial material layers 142 and the second sacrificial material layers 242. The tunneling dielectric layer 56 is formed on the charge storage elements.

Specifically, the blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. The thickness of the charge storage layer 54 may be in a range from 2 nm to 20 nm, although lesser and greater thicknesses may also be used. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. In this case, a vertical stack of discrete charge storage elements can be formed at the levels of the first sacrificial material layers 142 and the second sacrificial material layers 242.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening 49. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. In one embodiment, a void (i.e., air gap) 69 that is free of any solid or liquid material can be formed in an unfilled volume of a memory opening 49 within the first-tier structure (132, 142, 165). The horizontal portion of the dielectric core layer overlying the insulating cap layer 270 may be removed, for example, by a recess etch. The recess etch continues until top surfaces of the remaining portions of the dielectric core layer are recessed to a height between the top surface of the insulating cap layer 270 and the bottom surface of the insulating cap layer 270. Each remaining portion of the dielectric core layer constitutes a dielectric core 62.

Referring to FIG. 9D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the insulating cap layer 270 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 165), the second-tier structure (232, 242, 270, 265, 72), the etch stop material layer 180, the memory opening fill structures 58, and the support opening fill structures collectively constitute a memory-level assembly.

In one embodiment, the topmost layer of the first-tier alternating stack (132, 142) can be the topmost first insulating layer 132, and the etch stop material layer 180 can be located directly on a top surface of the topmost first insulating layer 132 within the first-tier alternating stack (132, 142). In one embodiment, the etch stop material layer 180 consists essentially of a dielectric material, a semiconductor material or carbon. In another embodiment, the etch stop material layer 180 consists essentially of an electrically conductive material that is different from materials of electrically conducive layers to be subsequently formed by replacing the first sacrificial material layers 142 and the second sacrificial material layers 242.

FIGS. 10A-10D illustrate sequential vertical cross-sectional views of a second configuration of a memory opening during formation of a memory opening fill structure according to an embodiment of the present disclosure. In the second configuration, the processing sequences employed to form the first configuration of the exemplary structure as described above is modified to form an additional insulating layer 332 after the processing steps of FIG. 3 and prior to performing the processing steps of FIGS. 4A and 4B. Specifically, the etch stop material layer 180 is formed directly on a top surface of a topmost first insulating layer 132 within the first-tier alternating stack (132, 232) after performing the processing steps of FIG. 3. The additional insulating layer 332 is deposited over the etch stop material layer 180. The additional insulating layer 332 can have the same material composition as the first insulating layers 132. The additional insulating layer 332 can have a thickness in a same range as the first insulating layers 132, or may have a greater thickness. The first-tier memory openings 149 and the first-tier support openings 129 are formed through the additional insulating layer 332, the etch stop material layer 180, and the first-tier alternating stack (132, 142) employing a first anisotropic etch process, which can have an extra etch step for etching the additional insulating layer 332 in comparison with the first anisotropic etch process described above. A sacrificial fill material is deposited in the first-tier memory openings 149 and the first-tier support openings 129 and over the additional insulating layer 332. The sacrificial fill material can be planarized by removing the portion of the sacrificial fill material located above the horizontal plane including the top surface of the additional insulating layer 332 by performing a planarization process (such as a recess etch and/or a chemical mechanical planarization process).

Referring to FIG. 10A, the processing steps of FIGS. 7A, 7B, and 9A can be performed to form second-tier memory openings 249 and second-tier support openings 229. Each second-tier memory opening 249 extends at least to a top surface of a respective underlying sacrificial memory opening fill structure 148, and may, or may not, extend through the additional insulating layer 332. A second-tier memory opening 249 may vertical extend through the additional insulating layer 332, and into a portion of the etch stop material layer 180.

The sacrificial fill material of the sacrificial memory opening fill structures 148 may provide lower etch resistance to the chemistry of the second anisotropic etch process than the materials of the first insulating layers 132 and the first sacrificial material layers 142. The etch stop material of the etch stop material layer 180 provides higher etch resistance to the chemistry of the second anisotropic etch process than the materials of the first insulating layers 132 and the first sacrificial material layers 142. Thus, even if the bottom periphery of a second-tier memory opening 249 is laterally offset from a periphery of a top surface of an underlying sacrificial memory opening fill structure 148 due to overlay variations of a lithographic process that forms the pattern of the second-tier memory openings 249 and the second-tier support openings 229, the portion of each second-tier openings 249 located outside the periphery of the top surface of a respective underlying sacrificial memory opening fill structure 148 does not extend through the etch stop material layer 180, and the first-tier alternating stack (132, 142) is not etched by the second anisotropic etch process. Further, the additional insulating layer 332 provides an additional material portion that reduces etching of the etch stop material layer 180, and thus, reduces the probability of the etch stop material layer 180 being etched through during the second anisotropic etch process.

Referring to FIG. 10B, the processing steps of FIG. 9B can be performed to form a stack of layers including a blocking dielectric layer 52, a charge storage layer 54, a tunneling dielectric layer 56, and a semiconductor channel material layer 60L in each of the memory openings 49 (i.e., the inter-tier memory openings 49) and the support openings 19 (i.e., the inter-tier support openings).

Referring to FIG. 10C, the processing steps of FIG. 9C can be performed to deposit a dielectric core layer in the cavities 49'. In one embodiment, a void 69 that is free of any solid or liquid material can be formed in an unfilled volume of a memory opening 49 within the first-tier structure (132, 142, 165). The horizontal portion of the dielectric core layer overlying the insulating cap layer 270 may be removed, for example, by a recess etch. The recess etch continues until top surfaces of the remaining portions of the dielectric core layer are recessed to a height between the top surface of the insulating cap layer 270 and the bottom surface of the insulating cap layer 270. Each remaining portion of the dielectric core layer constitutes a dielectric core 62.

Referring to FIG. 10D, the processing steps of FIG. 9D can be performed to form a drain region 63 within each memory opening 49 and within each support opening 19. Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 165), the second-tier structure (232, 242, 270, 265, 72), the etch stop material layer 180, the additional insulating layer 332, the memory opening fill structures 58, and the support opening fill structures collectively constitute a memory-level assembly.

In one embodiment, the topmost layer of the first-tier alternating stack (132, 142) can be the topmost first insulating layer 132, and the etch stop material layer 180 can be located directly on a top surface of the topmost first insulating layer 132 within the first-tier alternating stack (132, 142), and the additional insulating layer 332 can contact a top surface of the etch stop material layer 180 and a bottom surface of the second-tier alternating stack (232, 242). The bottommost layer of the second-tier alternating stack (232, 242) may be a second sacrificial material layer 242 or a second insulating layer 232. In one embodiment, the etch stop material layer 180 consists essentially of a dielectric material, a semiconductor material or carbon. In another embodiment, the etch stop material layer 180 consists essentially of an electrically conductive material that is different from materials of electrically conducive layers to be subsequently formed by replacing the first sacrificial material layers 142 and the second sacrificial material layers 242.

FIGS. 11A-11D illustrate sequential vertical cross-sectional views of a third configuration of a memory opening during formation of a memory opening fill structure according to an embodiment of the present disclosure. The third configuration of the memory opening of FIG. 11A can be derived from the first configuration of the memory opening illustrated in FIG. 9A or from the second configuration of the memory opening illustrated in FIG. 10A by isotropically etching the etch stop material selective to the materials of the first-tier alternating stack (132, 142) and the second-tier alternating stack (232, 242). For example, a wet etch process can be performed employing an etch chemistry that etches the etch stop material of the etch stop material layer 180 selective to the materials of the first insulating layers 132, the first sacrificial material layers 142, the second insulating layers 232, the second sacrificial material layers 242, and the additional insulating layer 332 (if present). A lateral recess may be formed at the level of the etch stop material layer 180. The lateral recess distance (i.e., the distance between a recessed sidewall of the etch stop material layer 180 and a most proximal portion of a sidewall of a second-tier memory opening 249) can be in a range from 3 nm to 50 nm, such as from 6 nm to 25 nm, although lesser and greater lateral recess distances can also be employed.

Referring to FIG. 11B, the processing steps of FIG. 9B can be performed to form a stack of layers including a blocking dielectric layer 52, a charge storage layer 54, a tunneling dielectric layer 56, and a semiconductor channel material layer 60L in each of the memory openings 49 (i.e., the inter-tier memory openings 49) and the support openings 19 (i.e., the inter-tier support openings).

Figure 11D:
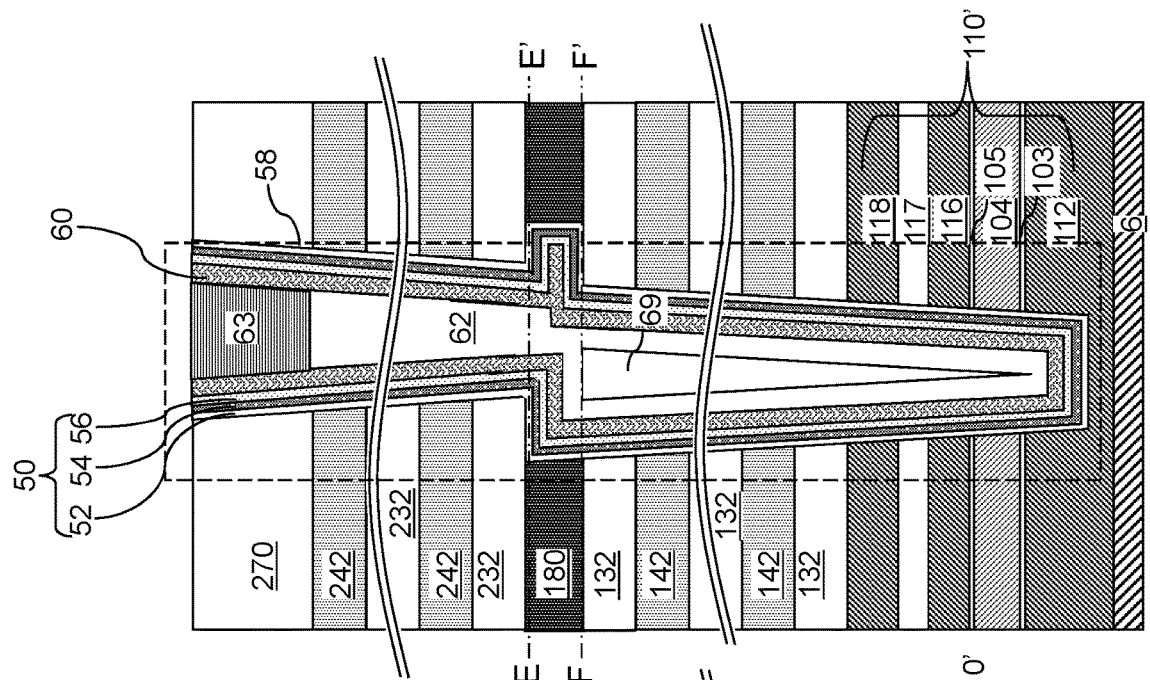
Figure 11C:
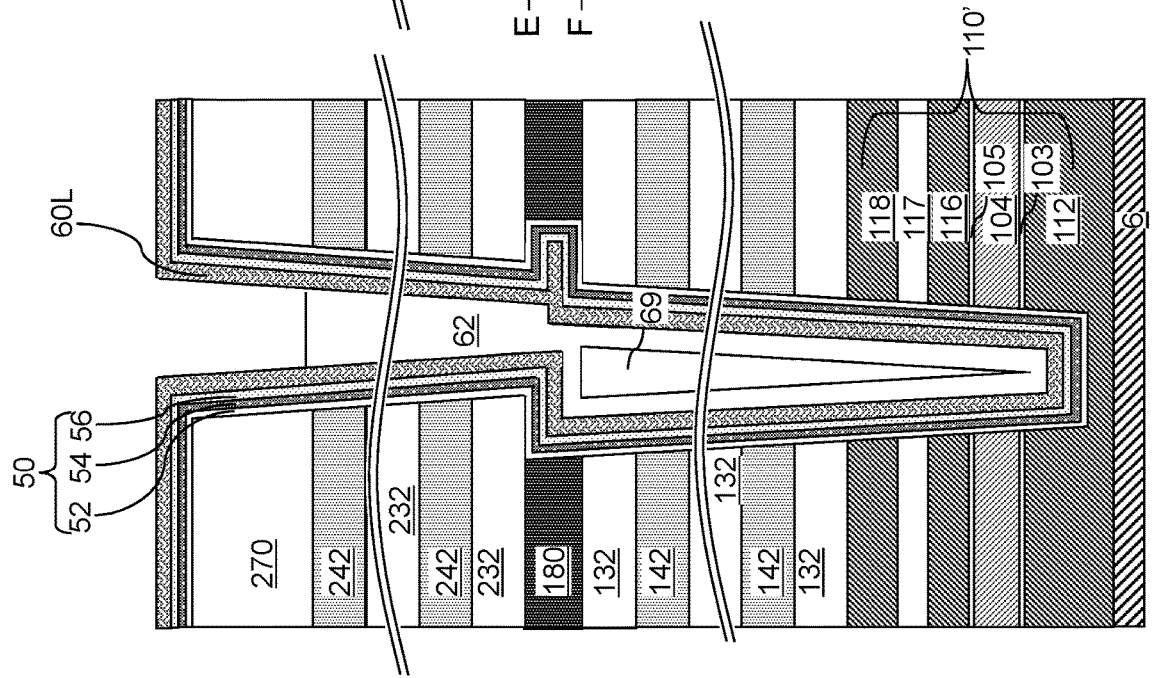

Referring to FIG. 11C, the processing steps of FIG. 9C can be performed to deposit a dielectric core layer in the cavities 49'. In one embodiment, a void 69 that is free of any solid or liquid material can be formed in an unfilled volume of a memory opening 49 within the first-tier structure (132, 142, 165). The horizontal portion of the dielectric core layer overlying the insulating cap layer 270 may be removed, for example, by a recess etch. The recess etch continues until top surfaces of the remaining portions of the dielectric core layer are recessed to a height between the top surface of the insulating cap layer 270 and the bottom surface of the insulating cap layer 270. Each remaining portion of the dielectric core layer constitutes a dielectric core 62.

Figure 11E:
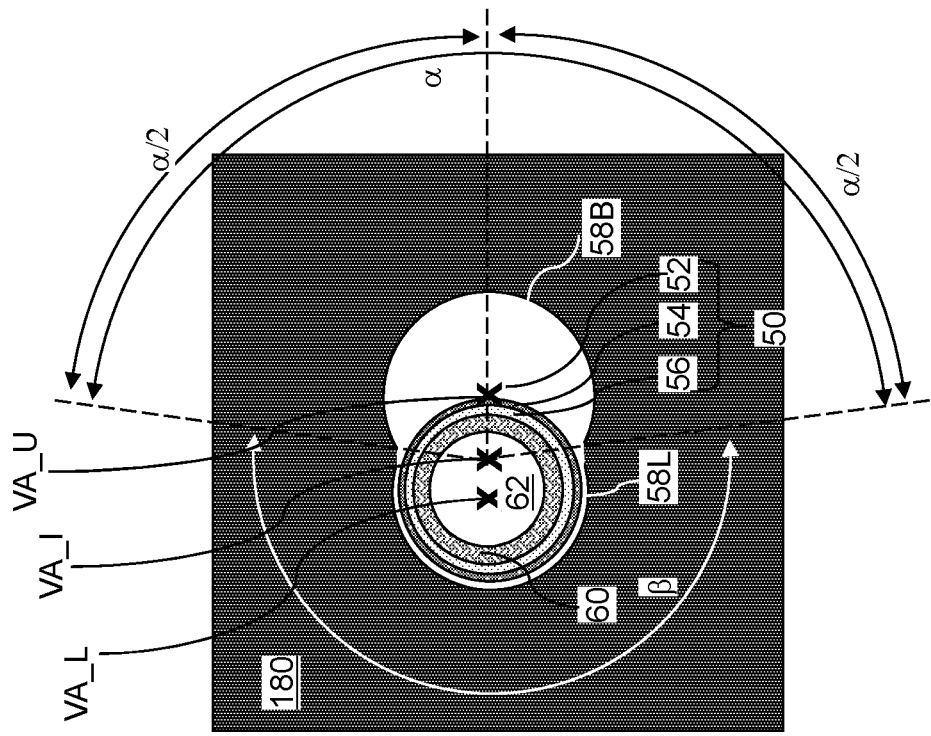
FIG. 11E is a horizontal cross-sectional view of the third configuration of a memory opening along the horizontal plane E-E' of FIG. 11D.
Figure 11F:
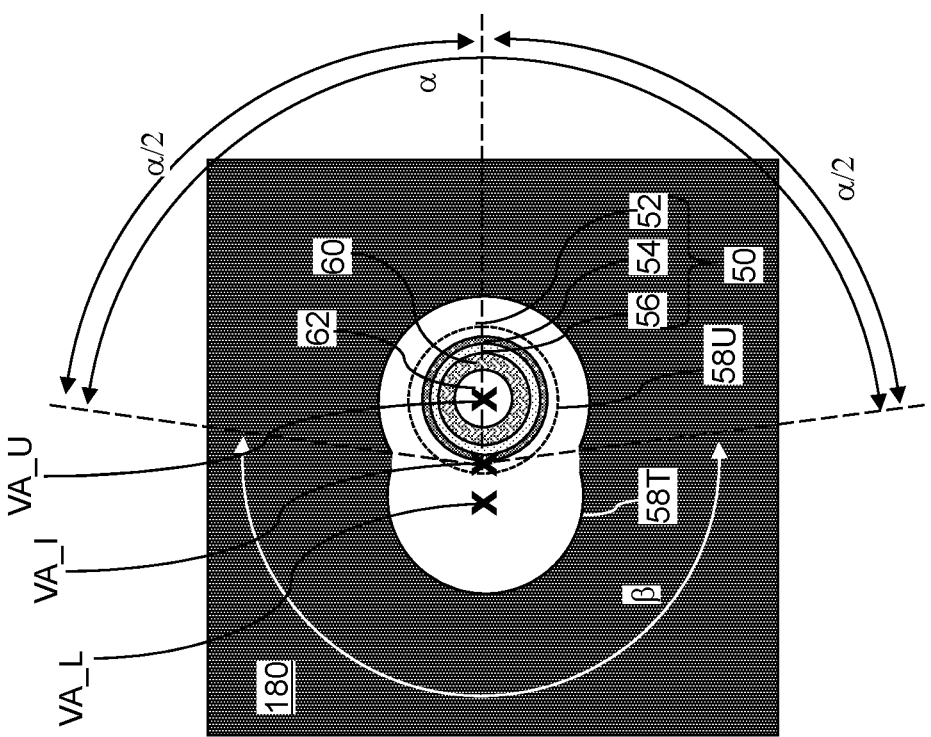
FIG. 11F is a horizontal cross-sectional view of the third configuration of a memory opening along the horizontal plane F-F' of FIG. 11D.

Referring to FIGS. 11D-11F, the processing steps of FIG. 9D can be performed to form a drain region 63 within each memory opening 49 and within each support opening 19. Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 165), the second-tier structure (232, 242, 270, 265, 72), the etch stop material layer 180, an additional insulating layer 332 (if present), the memory opening fill structures 58, and the support opening fill structures collectively constitute a memory-level assembly.

In one embodiment, the topmost layer of the first-tier alternating stack (132, 142) can be the topmost first insulating layer 132, and the etch stop material layer 180 can be located directly on a top surface of the topmost first insulating layer 132 within the first-tier alternating stack (132, 142). An additional insulating layer 332, if present, can contact a top surface of the etch stop material layer 180 and a bottom surface of the second-tier alternating stack (232, 242). Alternatively, a bottommost layer of the second-tier alternating stack (232, 242) can contact the top surface of the etch stop material layer 180. The bottommost layer of the second-tier alternating stack (232, 242) may be a second sacrificial material layer 242 or a second insulating layer 232. In one embodiment, the etch stop material layer 180 consists essentially of a dielectric material, a semiconductor material or carbon. In another embodiment, the etch stop material layer 180 consists essentially of an electrically conductive material that is different from materials of electrically conducive layers to be subsequently formed by replacing the first sacrificial material layers 142 and the second sacrificial material layers 242.

Generally, each memory opening fill structure 58 comprises a lower portion embedded in the first-tier alternating stack (132, 142), an upper portion embedded in the second-tier alternating stack (232, 242), and an inter-tier portion embedded in the etch stop material layer 180. The inter-tier portion of the memory opening fill structure 58 can have an annular top surface and an annular bottom surface. The annular top surface of the inter-tier portion of the memory opening fill structure 58 is adjoined to, and coincides with, the upper portion of the memory opening fill structure 58. The annular bottom surface of the inter-tier portion of the memory opening fill structure 58 is adjoined to, and coincides with, the lower portion of the memory opening fill structure 58.

A bottom periphery of each second-tier opening (249, 229) may be laterally offset from, and/or may be located entirely within, a periphery of a top surface of an underlying sacrificial first-tier opening fill structure (148, 128), as shown in FIG. 11A. The sidewall (i.e., periphery) 58T of the annular top surface of the inter-tier portion of the memory opening fill structure 58 is laterally offset outward from a bottom sidewall (i.e., periphery) 58U of the upper portion of the memory opening fill structure 58 at all azimuthal angles around a vertical axis VA_I passing through a geometrical center of the inter-tier portion of the memory opening fill structure 58, as shown in FIG. 11E. Furthermore, as shown in FIG. 11F, a sidewall (i.e., periphery) 58B of the bottom surface of the inter-tier portion of the memory opening fill structure 58 is laterally offset outward from a top sidewall (i.e., periphery) 58L of the lower portion of the memory opening fill structure 58 within a first azimuthal angle range α around the geometrical center of the inter-tier portion of the memory opening fill structure 58, and is vertically coincident with the top sidewall (i.e., periphery) of the lower portion of the memory opening fill structure 58 within a second azimuthal angle range β that is a complement of the first azimuthal angle range α.

A vertical axis VA_U passing through the geometrical center of the upper portion of the memory opening fill structure 58 can be laterally offset from a vertical axis VA_L passing through the geometrical center of the lower portion of the memory opening fill structure 58 along a direction of a midpoint of the first azimuthal angle range a. The lateral offset direction between the vertical axis VA_U passing through the geometrical center of the upper portion of the memory opening fill structure 58 relative to the vertical axis VA_L passing through the geometrical center of the lower portion of the memory opening fill structure 58 can be the same as the lateral offset direction between the vertical axis VA_I passing through the geometrical center of the inter-tier portion relative to the vertical axis VA_L passing through the geometrical center of the lower portion of the memory opening fill structure 58. The vertical axis passing VA_U through the geometrical center of the upper portion of the memory opening fill structure 58 can be laterally offset from the vertical axis VA_L passing through the geometrical center of the lower portion of the memory opening fill structure 58 along a direction of the midpoint of the first azimuthal angle range α relative to the vertical axis VA_I passing through the geometrical center of the inter-tier portion.

FIGS. 12A-12D illustrate sequential vertical cross-sectional views of a fourth configuration of a memory opening during formation of a memory opening fill structure according to an embodiment of the present disclosure. The fourth configuration of the memory opening can be derived from the first configuration of the memory opening by forming the etch stop material layer 180 directly on the top surface of the topmost first sacrificial material layer 142 of the first-tier alternating stack (132, 142) at the processing steps of FIG. 3. In this case, the topmost layer of the first-tier alternating stack (132, 142) includes the topmost first sacrificial material layer 142. First-tier memory openings 149 and first-tier support openings 129 can be formed through the etch stop material layer 180 and the first-tier alternating stack (132, 142).

A sacrificial fill material can be deposited in the first-tier memory openings 149 and the first-tier support openings 129 and over the etch stop material layer 180. The sacrificial fill material can be planarized by removing the portion of the sacrificial fill material located above the horizontal plane including the top surface of the etch stop material layer 180 by performing a planarization process. Each remaining portion of the sacrificial fill material filling the first-tier memory openings 149 comprises a sacrificial memory opening fill structure 148. Each remaining portion of the sacrificial fill material filling the first-tier support openings 129 comprises a sacrificial support opening fill structure 128.

Referring to FIG. 12A, the processing steps of FIGS. 7A, 7B, and 9A can be performed to form second-tier memory openings 249 and second-tier support openings 229. Each second-tier memory opening 249 extends at least to a top surface of a respective underlying sacrificial memory opening fill structure 148. The second-tier memory opening 249 may vertically extend into a portion of the etch stop material layer 180.

The sacrificial fill material of the sacrificial memory opening fill structures 148 may provide lower etch resistance to the chemistry of the second anisotropic etch process than the materials of the first insulating layers 132 and the first sacrificial material layers 142. The etch stop material of the etch stop material layer 180 provides higher etch resistance to the chemistry of the second anisotropic etch process than the materials of the first insulating layers 132 and the first sacrificial material layers 142. Thus, even if the bottom periphery of a second-tier memory opening 249 is laterally offset from a periphery of a top surface of an underlying sacrificial memory opening fill structure 148 due to overlay variations of a lithographic process that forms the pattern of the second-tier memory openings 249 and the second-tier support openings 229, the portion of each second-tier openings 249 located outside the periphery of the top surface of a respective underlying sacrificial memory opening fill structure 148 does not extend through the etch stop material layer 180, and the first-tier alternating stack (132, 142) is not etched by the second anisotropic etch process.

Referring to FIG. 12B, the processing steps of FIG. 9B can be performed to form a stack of layers including a blocking dielectric layer 52, a charge storage layer 54, a tunneling dielectric layer 56, and a semiconductor channel material layer 60L in each of the memory openings 49 (i.e., the inter-tier memory openings 49) and the support openings 19 (i.e., the inter-tier support openings).

Referring to FIG. 12C, the processing steps of FIG. 9C can be performed to deposit a dielectric core layer in the cavities 49'. In one embodiment, a void 69 that is free of any solid or liquid material can be formed in an unfilled volume of a memory opening 49 within the first-tier structure (132, 142, 165). The horizontal portion of the dielectric core layer overlying the insulating cap layer 270 may be removed, for example, by a recess etch. The recess etch continues until top surfaces of the remaining portions of the dielectric core layer are recessed to a height between the top surface of the insulating cap layer 270 and the bottom surface of the insulating cap layer 270. Each remaining portion of the dielectric core layer constitutes a dielectric core 62.

Referring to FIG. 12D, the processing steps of FIG. 9D can be performed to form a drain region 63 within each memory opening 49 and within each support opening 19. Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 165), the second-tier structure (232, 242, 270, 265, 72), the etch stop material layer 180, the additional sacrificial material layer 342, the memory opening fill structures 58, and the support opening fill structures collectively constitute a memory-level assembly.

In one embodiment, the topmost layer of the first-tier alternating stack (132, 142) can be the topmost first sacrificial material layer 142, and the etch stop material layer 180 can be located directly on a top surface of the topmost first sacrificial material layer 142 within the first-tier alternating stack (132, 142). The etch stop material layer 180 can contact a bottom surface of the second-tier alternating stack (232, 242). The bottommost layer of the second-tier alternating stack (232, 242) may be a second sacrificial material layer 242 or a second insulating layer 232. In one embodiment, the etch stop material layer 180 consists essentially of a dielectric material.

FIGS. 13A-13D illustrate sequential vertical cross-sectional views of a fifth configuration of a memory opening during formation of a memory opening fill structure according to an embodiment of the present disclosure. The fifth configuration of the memory opening can be derived from the fourth configuration of the memory opening by depositing an sacrificial material layer 342 on the top surface of the etch stop material layer 180 prior to forming the second-tier alternating stack (232, 242). The additional sacrificial material layer 342 can have the same material composition and the same thickness as the first sacrificial material layers 142. First-tier memory openings 149 and first-tier support openings 129 can be formed through the additional sacrificial material layer 342, the etch stop material layer 180, and the first-tier alternating stack (132, 142).

A sacrificial fill material can be deposited in the first-tier memory openings 149 and the first-tier support openings 129 and over the etch stop material layer 180 and over the additional sacrificial material layer 342. The sacrificial fill material can be planarized by removing the portion of the sacrificial fill material located above the horizontal plane including the top surface of the additional sacrificial material layer 342 by performing a planarization process. Each remaining portion of the sacrificial fill material filling the first-tier memory openings 149 comprises a sacrificial memory opening fill structure 148. Each remaining portion of the sacrificial fill material filling the first-tier support openings 129 comprises a sacrificial support opening fill structure 128.

Referring to FIG. 13A, the processing steps of FIGS. 7A, 7B, and 9A can be performed to form second-tier memory openings 249 and second-tier support openings 229. Each second-tier memory opening 249 extends at least to a top surface of a respective underlying sacrificial memory opening fill structure 148, and may, or may not, extend through the additional sacrificial material layer 342. A second-tier memory opening 249 may vertically extend through the additional sacrificial material layer 342, and into a portion of the etch stop material layer 180.

The sacrificial fill material of the sacrificial memory opening fill structures 148 may provide lower etch resistance to the chemistry of the second anisotropic etch process than the materials of the first insulating layers 132 and the first sacrificial material layers 142. The etch stop material of the etch stop material layer 180 provides higher etch resistance to the chemistry of the second anisotropic etch process than the materials of the first insulating layers 132 and the first sacrificial material layers 142. Thus, even if the bottom periphery of a second-tier memory opening 249 is laterally offset from a periphery of a top surface of an underlying sacrificial memory opening fill structure 148 due to overlay variations of a lithographic process that forms the pattern of the second-tier memory openings 249 and the second-tier support openings 229, the portion of each second-tier openings 249 located outside the periphery of the top surface of a respective underlying sacrificial memory opening fill structure 148 does not extend through the etch stop material layer 180, and the first-tier alternating stack (132, 142) is not etched by the second anisotropic etch process. Further, the additional sacrificial material layer 342 provides an additional material portion that reduces etching of the etch stop material layer 180, and thus, reduces the probability of the etch stop material layer 180 being etched through during the second anisotropic etch process.

Referring to FIG. 13B, the processing steps of FIG. 9B can be performed to form a stack of layers including a blocking dielectric layer 52, a charge storage layer 54, a tunneling dielectric layer 56, and a semiconductor channel material layer 60L in each of the memory openings 49 (i.e., the inter-tier memory openings 49) and the support openings 19 (i.e., the inter-tier support openings).

Referring to FIG. 13C, the processing steps of FIG. 9C can be performed to deposit a dielectric core layer in the cavities 49'. In one embodiment, a void 69 that is free of any solid or liquid material can be formed in an unfilled volume of a memory opening 49 within the first-tier structure (132, 142, 165). The horizontal portion of the dielectric core layer overlying the insulating cap layer 270 may be removed, for example, by a recess etch. The recess etch continues until top surfaces of the remaining portions of the dielectric core layer are recessed to a height between the top surface of the insulating cap layer 270 and the bottom surface of the insulating cap layer 270. Each remaining portion of the dielectric core layer constitutes a dielectric core 62.

Referring to FIG. 13D, the processing steps of FIG. 9D can be performed to form a drain region 63 within each memory opening 49 and within each support opening 19. Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 165), the second-tier structure (232, 242, 270, 265, 72), the etch stop material layer 180, the additional sacrificial material layer 342, the memory opening fill structures 58, and the support opening fill structures collectively constitute a memory-level assembly.

In one embodiment, the topmost layer of the first-tier alternating stack (132, 142) can be the topmost first sacrificial material layer 142, and the etch stop material layer 180 can be located directly on a top surface of the topmost first sacrificial material layer 142 within the first-tier alternating stack (132, 142), and the additional sacrificial material layer 342 can contact a top surface of the etch stop material layer 180 and a bottom surface of the second-tier alternating stack (232, 242). The bottommost layer of the second-tier alternating stack (232, 242) may be a second sacrificial material layer 242 or a second insulating layer 232. In one embodiment, the etch stop material layer 180 consists essentially of a dielectric material.

FIGS. 14A-14D illustrate sequential vertical cross-sectional views of a sixth configuration of a memory opening during formation of a memory opening fill structure according to an embodiment of the present disclosure. The sixth configuration of the memory opening of FIG. 14A can be derived from the fourth configuration of the memory opening illustrated in FIG. 12A or from the fifth configuration of the memory opening illustrated in FIG. 13A by isotropically etching the etch stop material selective to the materials of the first-tier alternating stack (132, 142) and the second-tier alternating stack (232, 242). For example, a wet etch process can be performed employing an etch chemistry that etches the etch stop material of the etch stop material layer 180 selective to the materials of the first insulating layers 132, the first sacrificial material layers 142, the second insulating layers 232, the second sacrificial material layers 242, and the additional sacrificial material layer 342 (if present). A lateral recess may be formed at the level of the etch stop material layer 180. The lateral recess distance (i.e., the distance between a recessed sidewall of the etch stop material layer 180 and a most proximal portion of a sidewall of a second-tier memory opening 249) can be in a range from 3 nm to 50 nm, such as from 6 nm to 25 nm, although lesser and greater lateral recess distances can also be employed.

Referring to FIG. 14B, the processing steps of FIG. 9B can be performed to form a stack of layers including a blocking dielectric layer 52, a charge storage layer 54, a tunneling dielectric layer 56, and a semiconductor channel material layer 60L in each of the memory openings 49 (i.e., the inter-tier memory openings 49) and the support openings 19 (i.e., the inter-tier support openings).

Referring to FIG. 14C, the processing steps of FIG. 9C can be performed to deposit a dielectric core layer in the cavities 49'. In one embodiment, a void 69 that is free of any solid or liquid material can be formed in an unfilled volume of a memory opening 49 within the first-tier structure (132, 142, 165). The horizontal portion of the dielectric core layer overlying the insulating cap layer 270 may be removed, for example, by a recess etch. The recess etch continues until top surfaces of the remaining portions of the dielectric core layer are recessed to a height between the top surface of the insulating cap layer 270 and the bottom surface of the insulating cap layer 270. Each remaining portion of the dielectric core layer constitutes a dielectric core 62.

Referring to FIG. 14D, the processing steps of FIG. 9D can be performed to form a drain region 63 within each memory opening 49 and within each support opening 19. Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The in-process source-level material layers 110', the first-tier structure (132, 142, 165), the second-tier structure (232, 242, 270, 265, 72), the etch stop material layer 180, any additional sacrificial material layer 342 (if present), the memory opening fill structures 58, and the support opening fill structures collectively constitute a memory-level assembly.

In one embodiment, the topmost layer of the first-tier alternating stack (132, 142) can be the topmost first sacrificial material layer 142, and the etch stop material layer 180 can be located directly on a top surface of the topmost first sacrificial material layer 142 within the first-tier alternating stack (132, 142). An additional sacrificial material layer 342, if present, can contact a top surface of the etch stop material layer 180 and a bottom surface of the second-tier alternating stack (232, 242). Alternatively, a bottommost layer of the second-tier alternating stack (232, 242) can contact the top surface of the etch stop material layer 180. The bottommost layer of the second-tier alternating stack (232, 242) may be a second sacrificial material layer 242 or a second insulating layer 232. In one embodiment, the etch stop material layer 180 consists essentially of a dielectric material. The portions of the memory opening fill structure 58 of FIG. 14D may have the same configuration and azimuthal angle relationships as those in FIGS. 11D to 11F.

Figure 15:
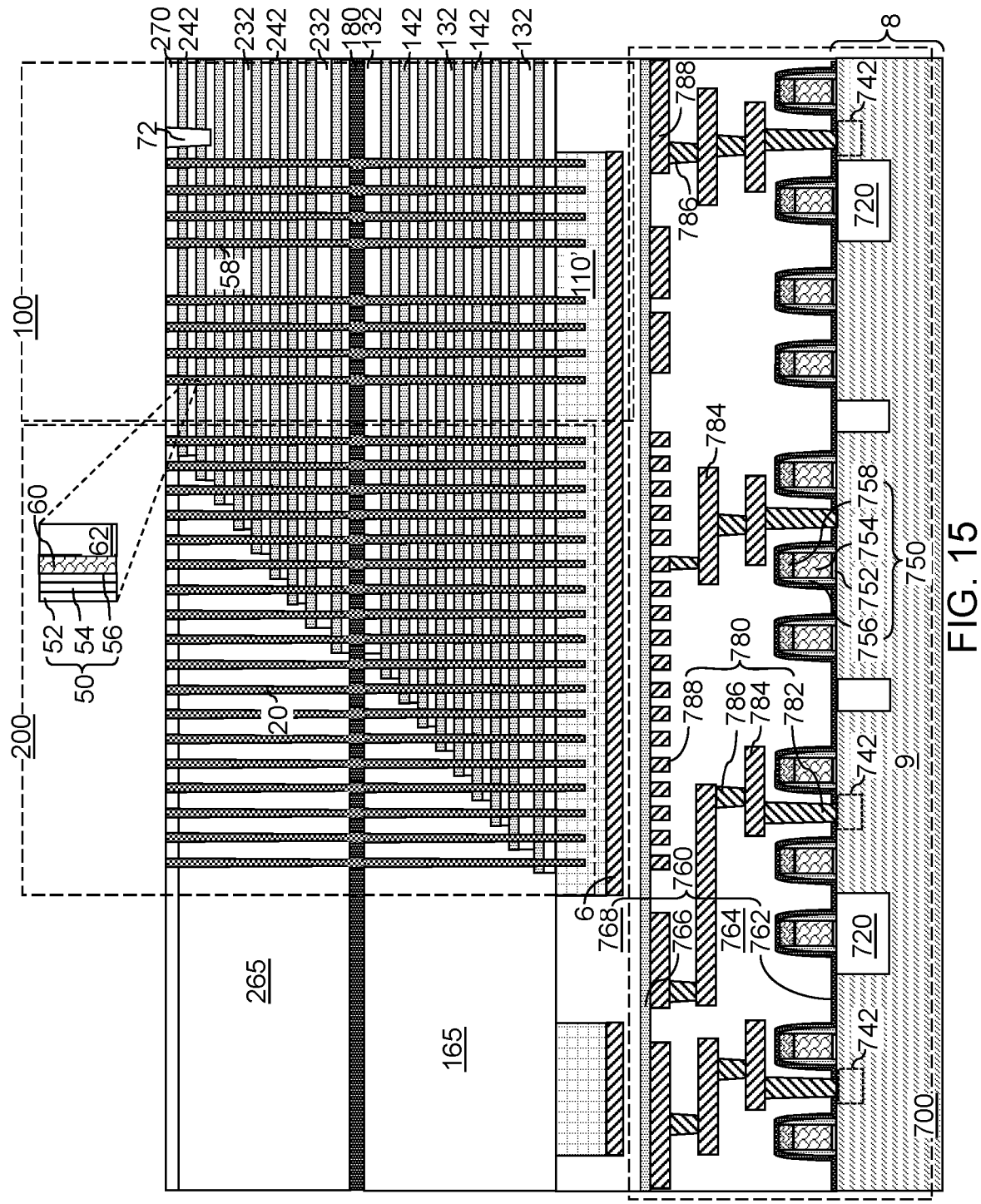
FIG. 15 is a vertical cross-sectional view of the exemplary structure after formation of memory opening fill structures and support pillar structures according to an embodiment of the present disclosure.

Referring to FIG. 15, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 16A:
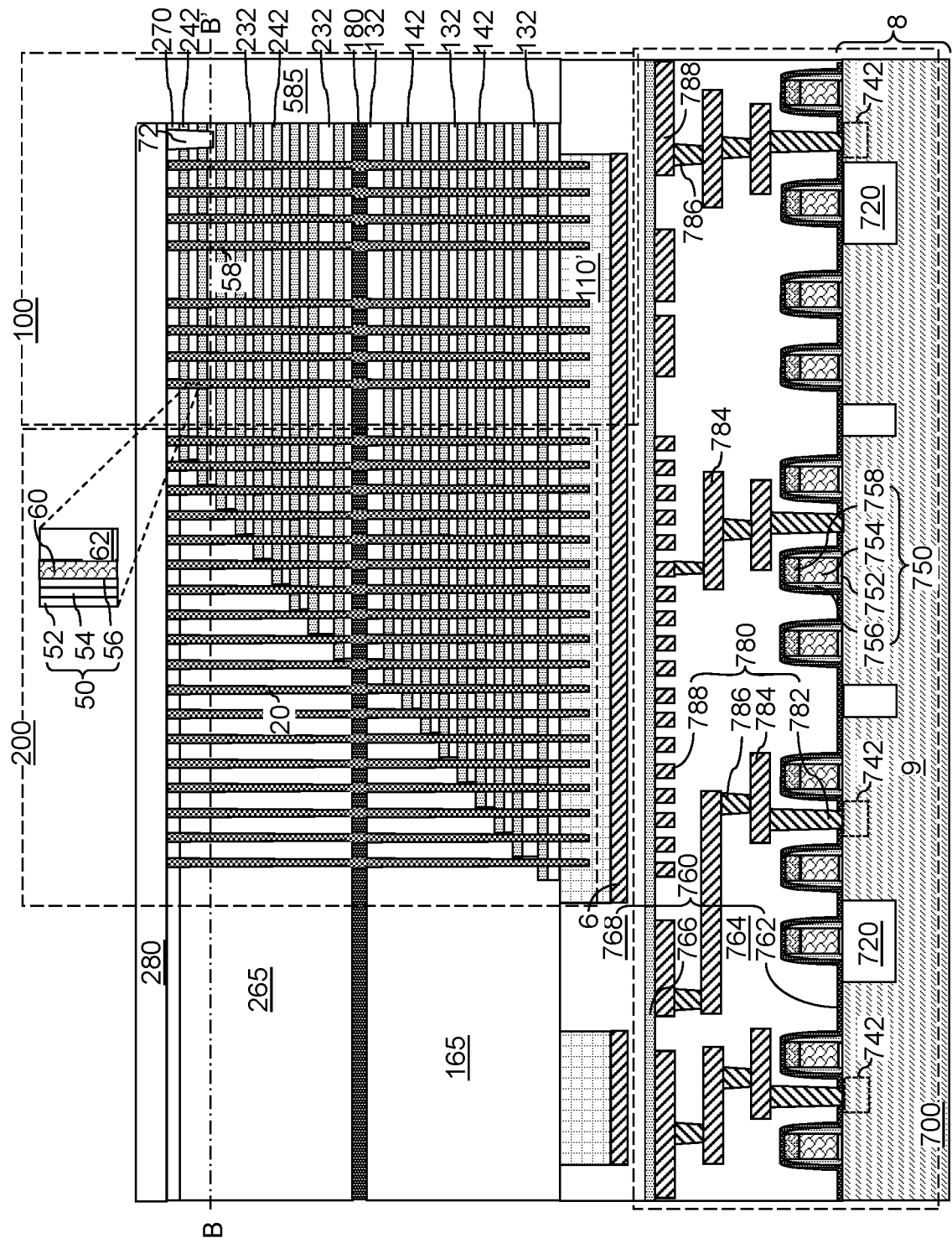
FIG. 16A is a vertical cross-sectional view of the exemplary structure after formation of a first contact-level dielectric layer and pillar cavities according to an embodiment of the present disclosure.
Figure 16B:
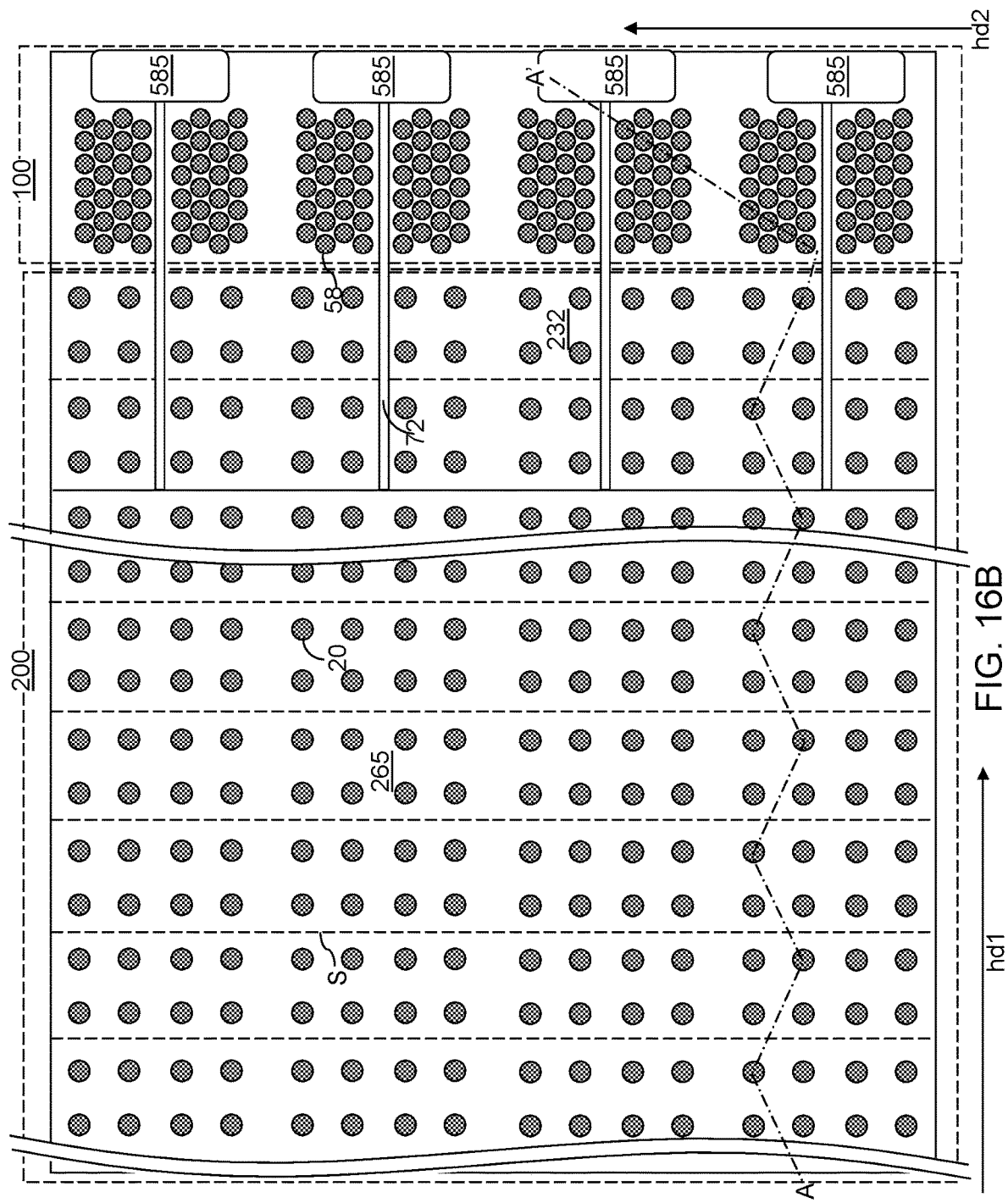
FIG. 16B is a horizontal cross-sectional view of the exemplary structure along the horizontal plane B-B' of FIG. 16A. The hinged vertical plane A-A' corresponds to the plane of the vertical cross-sectional view of FIG. 16A.

Referring to FIGS. 16A and 16B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form discrete openings within the area of the memory array region 100 in which memory opening fill structures 58 are not present. An anisotropic etch may be performed to form vertical interconnection region cavities 585 having substantially vertical sidewalls that extend through the first contact-level dielectric layer 280, the second-tier structure (232, 242, 270, 265, 72), and the first-tier structure (132, 142, 165) may be formed underneath the openings in the photoresist layer. A top surface of a lower-level metal interconnect structure 780 may be physically exposed at the bottom of each vertical interconnection region cavity 585. The photoresist layer may be removed, for example, by ashing.

Figure 17:
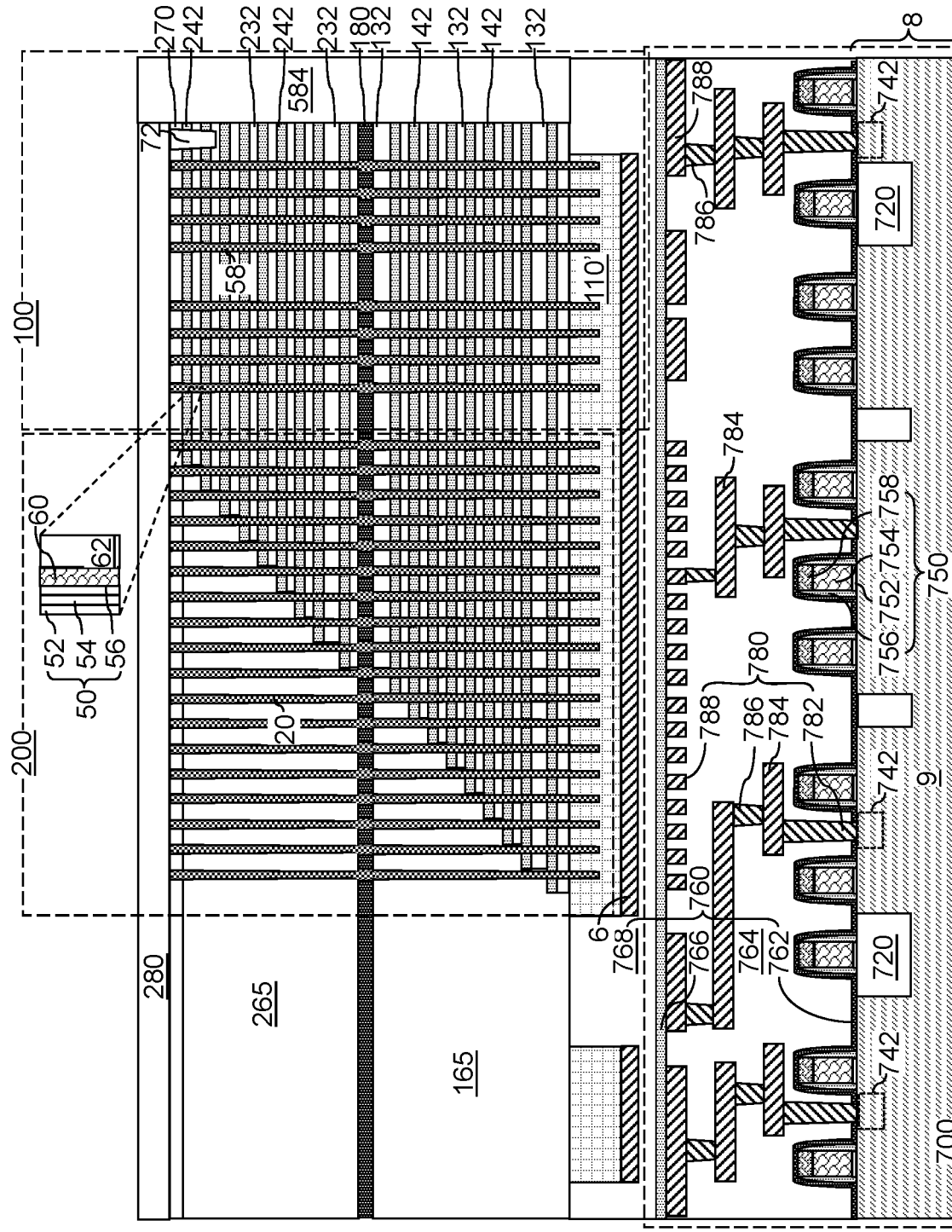
FIG. 17 is a vertical cross-sectional view of the exemplary structure after formation of dielectric pillar structures according to an embodiment of the present disclosure.

Referring to FIG. 17, a dielectric material such as silicon oxide may be deposited in the vertical interconnection region cavities 585 by a conformal deposition process (such as low pressure chemical vapor deposition) or a self-planarizing deposition process (such as spin coating). Excess portions of the deposited dielectric material may be removed from above the top surface of the first contact-level dielectric layer 280 by a planarization process. Remaining portions of the dielectric material in the vertical interconnection region cavities 585 constitute interconnection region dielectric fill material portions 584.

Figure 18A:
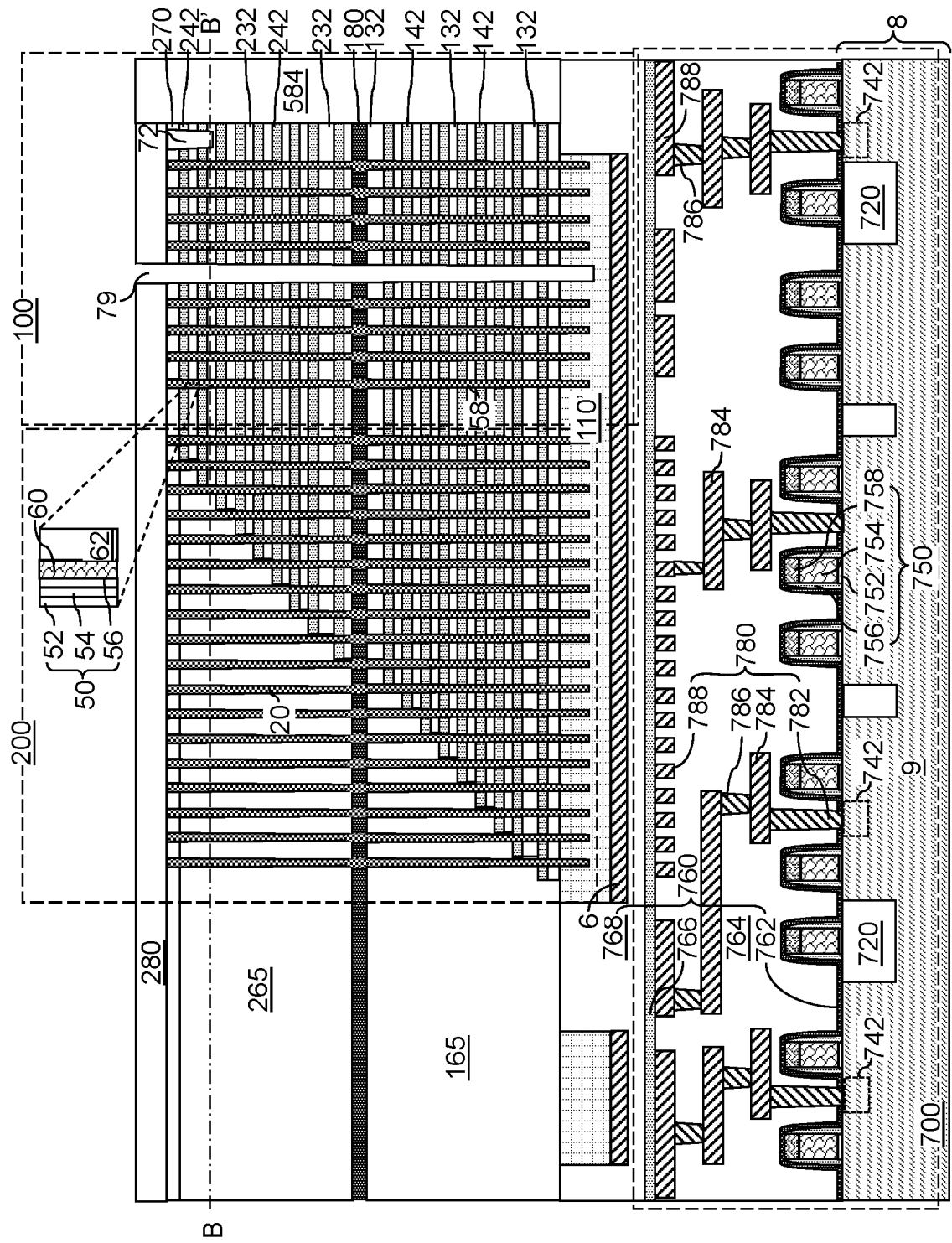
FIG. 18A is a vertical cross-sectional view of the exemplary structure after formation of backside trenches according to an embodiment of the present disclosure.
Figure 18B:
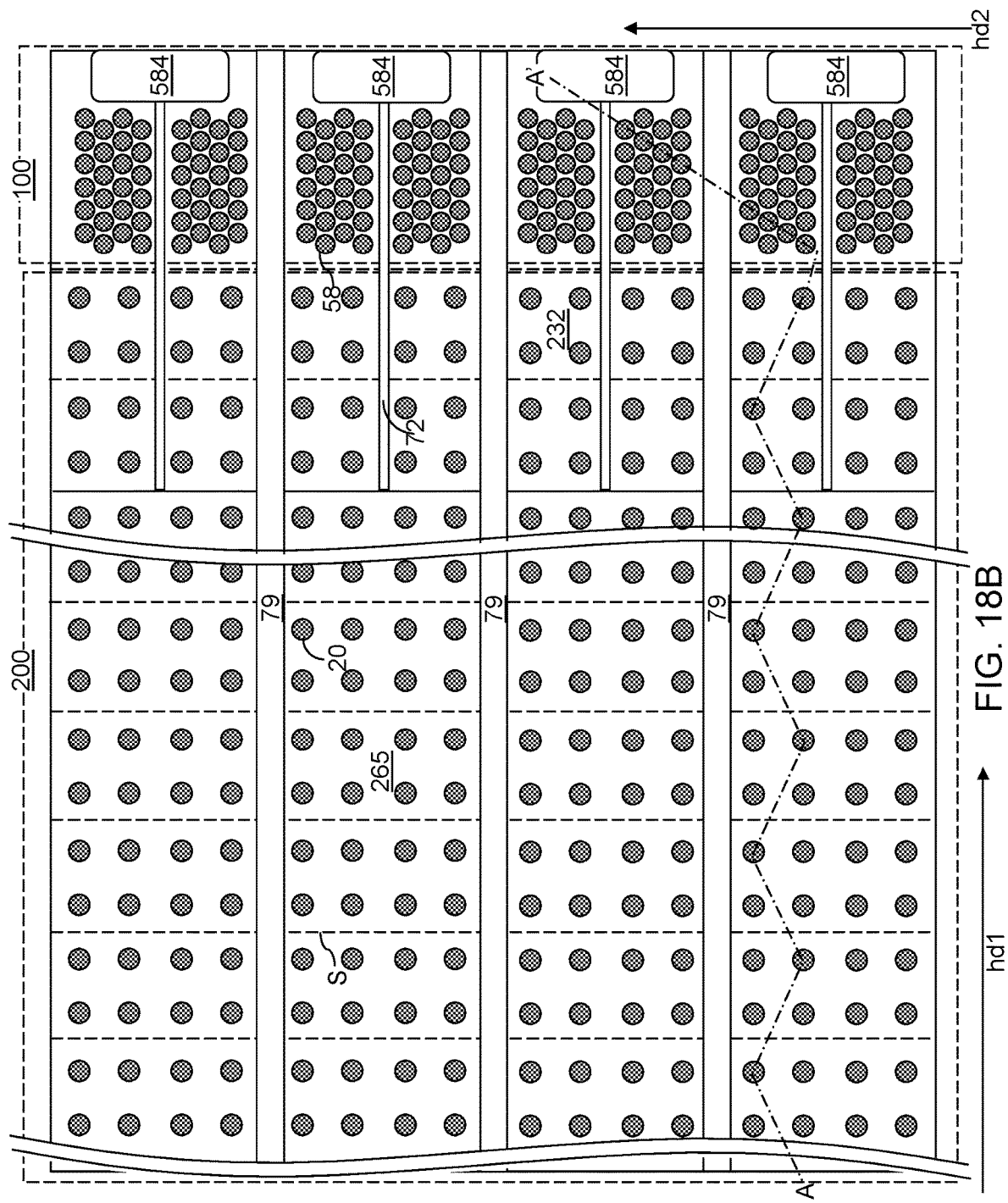
FIG. 18B is a horizontal cross-sectional view of the exemplary structure along the horizontal plane B-B' of FIG. 18A. The hinged vertical plane A-A' corresponds to the plane of the vertical cross-sectional view of FIG. 18A.

Referring to FIGS. 18A and 18B, a photoresist layer may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer (not shown) through the first contact-level dielectric layer 280, the second-tier structure (232, 242, 270, 265, 72), and the first-tier structure (132, 142, 165), and into the in-process source-level material layers 110'. Portions of the first contact-level dielectric layer 280, the second-tier structure (232, 242, 270, 265, 72), the first-tier structure (132, 142, 165), and the in-process source-level material layers 110' that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

Figure 19:
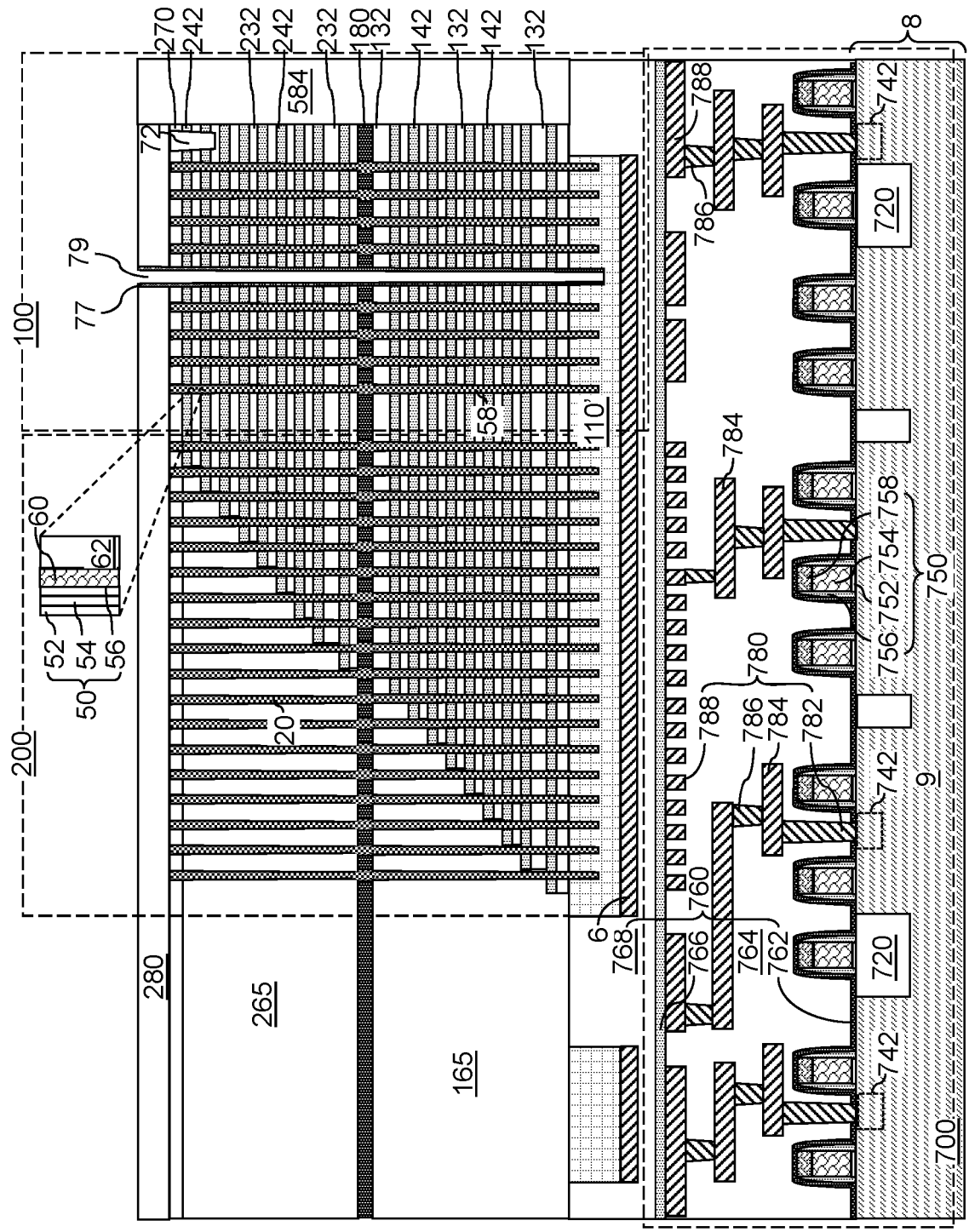
FIG. 19 is a vertical cross-sectional view of the exemplary structure after formation of backside trench spacers according to an embodiment of the present disclosure.
Figure 20A:
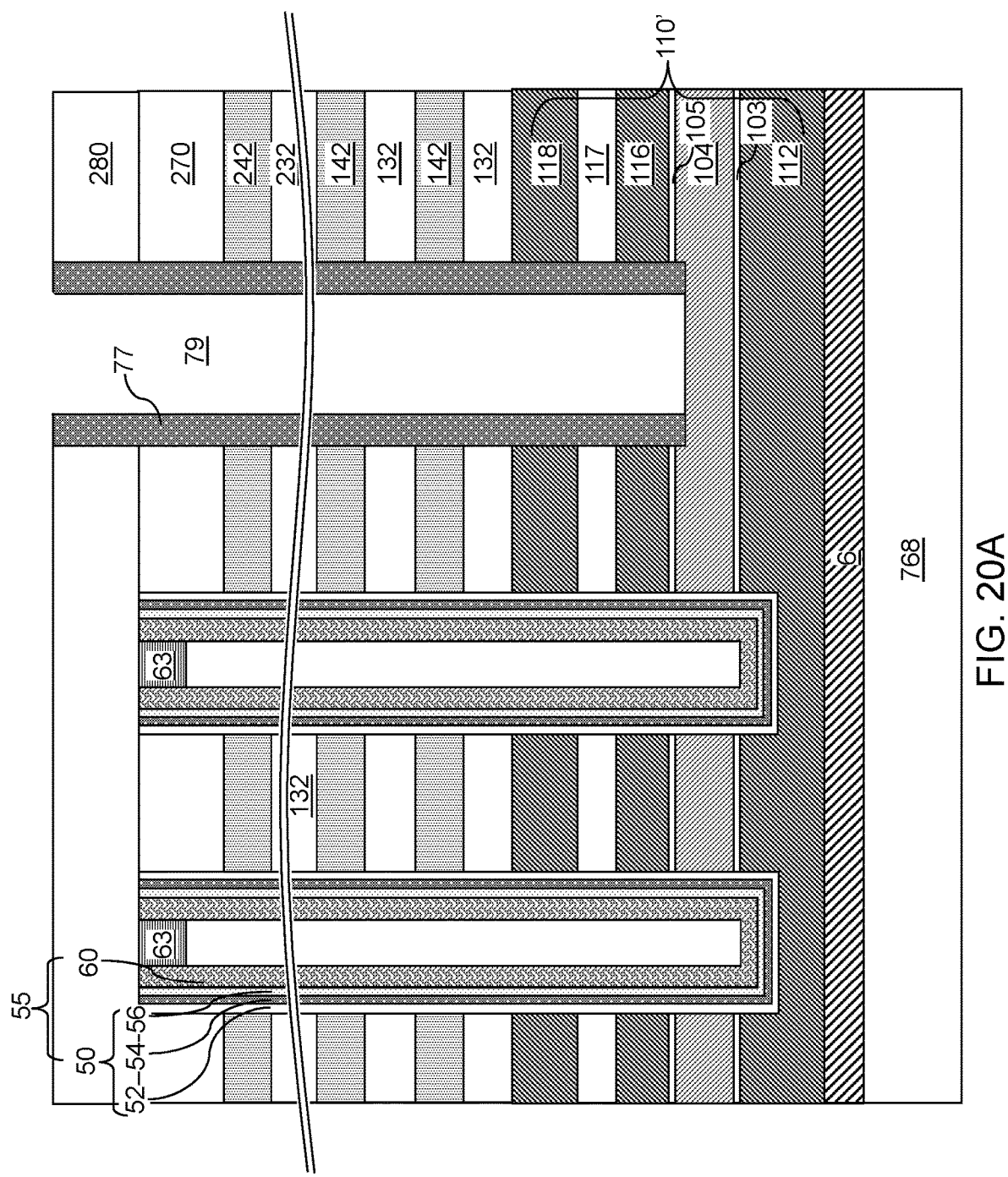
FIGS. 20A-20E illustrate sequential vertical cross-sectional views of memory opening fill structures and a backside trench during formation of source-level material layers according to an embodiment of the present disclosure.

Referring to FIGS. 19 and 20A, a backside trench spacer 77 may be formed on sidewalls of each backside trench 79. For example, a conformal spacer material layer may be deposited in the backside trenches 79 and over the first contact-level dielectric layer 280, and may be anisotropically etched to form the backside trench spacers 77. The backside trench spacers 77 include a material that is different from the material of the source-level sacrificial layer 104. For example, the backside trench spacers 77 may include silicon nitride.

Figure 20B:
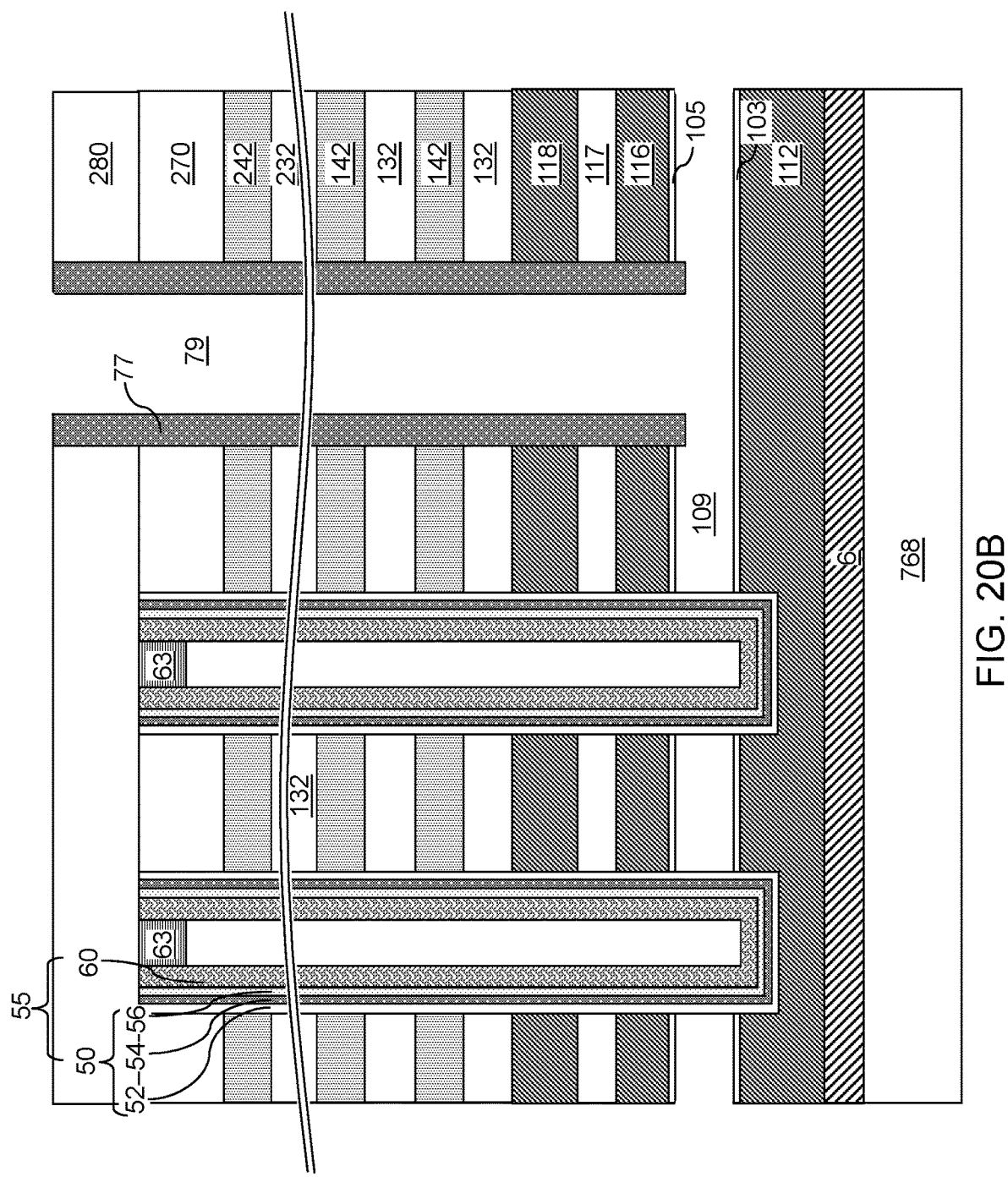

Referring to FIG. 20B, an etchant that etches the material of the source-level sacrificial layer 104 selective to the materials of the first-tier alternating stack (132, 142), the second-tier alternating stack (232, 242), the insulating cap layer 270, the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy, the backside trench spacers 77 include silicon nitride, and the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the backside trench spacers 77 and the upper and lower sacrificial liners (105, 103). A source cavity 109 is formed in the volume from which the source-level sacrificial layer 104 is removed.

Wet etch chemicals such as hot TMY and TMAH are selective to doped semiconductor materials such as the p-doped semiconductor material and/or the n-doped semiconductor material of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, even if sidewalls of the upper source-level semiconductor layer 116 are physically exposed or even if a surface of the lower source-level semiconductor layer 112 is physically exposed upon formation of the source cavity 109 and/or the backside trench spacers 77, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 is physically exposed to the source cavity 109. Specifically, each of the memory opening fill structures 58 includes a sidewall and that are physically exposed to the source cavity 109.

Figure 20C:
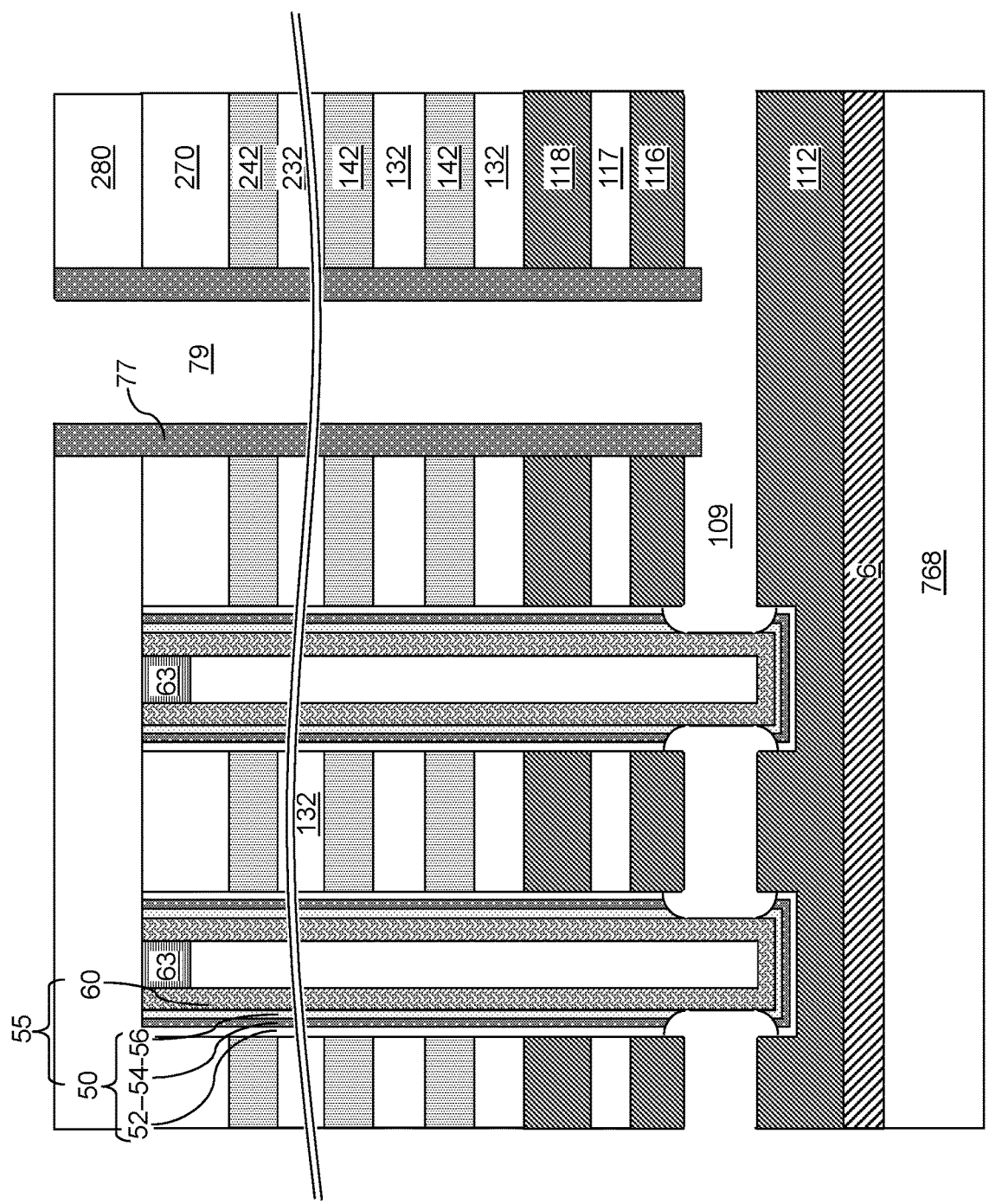

Referring to FIG. 20C, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 20D:
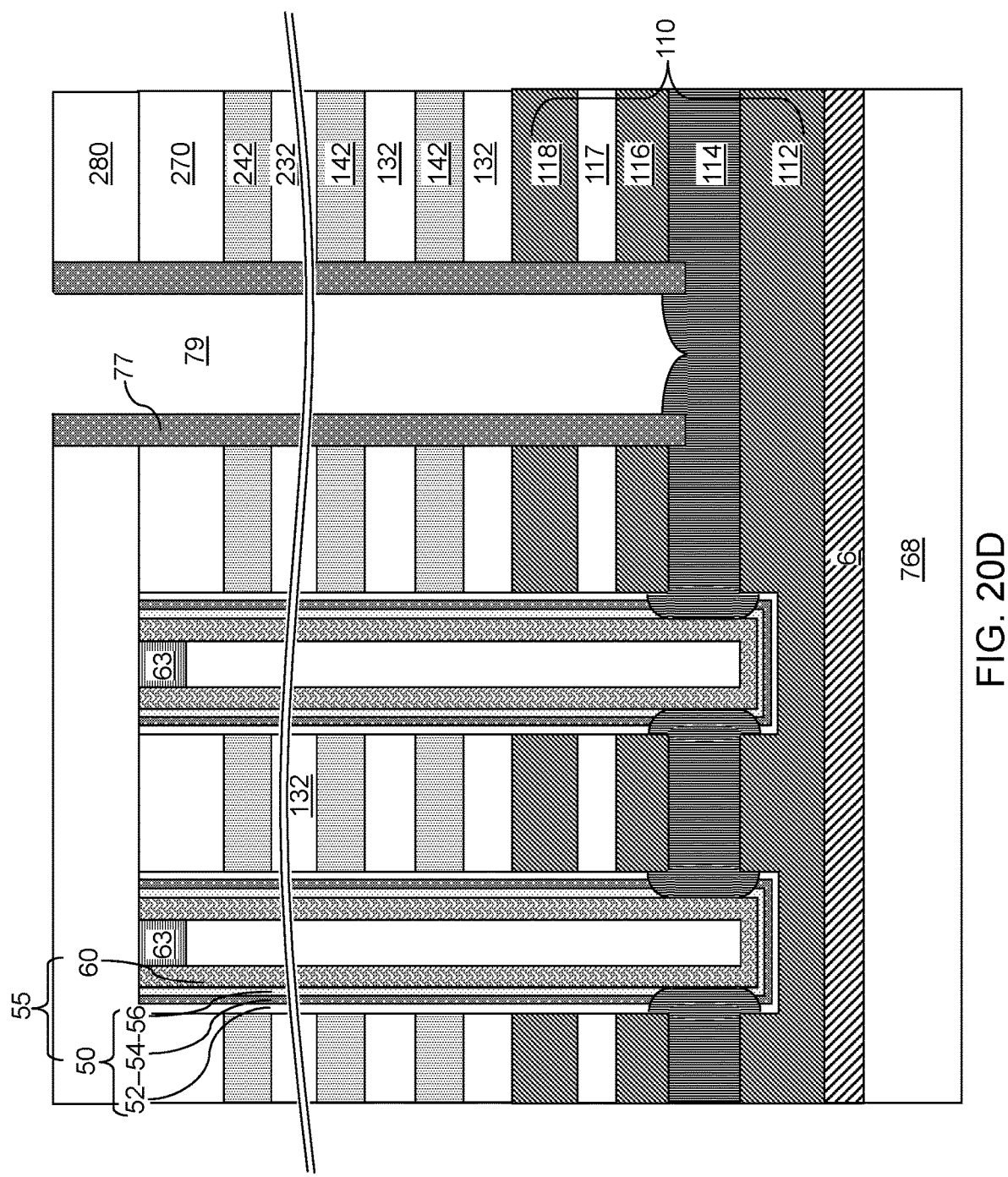

Referring to FIG. 20D, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and a dopant gas may be flowed concurrently into a process chamber including the exemplary structure during the selective semiconductor deposition process. For example, the semiconductor precursor gas may include silane, disilane, or dichlorosilane, the etchant gas may include gaseous hydrogen chloride, and the dopant gas may include a hydride of a dopant atom such as phosphine, arsine, stibine, or diborane. In this case, the selective semiconductor deposition process grows a doped semiconductor material having a doping of the second conductivity type from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114, and the source contact layer 114 contacts bottom end portions of inner sidewalls of the backside trench spacers 77. In one embodiment, the source contact layer 114 may be formed by selectively depositing a doped semiconductor material having a doping of the second conductivity type from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a buried source layer (112, 114, 116). The set of layers including the buried source layer (112, 114, 116), the source-level insulating layer 117, and the source-select-level conductive layer 118 constitutes source-level material layers 110, which replaces the in-process source-level material layers 110'.

Figure 20E:
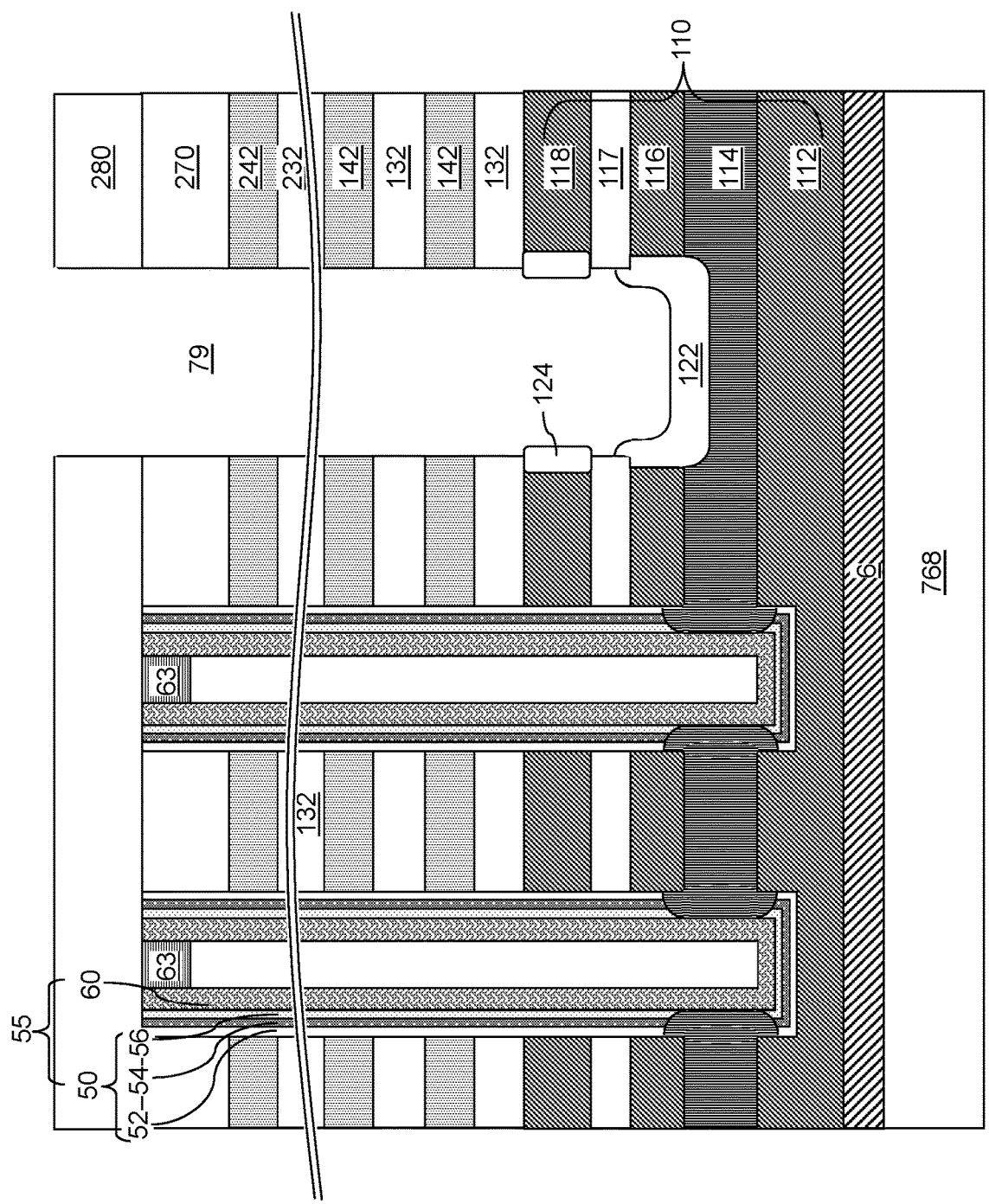
Figure 21:
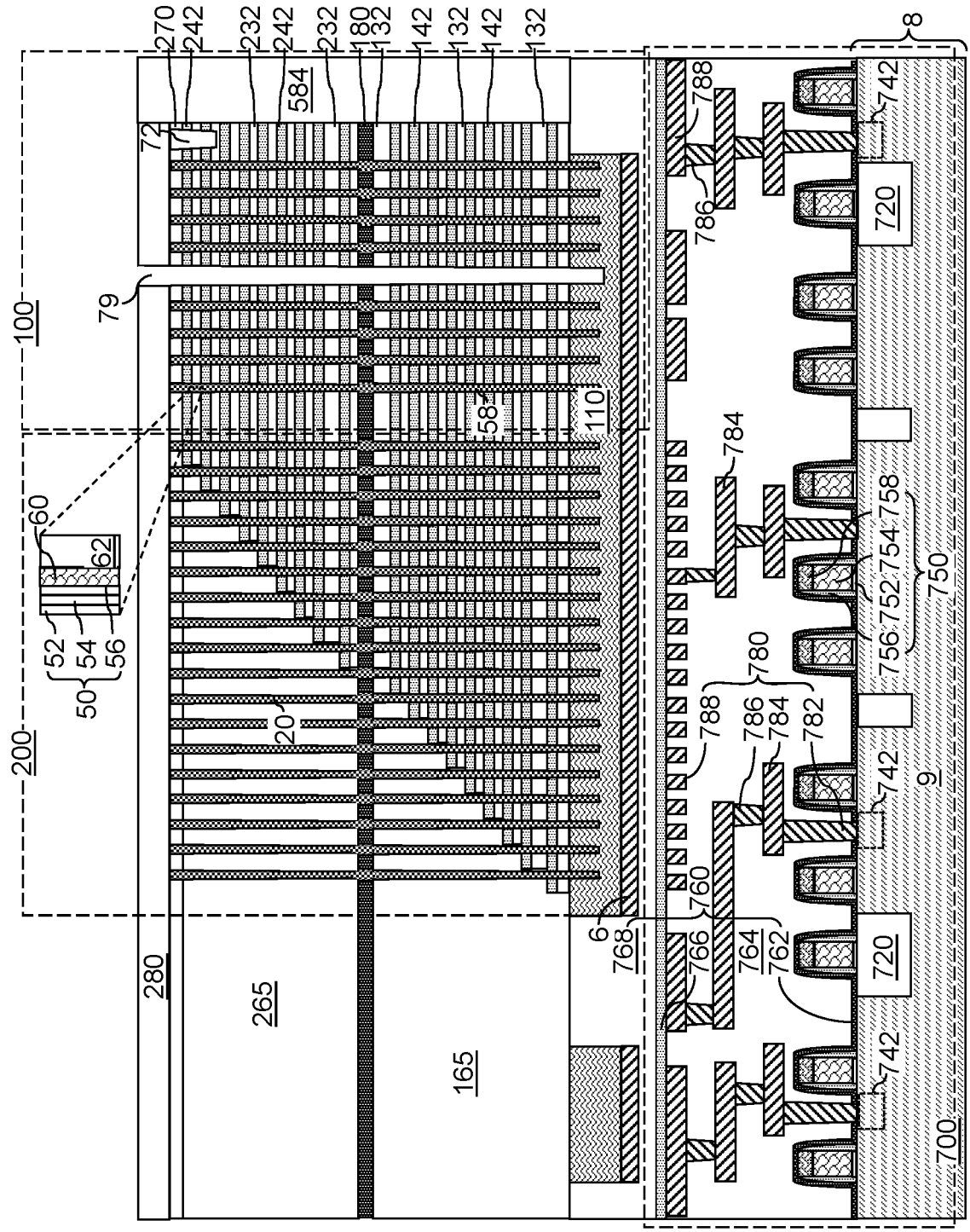
FIG. 21 is a vertical cross-sectional view of the exemplary structure after formation of source-level material layers according to an embodiment of the present disclosure.

Referring to FIGS. 20E and 21, the backside trench spacers 77 may be removed selective to the insulating layers (132, 232), the insulating cap layer 270, the first contact-level dielectric layer 280, and the source contact layer 114 using an isotropic etch process. For example, if the backside trench spacers 77 include silicon nitride, a wet etch process using hot phosphoric acid may be performed to remove the backside trench spacers 77. In one embodiment, the isotropic etch process that removes the backside trench spacers 77 may be combined with a subsequent isotropic etch process that etches the sacrificial material layers (142, 242) selective to the insulating layers (132, 232), the insulating cap layer 270, the first contact-level dielectric layer 280, and the source contact layer 114.

An oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Figure 22:
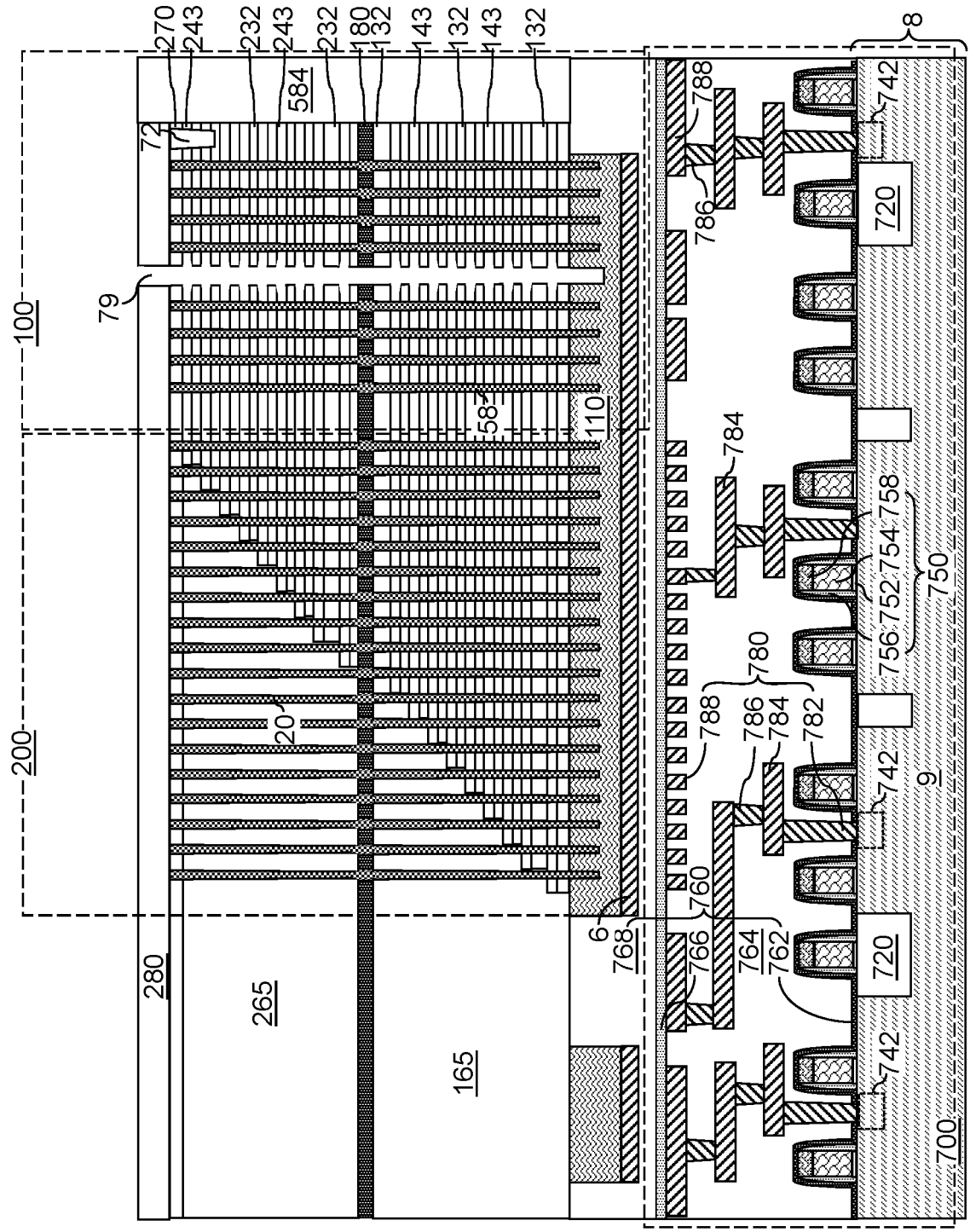
FIG. 22 is a vertical cross-sectional view of the exemplary structure after formation of backside recesses according to an embodiment of the present disclosure.

Referring to FIG. 22, the sacrificial material layers (142, 242) are removed selective to the insulating layers (132, 232), the insulating cap layer 270, the etch stop material layer 180, the first contact-level dielectric layer 280, the dielectric semiconductor oxide plates 122, and the annular dielectric semiconductor oxide spacers 124. For example, an etchant that selectively etches the materials of the sacrificial material layers (142, 242) with respect to the materials of the insulating layers (132, 232), the insulating cap layer 270, the etch stop material layer 180, the retro-stepped dielectric material portions (165, 265), and the material of the outermost layer of the memory films 50 may be introduced into the backside trenches 79 using an isotropic etch process. For example, the sacrificial material layers (142, 242) may include silicon nitride, the materials of the insulating layers (132, 232), the insulating cap layer 270, the retro-stepped dielectric material portions (165, 265), and the outermost layer of the memory films 50 may include silicon oxide materials, and the etch stop material layer 180 may include a dielectric metal oxide, a dielectric metal nitride, an elemental metal, an intermetallic alloy, a conductive metallic nitride material, carbon or a semiconductor material.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art. The horizontal surfaces of the etch stop material layer 180 may, or may not, be physically exposed to the backside recesses (143, 243) depending on whether the etch stop material layer 180 contacts the topmost first sacrificial material layer 142, the bottommost sacrificial material layer 242, and/or the additional sacrificial material layer 342. The configuration illustrated in FIG. 22 employs the first configuration, the second configuration, or the third configuration of the memory opening fill structure illustrated in FIGS. 9D, 10D, and 11D-11F in which the etch stop material layer 180 comprises, and/or consists essentially of, a dielectric material. Structures corresponding the fourth, fifth, and sixth configurations are expressly contemplated herein.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In some configuration a backside recess (143, 243) may be vertically bounded by a horizontal surface of the etch stop material layer 180 and a top surface of a topmost first insulating layer 132, or by a horizontal surface of the etch stop material layer 180 and a bottom surface of a bottommost second insulating layer 232. In one embodiment, each of the backside recesses (143, 243) may have a uniform height throughout.

In an alternative embodiment instead of forming the spacer material layers as sacrificial material layers (142, 242), the spacer material layers may be electrically conductive (e.g., metal or heavily doped polysilicon) layers that are not subsequently replaced with other layers. In this case, the backside recesses (143, 243) are omitted. If the electrically conductive layers comprise heavily doped polysilicon, then edges of the polysilicon layers exposed in the backside trenches 79 may be silicided to form metal silicide portions (e.g., tungsten silicide, titanium silicide, etc.) facing the backside trenches 79. The silicidation may be performed be performed by depositing a metal layer (e.g., tungsten or titanium) into the backside trenches 79, reacting the metal layer with the edge portions of the polysilicon layers exposed in the backside trenches 79 during an anneal, and removing any unreacted metal from the backside trenches 79 using a metal selective etch.

Figure 23A:
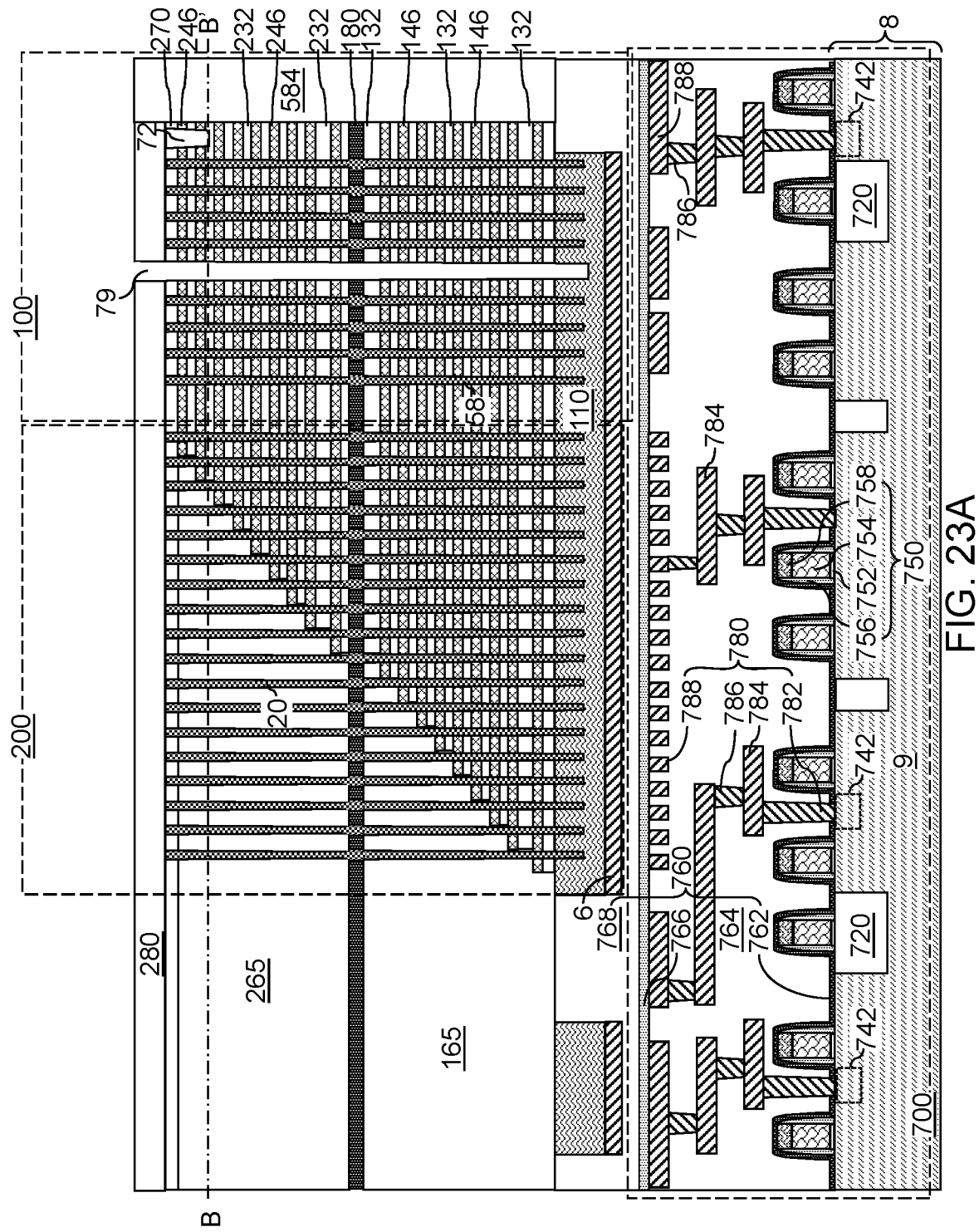
FIG. 23A is a vertical cross-sectional view of the exemplary structure after formation of electrically conductive layers according to an embodiment of the present disclosure.
Figure 23B:
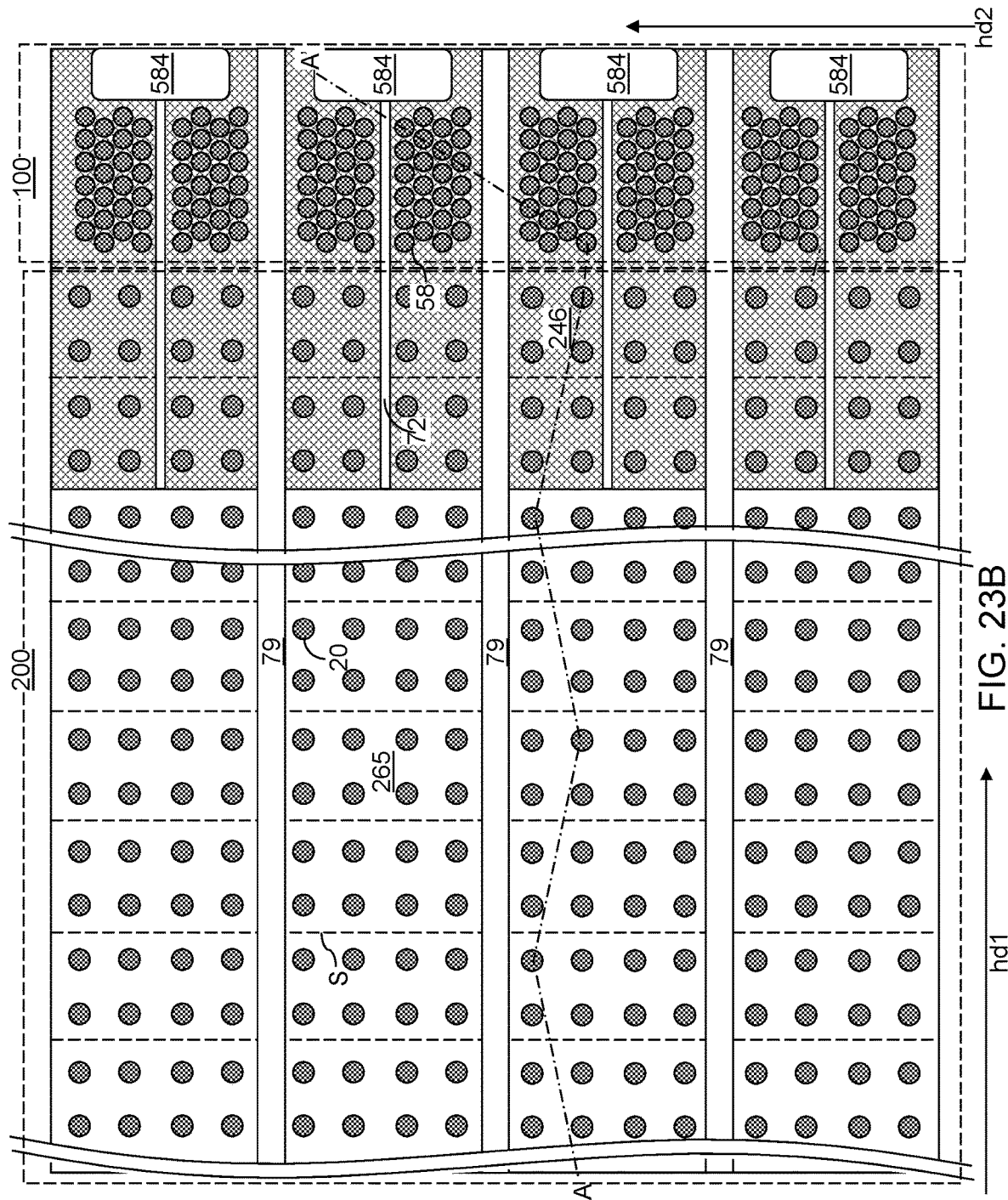
FIG. 23B is a horizontal cross-sectional view of the exemplary structure along the horizontal plane B-B' of FIG. 23A. The hinged vertical plane A-A' corresponds to the plane of the vertical cross-sectional view of FIG. 23A.

Referring to FIGS. 23A and 23B, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces. The first sacrificial material layers 142 and the second sacrificial material layers 242 are replaced with the first electrically conductive layers 146 and the second electrically conductive layers 246, respectively.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246).

Figure 24A:
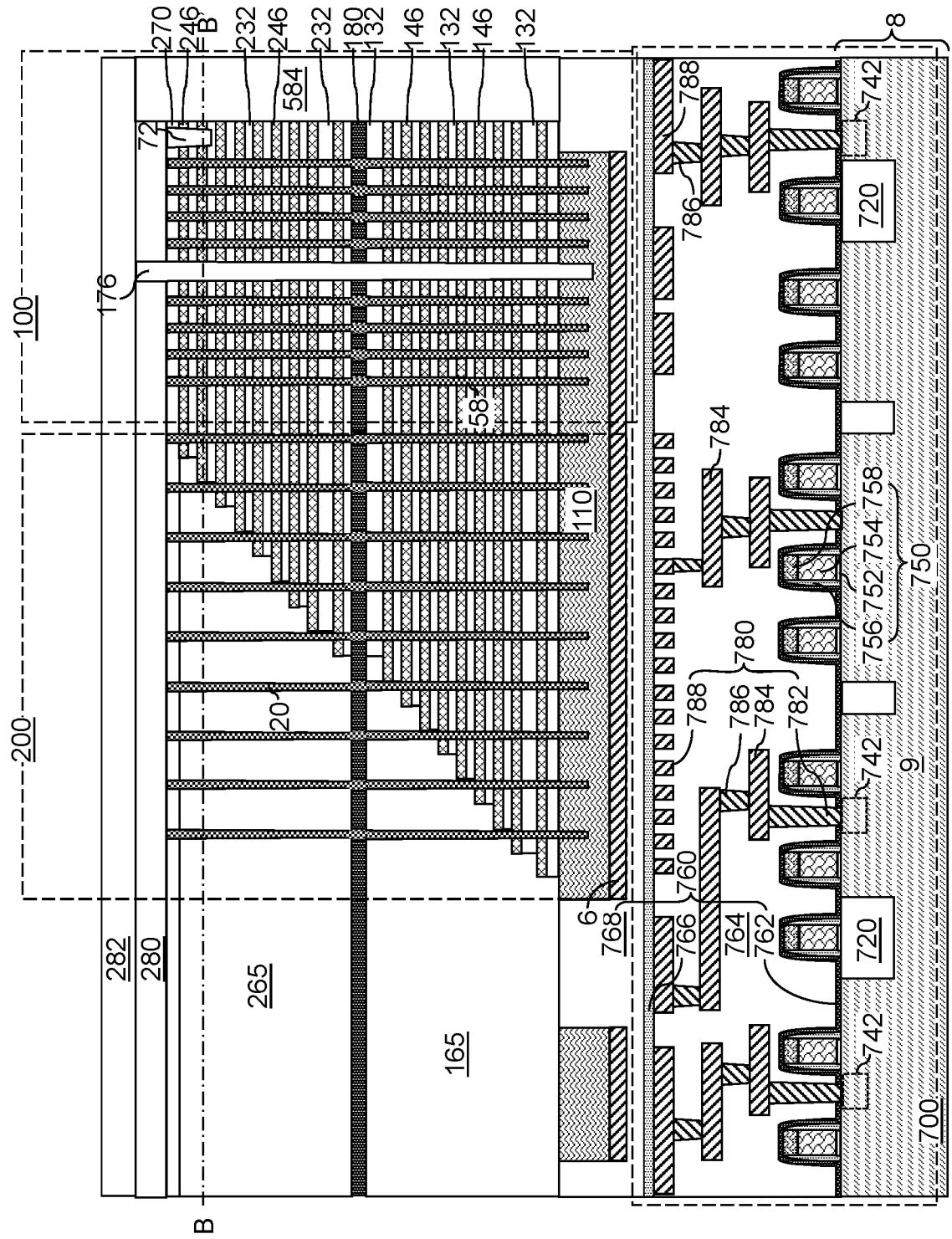
FIG. 24A is a vertical cross-sectional view of the exemplary structure after formation of backside trench fill structures in the backside trenches according to an embodiment of the present disclosure.
Figure 24B:
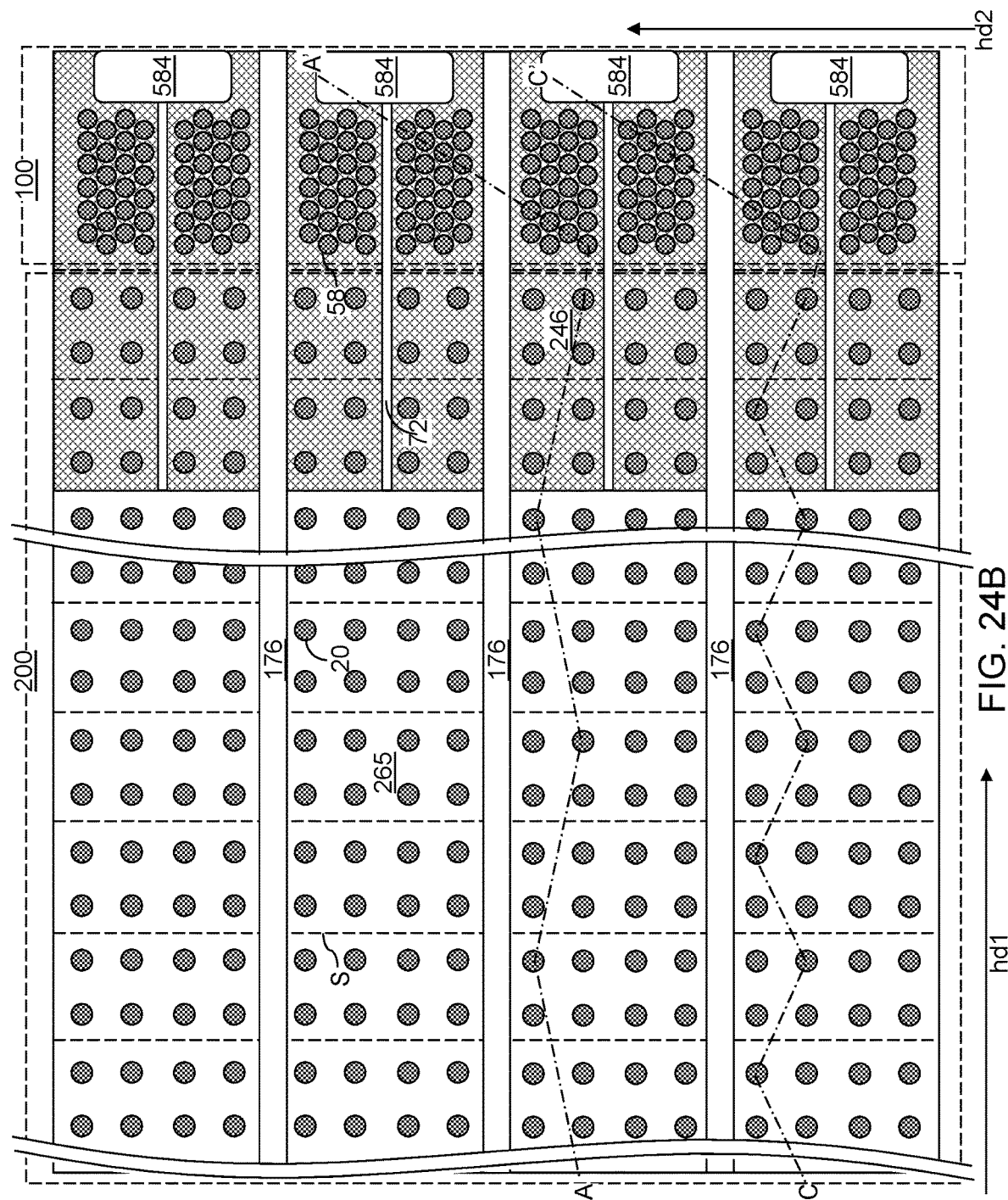
FIG. 24B is a horizontal cross-sectional view of the exemplary structure along the horizontal plane B-B' of FIG. 24A. The hinged vertical plane A-A' corresponds to the plane of the vertical cross-sectional view of FIG. 24A.
Figure 24C:
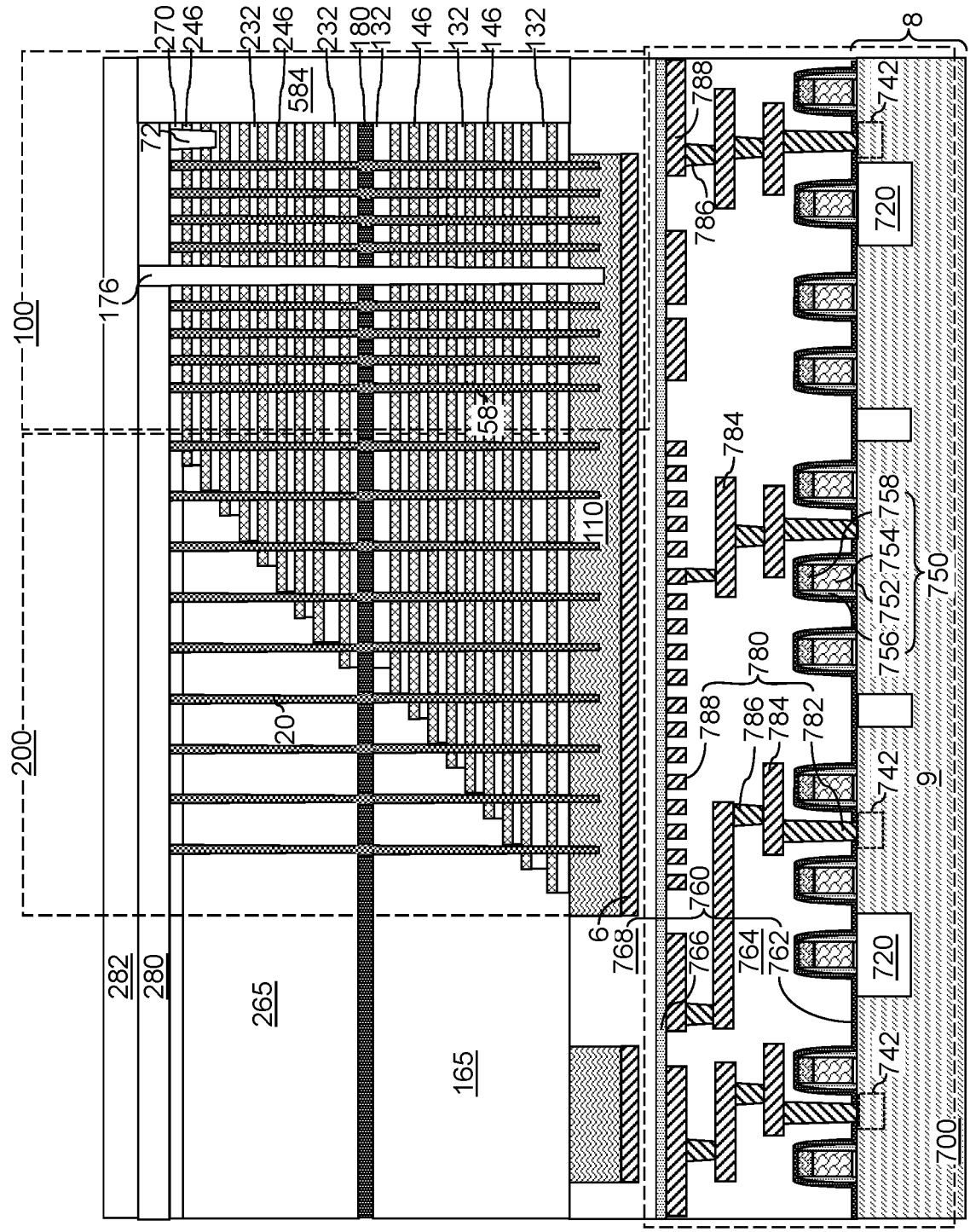
FIG. 24C is a vertical cross-sectional view of the exemplary structure along the vertical plane C-C' of FIG. 24B.

Referring to FIGS. 24A-24C, a dielectric material layer may be conformally deposited in the backside trenches 79 and over the first contact-level dielectric layer 280 by a conformal deposition process. The dielectric material layer may include, for example, silicon oxide. Each portion of the dielectric material layer that fills a backside trench 79 constitutes a dielectric wall structure 176. The horizontal portion of the dielectric material layer that is formed over the first contact-level dielectric layer 280 constitutes a second contact-level dielectric layer 282. The second contact-level dielectric layer 282 includes a dielectric material such as silicon oxide, and may have a thickness in a range from 100 nm to 600 nm, although lesser and greater thicknesses may also be used.

Figure 25A:
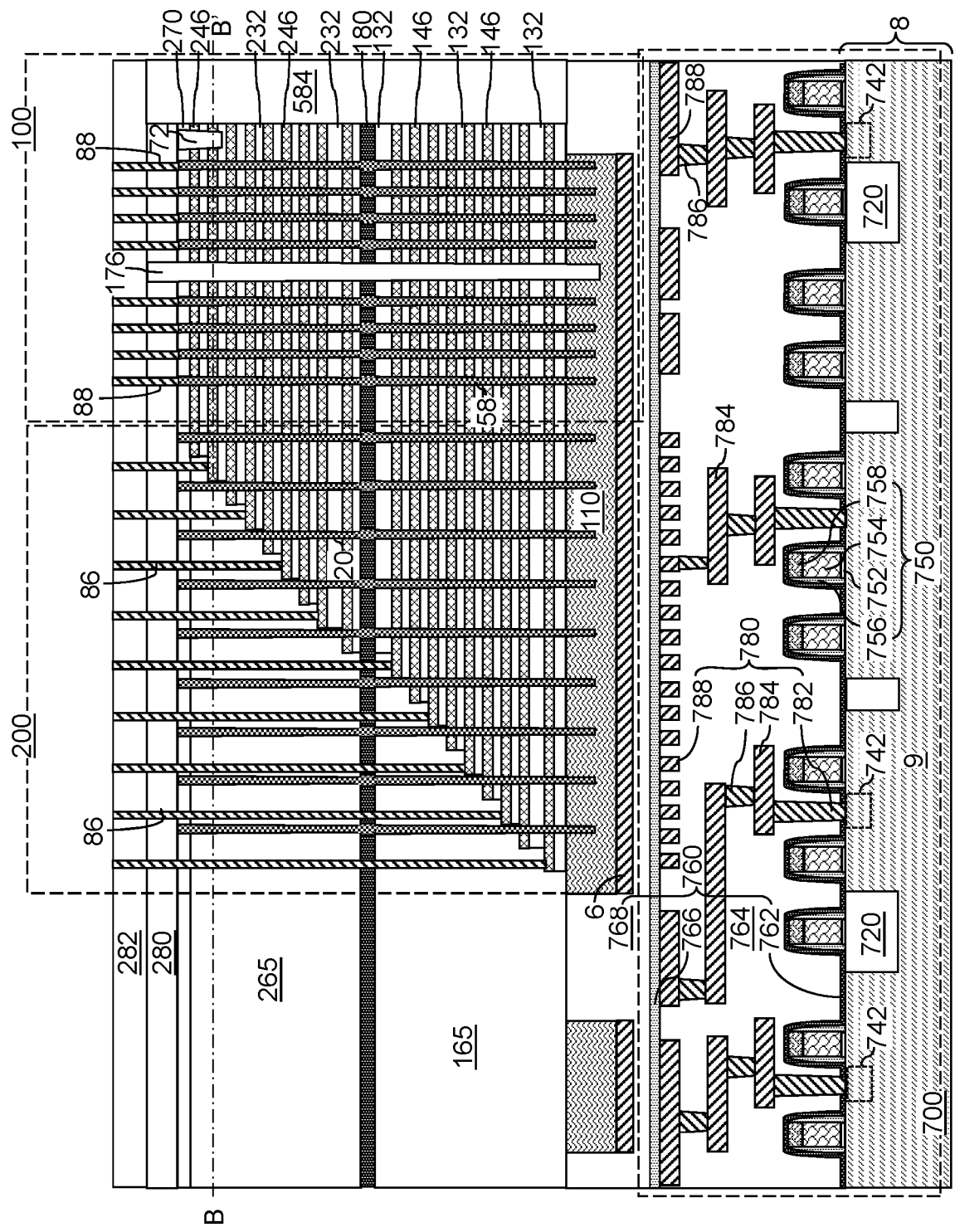
FIG. 25A is a vertical cross-sectional view of the exemplary structure after formation of a second contact-level dielectric layer and various contact via structures according to an embodiment of the present disclosure.
Figure 25B:
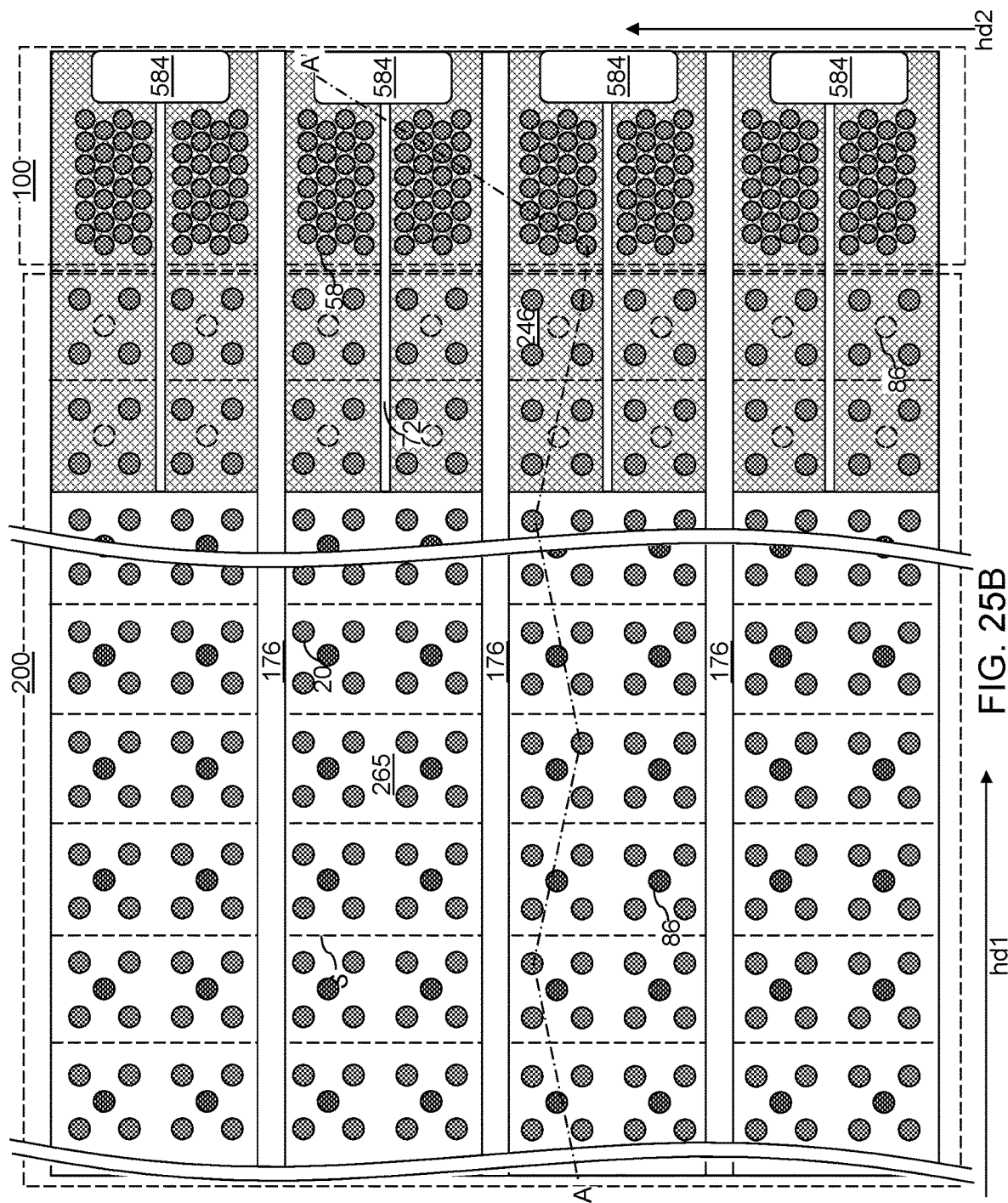
FIG. 25B is a horizontal cross-sectional view of the exemplary structure along the vertical plane B-B' of FIG. 25A. The hinged vertical plane A-A' corresponds to the plane of the vertical cross-sectional view of FIG. 25A.

Referring to FIGS. 25A and 25B, a photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 26:
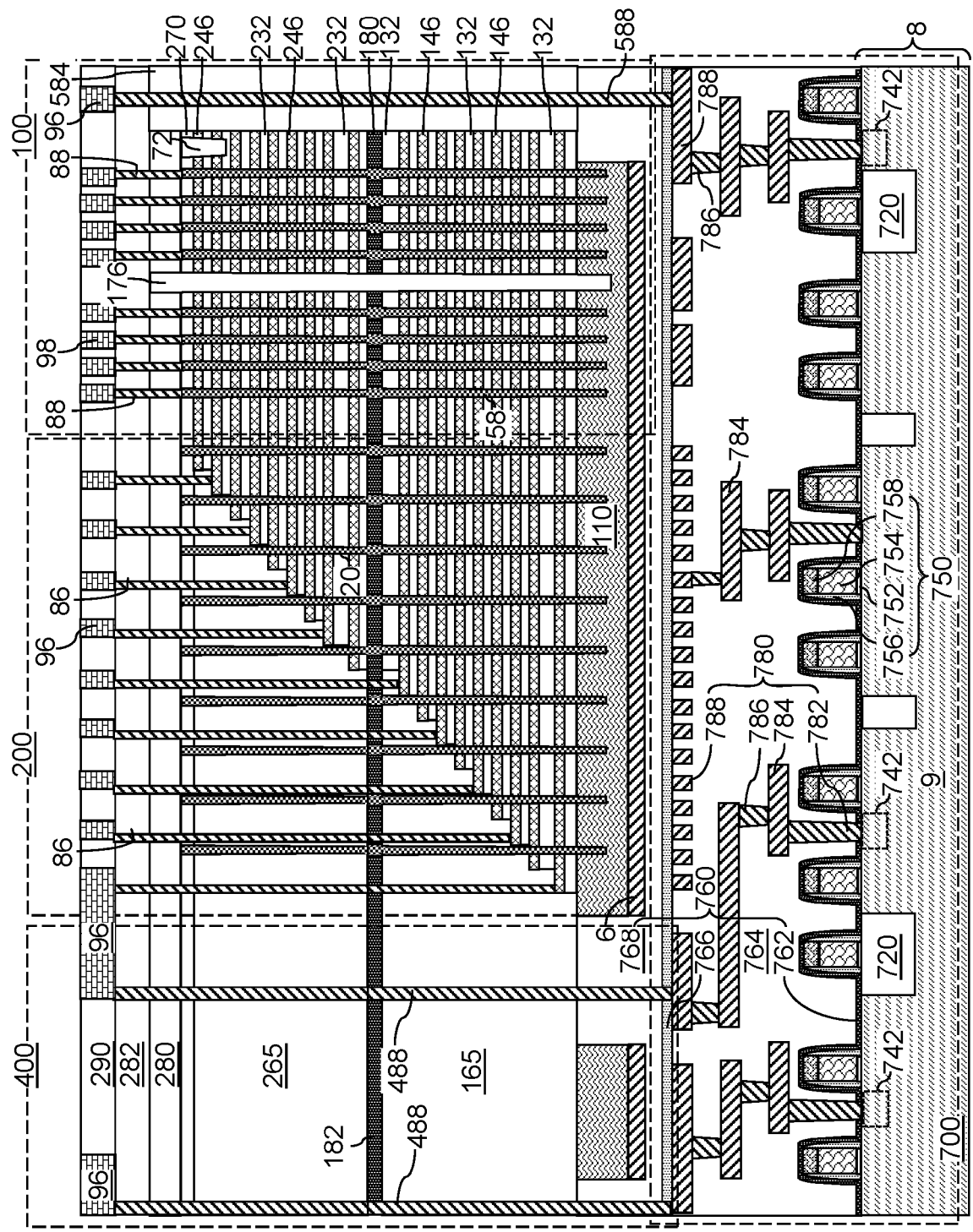
FIG. 26 is a vertical cross-sectional view of the exemplary structure after formation of through-memory-level via structures and upper metal line structures according to an embodiment of the present disclosure.

Referring to FIG. 26, peripheral-region via cavities may be formed through the second and first contact-level dielectric layers (282, 280), the second and first retro-stepped dielectric material portions (265, 165), and the drain-side dielectric layers 768 to top surfaces of a first subset of the lower-level metal interconnect structure 780 in the peripheral device region 400. Through-memory-region via cavities may be formed through the interconnection region dielectric fill material portions 584 and the drain-side dielectric layers 768 to top surfaces of a second subset of the lower-level metal interconnect structure 780. At least one conductive material may be deposited in the peripheral-region via cavities and in the through-memory-region via cavities. Excess portions of the at least one conductive material may be removed from above the horizontal plane including the top surface of the second contact-level dielectric layer 282. Each remaining portion of the at least one conductive material in a peripheral-region via cavity constitutes a peripheral-region contact via structure 488. Each remaining portion of the at least one conductive material in a through-memory-region via cavity constitutes a through-memory-region via structure 588. The peripheral-region contact via structures 488 and the through-memory-region via structures 588 are collectively referred to as through-memory-level via structures (488, 588).

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the peripheral-region contact via structures 488 and/or the through-memory-region via structures 588. The word line contact via structures (which are provided as a subset of the staircase-region contact via structures 86) may be electrically connected to the word line driver circuit through a subset of the lower-level metal interconnect structures 780 and through a subset of the peripheral-region contact via structures 488. In the illustrative exemplary structure, the etch stop material layer 180 can include, and/or can consist essentially of, a dielectric material such as silicon carbide nitride, a dielectric metal oxide such as aluminum oxide, hafnium oxide, or any other dielectric oxide of at least one transition metal, a dielectric metal nitride, or a dielectric metal oxynitride. The configuration illustrated in FIG. 26 employs the first configuration, the second configuration, or the third configuration of the memory opening fill structure illustrated in FIGS. 9D, 10D, and 11D-11F in which the etch stop material layer 180 comprises, and/or consists essentially of, a dielectric material. Structures corresponding the third, fourth, fifth, and sixth configurations are expressly contemplated herein.

In one embodiment, the three-dimensional memory device comprises a monolithic three-dimensional NAND memory device, the electrically conductive layers (146, 246) comprise, or are electrically connected to, a respective word line of the monolithic three-dimensional NAND memory device, the substrate 8 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive layers (146, 246) comprise a plurality of control gate electrodes having a strip shape extending substantially parallel to the top surface of the substrate 8, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 8, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Figure 27:
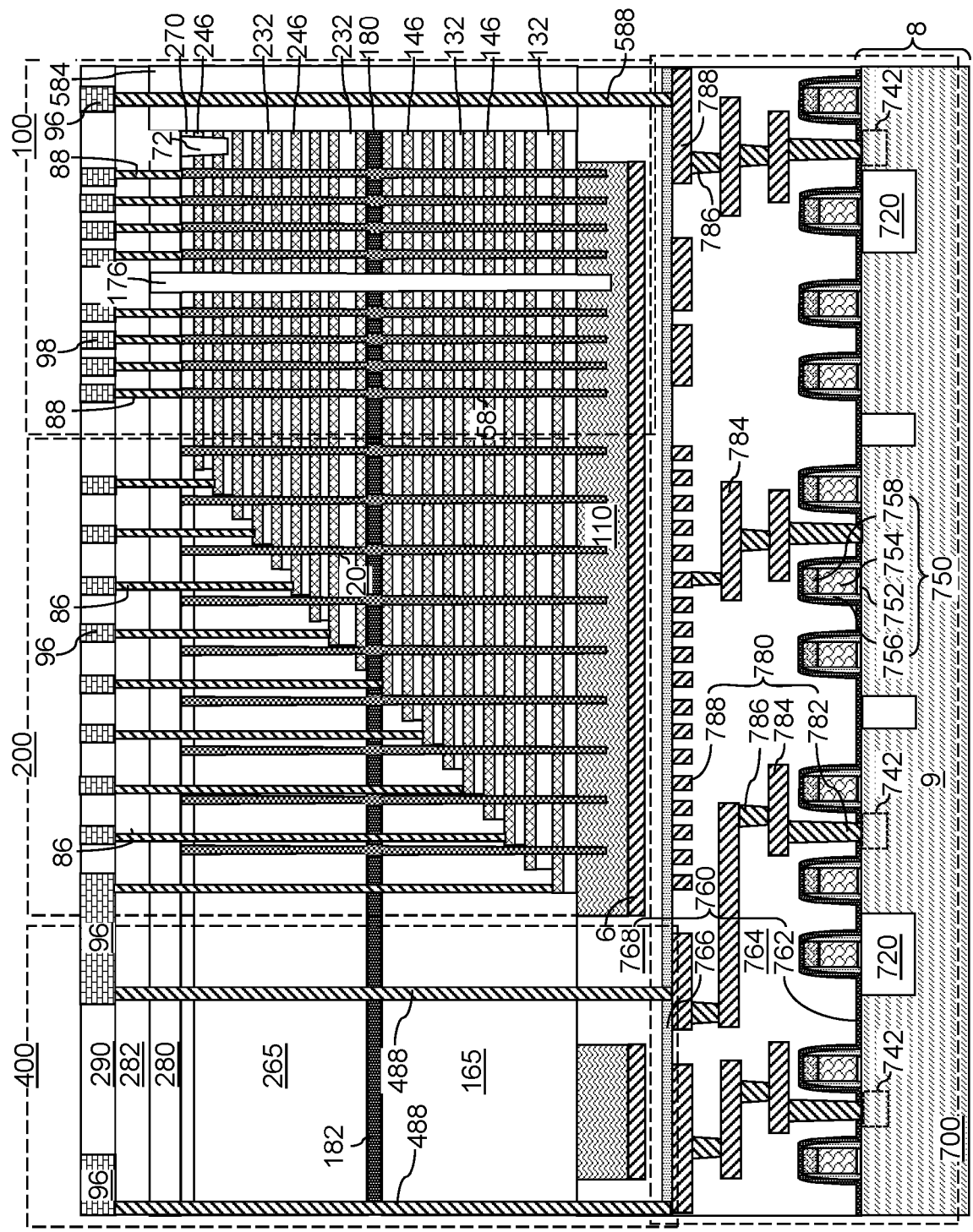
FIG. 27 is a vertical cross-sectional view of a first alternative configuration of the exemplary structure after formation of through-memory-level via structures and upper metal line structures according to an embodiment of the present disclosure.

Referring to FIG. 27 is a vertical cross-sectional view of a first alternative configuration of the exemplary structure after formation of through-memory-level via structures (488, 588) and upper metal line structures (96, 98) according to an embodiment of the present disclosure. The configuration illustrated in FIG. 27 employs the fourth configuration, the fifth configuration, or the sixth configuration of the memory opening fill structure illustrated in FIGS. 12D, 13D, and 14D in which the etch stop material layer 180 comprises, and/or consists essentially of, a dielectric material.

Figure 28:
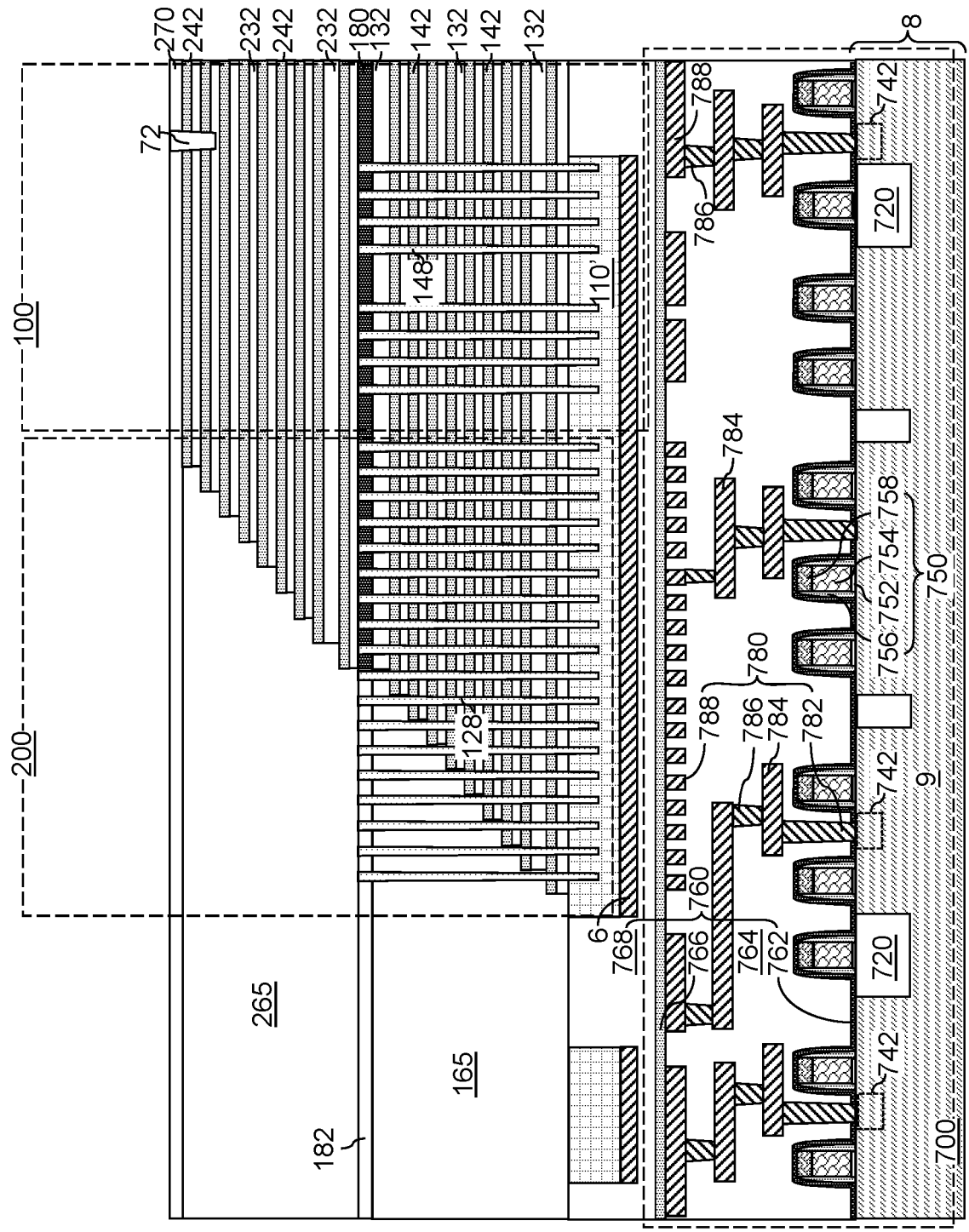
FIG. 28 is a vertical cross-sectional view of a second alternative configuration of the exemplary structure after formation of a second-tier structure according to an embodiment of the present disclosure.

Referring to FIG. 28, a second alternative configuration of the exemplary structure can be derived from the first exemplary structure illustrated in FIG. 6 by employing a combination of an etch stop material layer 180 and an inter-tier insulating layer 182 at a same level, i.e., at the level of the etch stop material layer 180 within the structure of FIG. 6. In this case, the etch stop material layer 180 may include a sacrificial dielectric material that is subsequently replaced with an electrically conductive material, a sacrificial conductive material that is subsequently replaced with an electrically conductive material, a sacrificial semiconductor material that is subsequently replaced with an electrically conductive material, or a non-sacrificial (i.e., permanent) conductive material that remains in the final device structure. The first stepped surfaces include a vertical surface of the etch stop material layer 180, and may include a portion of the top surface of the etch stop material layer 180. The inter-tier insulating layer 182 may be formed as an upper portion of the first retro-stepped dielectric material portion 165. In other words, the inter-tier insulating layer 182 and the first retro-stepped dielectric material portion 165 can be formed as a single continuous structure having a same material composition. Alternatively, the inter-tier insulating layer 182 can be formed after formation of the first retro-stepped dielectric material portion 165 and after deposition and patterning of the etch stop material layer 180 over the first retro-stepped dielectric material portion. The top surface of the inter-tier insulating layer 182 can be coplanar with the top surface of the etch stop material layer 180.

Figure 29:
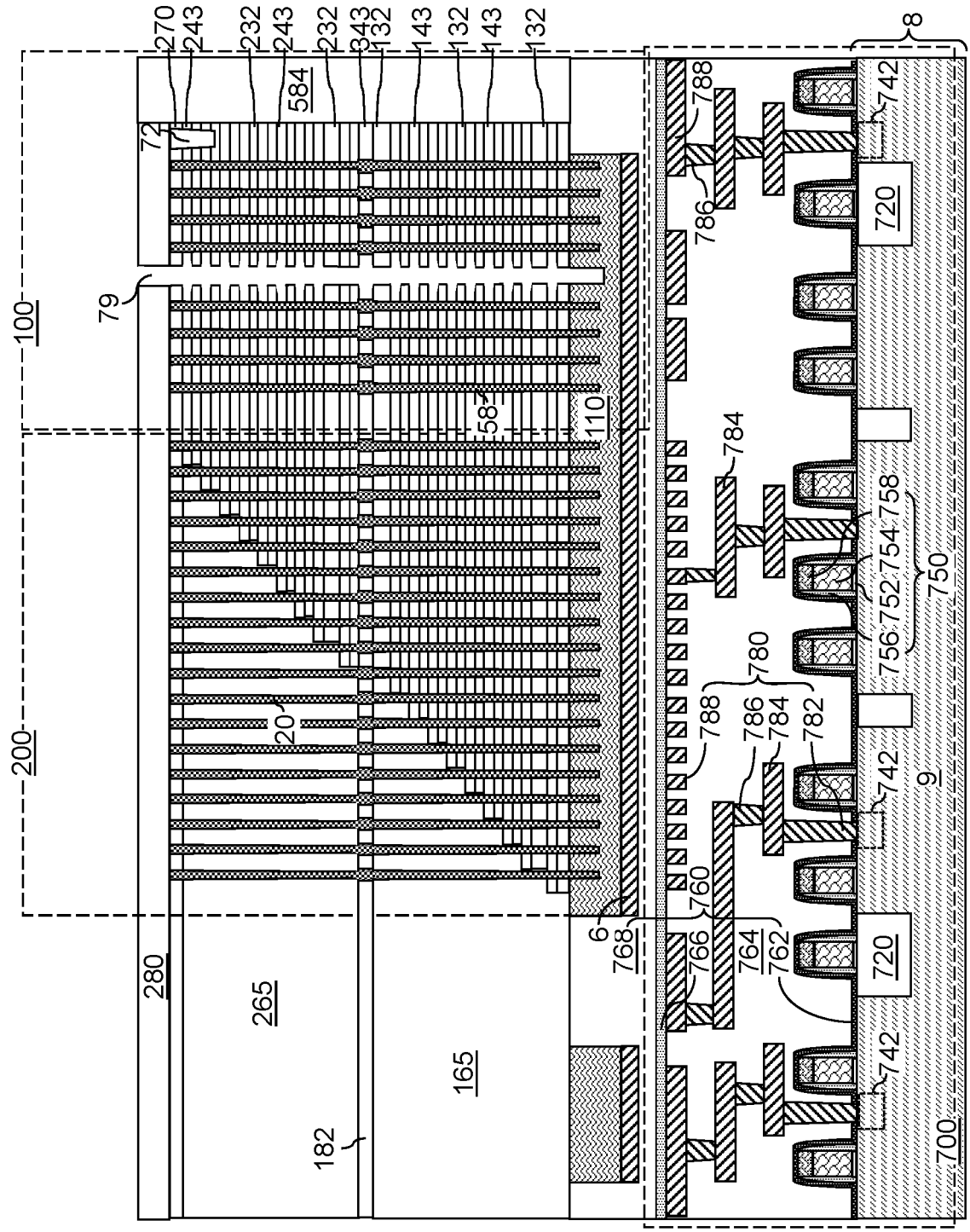
FIG. 29 is a vertical cross-sectional view of the second alternative configuration of the exemplary structure after formation of backside recesses and an inter-tier backside recess according to an embodiment of the present disclosure.

Referring to FIG. 29, the processing steps of FIGS. 7A-22 can be subsequently performed. In case the etch stop material layer 180 includes a sacrificial dielectric material, a sacrificial conductive material, or a sacrificial semiconducting material, an inter-tier backside recess 343 can be formed in addition to the first backside recesses 143 and the second backside recesses 243. In this case, the inter-tier backside recess 343 can be formed, for example, by performing the isotropic etch process of FIG. 22 that forms the first backside recesses 143 and the second backside recesses 243, and by performing an additional isotropic etch process that isotropically etches the etch stop material of the etch stop material layer 180 selective to the materials of the insulating layers (132, 232), the insulating cap layer 270, the etch stop material layer 180, the first contact-level dielectric layer 280, the dielectric semiconductor oxide plates 122, and the annular dielectric semiconductor oxide spacers 124. The additional isotropic etch process may be performed prior to, or after, performing the selective isotropic etch process that removes the first sacrificial material layers 142 and the second sacrificial material layers 242. In case the etch stop material layer 180 includes a non-sacrificial conductive material, the etch stop material layer 180 is not etched at this processing step.

Figure 30:
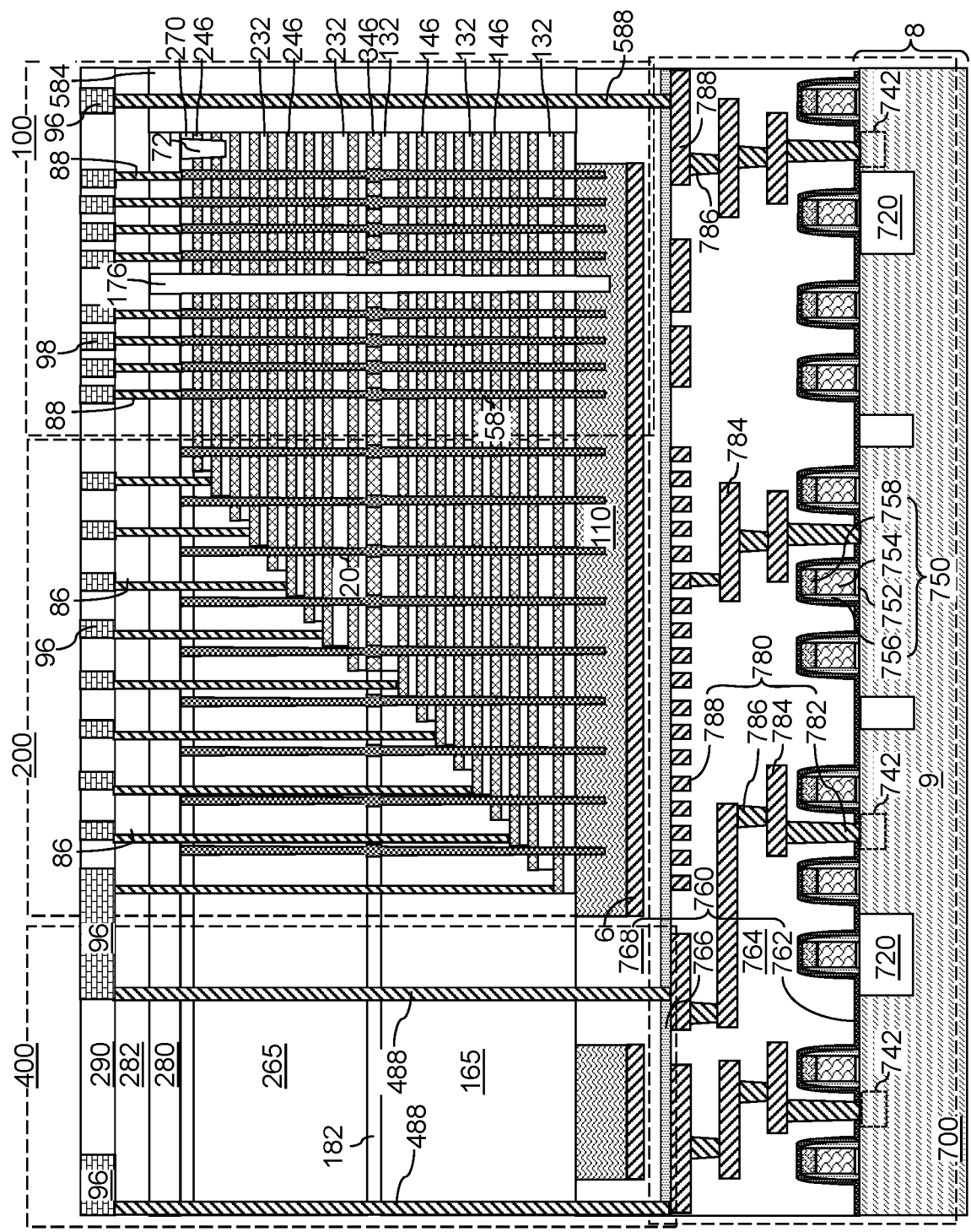
FIG. 30 is a vertical cross-sectional view of the second alternative configuration of the exemplary structure after formation of through-memory-level via structures and upper metal line structures according to an embodiment of the present disclosure.

Referring to FIG. 30, the processing steps of FIGS. 23A-26 can be performed to provide the second alternative configuration of the exemplary structure illustrated in FIG. 30. In case the etch stop material layer 180 includes a sacrificial dielectric material, a sacrificial conductive material, or a sacrificial semiconducting material, an inter-tier electrically conductive layer 346 can be formed in the volume of the inter-tier backside recesses 343 concurrently with formation of the first electrically conductive layers 146 and the second electrically conductive layers 246. In this case, the inter-tier electrically conductive layer 346 can have the same material composition as the first electrically conductive layers 146 and the second electrically conductive layers 246. Alternatively, if the etch stop material layer 180 includes a non-sacrificial conductive material, the etch stop material layer 180 can be provided at the location of the inter-tier electrically conductive layer 346. In this case, the etch stop material layer 180 can function as an inter-tier electrically conductive layer, and may have a different material composition than, or may have the same material composition as, the first electrically conductive layers 146 and the second electrically conductive layers 246.

Generally, if the etch stop material layer 180 includes a sacrificial material, an inter-tier backside recess 343 can be formed by removing the etch stop material layer 180 selective to the first insulating layers 132, the second insulating layers 232, and the memory stack structures 55 by performing an inter-tier isotropic etch process, which may be an additional isotropic etch process other than the isotropic etch process that forms the first backside recesses 143 and the second backside recesses 243, or may be the same isotropic etch process as the isotropic etch process that forms the first backside recesses 143 and the second backside recesses 243. If the inter-tier isotropic etch process is different from the isotropic etch process that forms the first backside recesses 143 and the second backside recesses 242, the inter-tier isotropic etch process may be performed prior to, or after, the selective isotropic etch process. In one embodiment, the inter-tier isotropic etch process may etch the material of the etch stop material layer 180 selective to materials of the first-tier alternating stack (132, 142) and the second-tier alternating stack (232, 242).

The inter-tier electrically conductive layer 346 can be formed by filling the inter-tier backside recess 343 with an electrically conductive material concurrently with formation of the first electrically conductive layers 146 and the second electrically conductive layers 246. The etch stop material layer 180 can be isotropically laterally recessed around the inter-tier memory opening and removed by performing the inter-tier isotropic etch process.

Figure 31A:
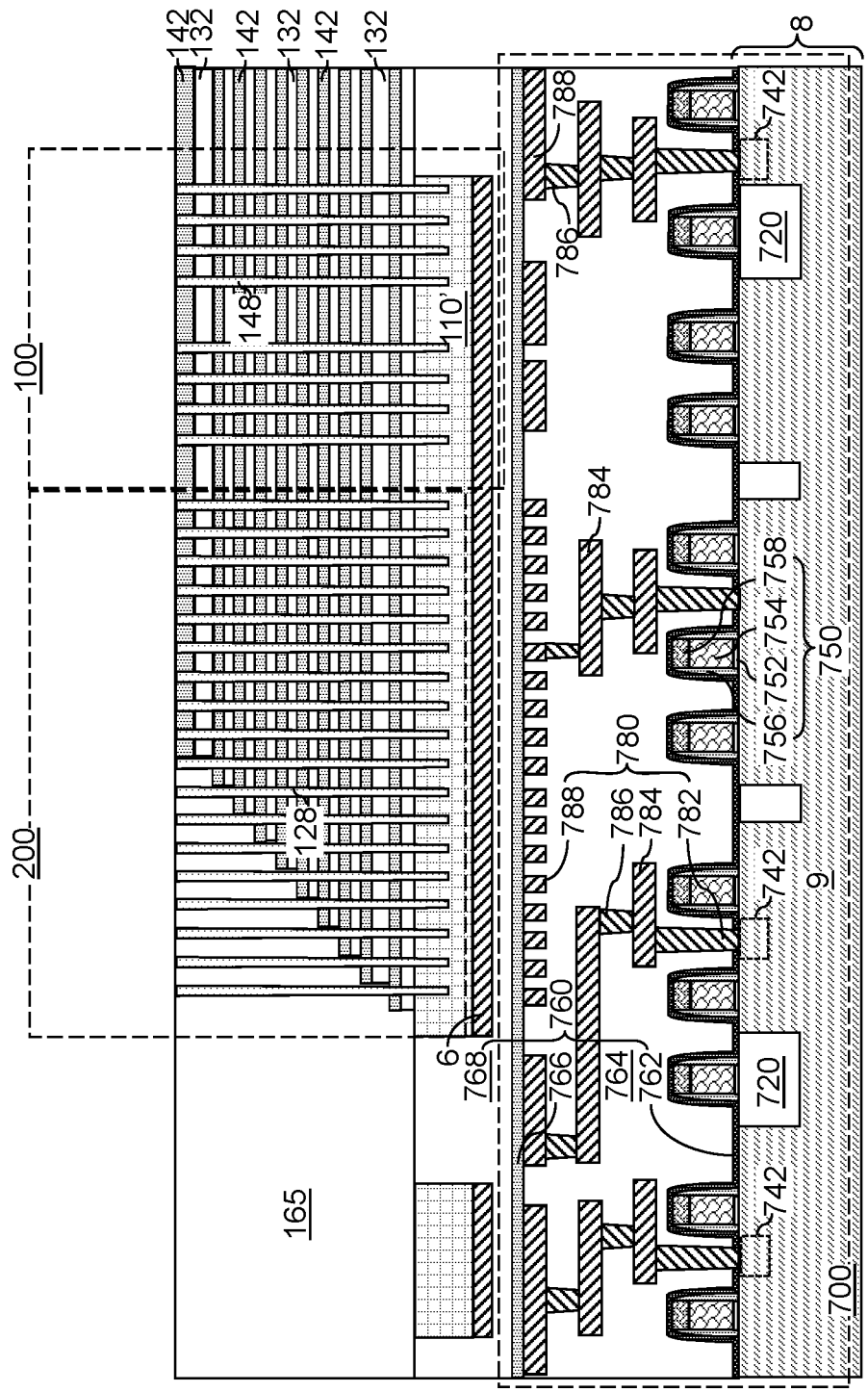
FIGS. 31A-31C are vertical cross-sectional views of in-process third alternative configuration of the exemplary structure.
Figure 31B:
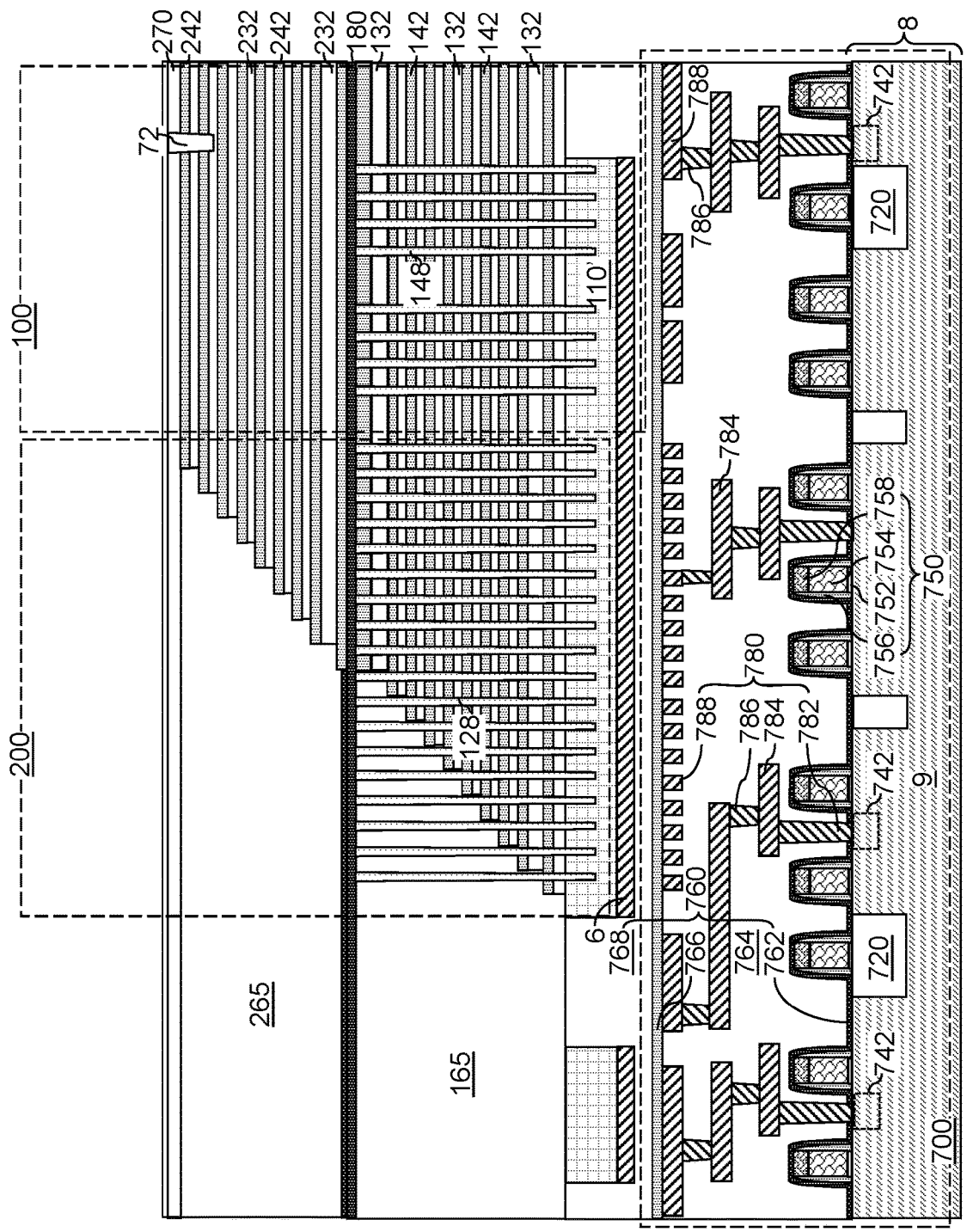
Figure 31C:
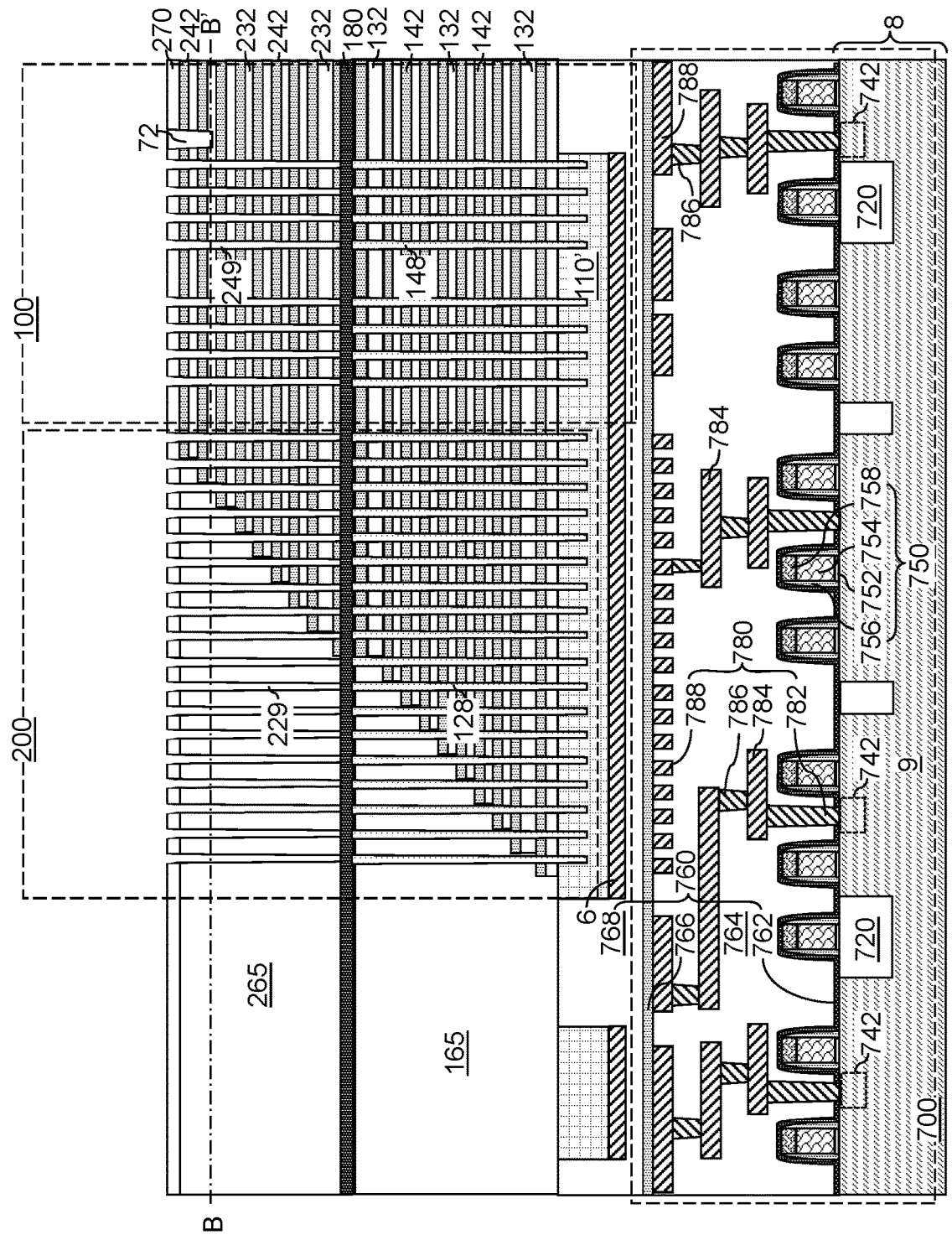

Referring to FIGS. 31A-31C, an in-process third alternative configuration of the exemplary structure is illustrated. In the third alternative configuration, the etch stop material layer 180 is formed after forming sacrificial first-tier opening fill structures (148, 128) but before forming the second-tier alternating stack (232, 242). The third alternative configuration of the exemplary structure shown in FIG. 31A may be derived from the configuration shown in FIG. 5 by forming the first-tier opening fill structures (148, 128) through the first-tier alternating stack (132, 242) without forming the etch stop material layer 180.

Referring to FIG. 31B, the etch stop material layer 180 is formed over the first-tier alternating stack (132, 242) containing the first-tier opening fill structures (148, 128). The second-tier structure including the second-tier alternating stack (232, 242) and the second retro-stepped dielectric material portion 265 are then formed over the etch stop material layer 180 using the steps described above with respect to FIG. 6.

Referring to FIG. 31C, the various second-tier openings (249, 229) may be formed through the second-tier structure (232, 242, 265, 270, 72), using the steps described above with respect to FIGS. 7A, 7B and 9A. The etch stop material layer 180 acts as an etch stop during the anisotropic etch which forms the various second-tier openings (249, 229). The various second-tier openings (249, 229) are then etched through the etch stop material layer 180 in the same or separate etch step. The process then proceeds as described above with respect to FIGS. 8 and 9B to 9D. The formation of the etch stop material layer 180 after formation of the sacrificial first-tier opening fill structures (148, 128) may be performed in any of the first, second, third, fourth, fifth or sixth configurations described above.

Figure 32:
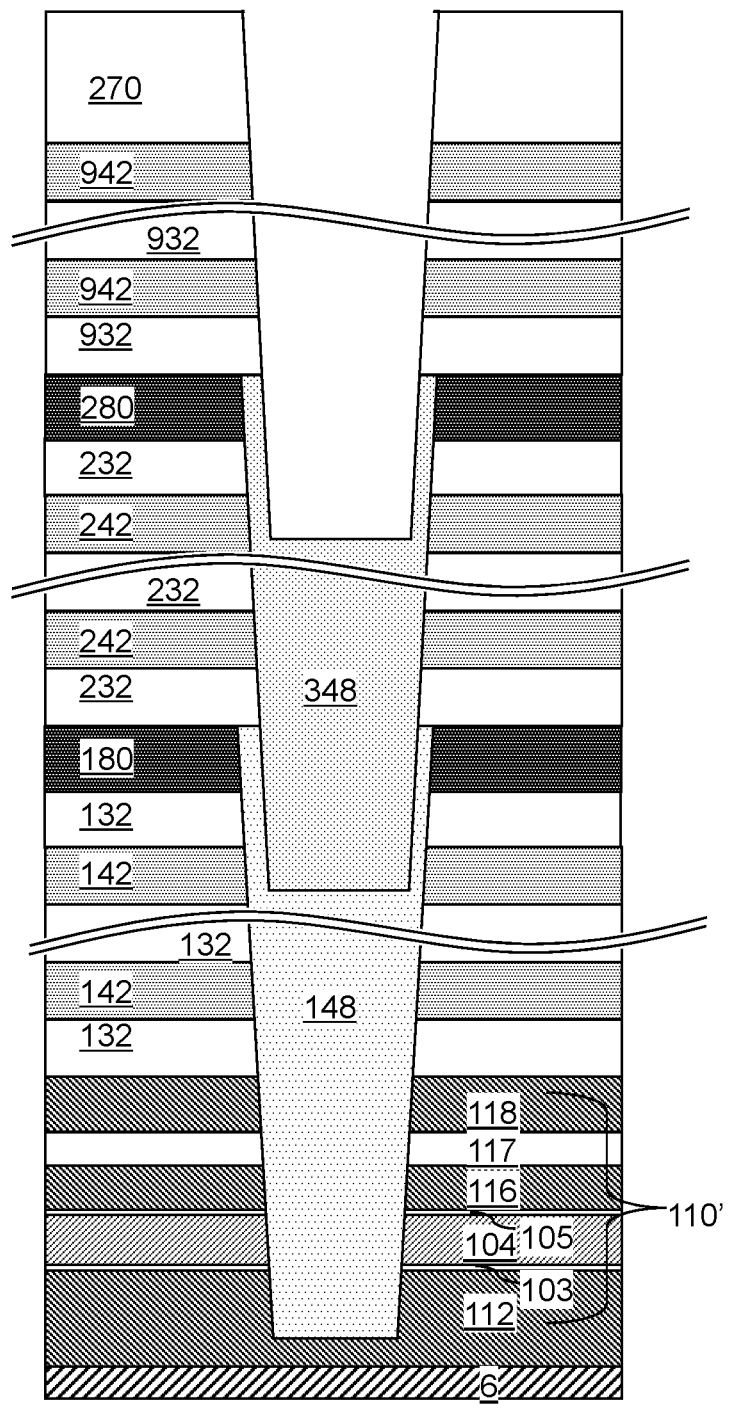
FIG. 32 is a vertical cross-sectional view of an alternative configuration of the exemplary structure that includes a set of three tier structures according to an embodiment of the present disclosure.

The schemes of the various embodiments of the present disclosure may be extended to structures including more than two tier structures. Referring to FIG. 32, a fourth alternative configuration of the exemplary structure is illustrated, which can be derived from the exemplary structure illustrated in FIGS. 7A and 7B by forming a second etch stop material layer 280 and not forming an insulating cap layer 270 prior to formation of the various second-tier openings and sacrificial second-tier opening fill structures 348, by forming a third alternating stack of third insulating layers 932 and third sacrificial material layers 942 and by forming an insulating cap layer 270, by forming third-tier memory openings and third-tier support openings, and by performing the processing steps of FIGS. 8-30 as described above with necessary adjustments to the various processing steps in view of the presence of the third alternating stack (932, 942). Generally, the methods and the structures of the present disclosure can be extended to structures including three or more alternating stacks and two or more etch stop material layers.

In an alternative embodiment, instead of forming the horizontal source contact layer 114 which contacts the sidewall of a vertical semiconductor channel 60, a source region may be formed in the top surface of the semiconductor substrate 9. A vertical source local interconnect may be formed in the backside trench 79 in electrical contact with the source region. In this alternative embodiment, layers 6, 760 and 780 are not formed below the memory array region 100, and the semiconductor devices 700 (e.g., driver circuit containing CMOS devices) may be formed either next to the memory array region 100 (e.g., CMOS next to array configuration) or on a separate substrate which is then bonded to the memory array region 100 (e.g., CMOS bonded to array configuration).

The various embodiments of the present disclosure employ an etch stop material layer 180, which prevents collateral or unintended over etching of a first-tier alternating stack of first insulating layers 132 and first sacrificial material layers 142 during formation of second-tier memory openings 249. Undesirable variations in the height of the enlarged diameter inter-tier portion of the memory openings 49 and sidewall recess depths of the memory openings 49 may be reduced using the etch stop material layer 180. Defects in memory films 50 and leakage current within or through the memory opening fill structures 58 can be reduced and/or suppressed through use of the etch stop material layer 180 of the present disclosure.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
   forming a first-tier alternating stack of first insulating layers and first spacer layers over a substrate;
   forming a continuous etch stop material layer over the first-tier alternating stack, the etch stop material layer including an etch stop material that is different from materials of the first insulating layers and the first spacer layers;
   forming first-tier memory openings through the first-tier alternating stack by performing a first anisotropic etch process;
   forming sacrificial memory opening fill structures in the first-tier memory openings;
   forming a second-tier alternating stack of second insulating layers and second spacer layers over the etch stop material layer and the sacrificial memory opening fill structures;
   forming second-tier memory openings through the second-tier alternating stack down to at least one of the etch stop material layer and the sacrificial memory opening fill structures by performing a second anisotropic etch process that is selective to the etch stop material layer;
   forming inter-tier memory openings by removing the sacrificial memory opening fill structures, wherein the inter-tier memory openings comprise volumes of the first-tier memory openings and the second-tier memory openings;
   forming memory stack structures each comprising a memory film and a vertical semiconductor channel in the inter-tier memory openings; and
   further comprising at least one feature comprising:
   (1) a first feature which comprises replacing the first spacer layers which comprise first sacrificial material layers and the second spacer layer which comprise second sacrificial material layers with first electrically conductive layers and second electrically conductive layers, respectively, wherein the etch stop material layer consists essentially of an electrically conductive material that is different from materials of the first electrically conductive layers and the second electrically conductive layers; or
   (2) a second feature wherein the first spacer layers comprise first electrically conductive layers and the second spacer layers comprise second electrically conductive layers, and wherein the etch stop material layer consists essentially of an electrically conductive material that is different from materials of the first electrically conductive layers and the second electrically conductive layers; or
   (3) a third feature comprising:
      depositing a sacrificial fill material in the first-tier memory openings;
      planarizing the sacrificial fill material to form the sacrificial memory opening fill structures, wherein the etch stop material layer is formed directly on a top surface of a topmost first insulating layer within the first-tier alternating stack;
      depositing an additional insulating layer over the etch stop material layer, wherein the first-tier memory openings are formed through the additional insulating layer and wherein the sacrificial fill material is deposited in the first-tier memory openings and over the additional insulating layer; and
      planarizing the sacrificial fill material by removing a portion of the sacrificial fill material located above a horizontal plane including a top surface of the additional insulating layer by performing a planarization process; or
   (4) a fourth feature comprising:
      depositing a sacrificial fill material in the first-tier memory openings;
      planarizing the sacrificial fill material to form the sacrificial memory opening fill structures, wherein the etch stop material layer is formed directly on a top surface of a topmost first spacer layer within the first-tier alternating stack;
      depositing an additional spacer layer over the etch stop material layer, wherein the first-tier memory openings are formed through the additional spacer layer and wherein the sacrificial fill material is deposited in the first-tier memory openings and over the additional spacer layer; and
      planarizing the sacrificial fill material by removing a portion of the sacrificial fill material located above a horizontal plane including a top surface of the additional spacer layer by performing a planarization process.

2. The method of claim 1, further comprising replacing the first spacer layers which comprise first sacrificial material layers and the second spacer layer which comprise second sacrificial material layers with first electrically conductive layers and second electrically conductive layers, respectively.

3. The method of claim 2, further comprising:
forming an inter-tier backside recess by removing the etch stop material layer selective to the first insulating layers, the second insulating layers, and the memory stack structures by performing an inter-tier isotropic etch process; and
forming an inter-tier electrically conductive layer by filling the inter-tier backside recess with an electrically conductive material.

4. The method of claim 3, further comprising performing a selective isotropic etch process that etches the first sacrificial material layers and the second sacrificial material layers selective to the first insulating layers and the second insulating layers, wherein first backside recesses are formed in volumes from which the first sacrificial material layers are removed and second backside recesses are formed in volumes from which the second sacrificial material layers are removed,
wherein:
the inter-tier isotropic etch process is performed prior to, or after, the selective isotropic etch process; and
the first electrically conductive layers, the second electrically conductive layers, and the inter-tier electrically conductive layer are formed simultaneously by depositing the electrically conductive material in the first backside recesses, the second backside recesses, and the inter-tier backside recesses.

5. The method of claim 1 wherein the at least one feature comprises the first feature.

6. The method of claim 1, wherein the first spacer layers comprise first electrically conductive layers and the second spacer layers comprise second electrically conductive layers.

7. The method of claim 1, wherein the at least one feature comprises the second feature.

8. The method of claim 1, further comprising:
depositing a sacrificial fill material in the first-tier memory openings; and
planarizing the sacrificial fill material to form the sacrificial memory opening fill structures.

9. The method of claim 8, wherein:
first-tier memory openings are further formed through the etch stop material layer;
the sacrificial fill material is deposited in the first-tier memory openings and over the etch stop material layer; and
planarizing the sacrificial fill material comprises removing a portion of the sacrificial fill material located above the etch stop material layer.

10. The method of claim 1, wherein the at least one feature comprises the third feature.

11. The method of claim 1, wherein the at least one feature comprises the fourth feature.

12. The method of claim 1, wherein the etch stop material layer consists essentially of a dielectric material, a semiconductor material or carbon.

13. The method of claim 1, further comprising isotropically recessing the etch stop material layer around the inter-tier memory openings by performing an isotropic etch process that etches a material of the etch stop material layer selective to materials of the first-tier alternating stack and the second-tier alternating stack.

14. The method of claim 1, wherein the etch stop material layer is formed after forming the sacrificial memory opening fill structures and prior to forming the second-tier alternating stack.

15. The method of claim 1, wherein the memory film is formed by:
depositing a blocking dielectric layer on physically exposed surfaces of the first-tier alternating stack, the second-tier alternating stack, and the etch stop material layer;
forming charge storage elements at each level of the first spacer layers and the second spacer layers; and
forming a tunneling dielectric layer on the charge storage elements.

16. The method of claim 1, wherein a vertical axis passing through a geometrical center of the second-tier memory opening of the inter-tier memory opening is laterally offset from a vertical axis passing through a geometrical center of the corresponding first-tier memory opening of the inter-tier memory opening by a non-zero lateral offset distance.

17. A three-dimensional memory device, comprising:
a first-tier alternating stack of first insulating layers and first electrically conductive layers located over a substrate;
an etch stop material layer located over the first-tier alternating stack;
a second-tier alternating stack of second insulating layers and second electrically conductive layers located over the etch stop material layer;
inter-tier memory openings vertically extending through the second-tier alternating stack, the etch stop material layer, and the first-tier alternating stack;
memory opening fill structures each comprising a memory film and a vertical semiconductor channel located in the inter-tier memory openings, wherein the etch stop material layer comprises an etch stop material that is different from materials of the first insulating layers, the second insulating layers, the first electrically conductive layers, and the second electrically conductive layers;
a third-tier alternating stack of second insulating layers and second electrically conductive layers located over the second-tier alternating stack;
wherein:
each of the memory opening fill structures comprises a lower portion embedded in the first-tier alternating stack, an upper portion embedded in the second-tier alternating stack, and an inter-tier portion embedded in the etch stop material layer;
a sidewall of an annular top surface of the inter-tier portion of the memory opening fill structure is laterally offset outward from a sidewall of the upper portion of the memory opening fill structure at all azimuthal angles around a vertical axis passing through a geometrical center of the inter-tier portion;
a sidewall of a bottom surface of the inter-tier portion of the memory opening fill structure is laterally offset outward from a sidewall of the lower portion within a first azimuthal angle range around the geometrical center of the inter-tier portion of the memory opening fill structure, and is vertically coincident with the sidewall of the lower portion within a second azimuthal angle range that is a complement of the first azimuthal angle range; and
a vertical axis passing through the geometrical center of the upper portion of the memory opening fill structure is laterally offset from a vertical axis passing through the geometrical center of the lower portion of the memory opening fill structure along a direction of a midpoint of the first azimuthal angle range relative to the vertical axis passing through the geometrical center of the inter-tier portion.

18. A method of forming a three-dimensional memory device, comprising:
    forming a first-tier alternating stack of first insulating layers and first spacer layers over a substrate;
    forming a continuous etch stop material layer over the first-tier alternating stack, the etch stop material layer including an etch stop material that is different from materials of the first insulating layers and the first spacer layers;
    forming first-tier memory openings through the first-tier alternating stack by performing a first anisotropic etch process;
    forming sacrificial memory opening fill structures in the first-tier memory openings;
    forming a second-tier alternating stack of second insulating layers and second spacer layers over the etch stop material layer and the sacrificial memory opening fill structures;
    forming second-tier memory openings through the second-tier alternating stack down to at least one of the etch stop material layer and the sacrificial memory opening fill structures by performing a second anisotropic etch process that is selective to the etch stop material layer;
    forming inter-tier memory openings by removing the sacrificial memory opening fill structures, wherein the inter-tier memory openings comprise volumes of the first-tier memory openings and the second-tier memory openings;
    forming memory stack structures each comprising a memory film and a vertical semiconductor channel in the inter-tier memory openings; and
    further comprising at least one feature comprising:
    (1) a fifth feature comprising:
        replacing the first spacer layers which comprise first sacrificial material layers and the second spacer layer which comprise second sacrificial material layers with first electrically conductive layers and second electrically conductive layers, respectively;
        forming an inter-tier backside recess by removing the etch stop material layer selective to the first insulating layers, the second insulating layers, and the memory stack structures by performing an inter-tier isotropic etch process; and
        forming an inter-tier electrically conductive layer by filling the inter-tier backside recess with an electrically conductive material; or
    (2) a sixth feature comprising isotropically recessing the etch stop material layer around the inter-tier memory openings by performing an isotropic etch process that etches a material of the etch stop material layer selective to materials of the first-tier alternating stack and the second-tier alternating stack; or
    (3) a seventh feature wherein the etch stop material layer is formed after forming the sacrificial memory opening fill structures and prior to forming the second-tier alternating stack.

19. The method of claim 18, wherein the at least one feature comprises the fifth feature.

20. The method of claim 18, wherein the at least one feature comprises the sixth feature.

21. The method of claim 18, wherein the at least one feature comprises the seventh feature.

* * * * *